US011665977B2

(12) United States Patent
Peng et al.

(10) Patent No.: US 11,665,977 B2
(45) Date of Patent: May 30, 2023

(54) MAGNETIC TUNNEL JUNCTION DEVICE AND METHOD

(71) Applicant: Taiwan Semiconductor Manufacturing Co., Ltd., Hsinchu (TW)

(72) Inventors: Tai-Yen Peng, Hsinchu (TW); Yu-Feng Yin, Hsinchu (TW); An-Shen Chang, Jubei (TW); Han-Ting Tsai, Kaoshiung (TW); Qiang Fu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 245 days.

(21) Appl. No.: 16/887,244

(22) Filed: May 29, 2020

(65) Prior Publication Data

US 2021/0376228 A1   Dec. 2, 2021

(51) Int. Cl.
  *H10N 50/80* (2023.01)
  *G11C 11/16* (2006.01)
  *H10B 61/00* (2023.01)
  *H10N 50/01* (2023.01)
  *H01L 43/02* (2006.01)
  *H01L 27/22* (2006.01)
  *H01L 43/12* (2006.01)

(52) U.S. Cl.
  CPC .......... *H01L 43/02* (2013.01); *G11C 11/161* (2013.01); *G11C 11/1655* (2013.01); *G11C 11/1657* (2013.01); *H01L 27/228* (2013.01); *H01L 43/12* (2013.01)

(58) Field of Classification Search
  CPC ....... H01L 43/02; H01L 27/228; H01L 43/12; G11C 11/161; G11C 11/1655; G11C 11/1657
  See application file for complete search history.

(56) References Cited

U.S. PATENT DOCUMENTS

| | | | |
|---|---|---|---|
| 6,724,653 B1 | 8/2004 | Iwata et al. | |
| 10,276,794 B1 | 4/2019 | Peng et al. | |
| 10,454,021 B2 | 10/2019 | Sung et al. | |
| 10,651,373 B2 | 5/2020 | Peng et al. | |
| 2006/0194430 A1* | 8/2006 | Beck | H01L 21/76838 |
| | | | 257/E21.582 |

(Continued)

FOREIGN PATENT DOCUMENTS

| DE | 102016114870 A1 | 8/2017 |
|---|---|---|
| DE | 102018124716 A1 | 5/2019 |

(Continued)

*Primary Examiner* — Shih Tsun A Chou
(74) *Attorney, Agent, or Firm* — Slater Matsil, LLP

(57) ABSTRACT

In an embodiment, a device includes: a magnetoresistive random access memory (MRAM) array including MRAM cells arranged in rows and columns, where a first column of the columns includes: first bottom electrodes arranged along the first column; first magnetic tunnel junction (MTJ) stacks over the first bottom electrodes; a first shared electrode over each of the first MTJ stacks; second bottom electrodes arranged along the first column; second MTJ stacks over the second bottom electrodes; a second shared electrode over each of the second MTJ stacks; and a bit line electrically connected to the first shared electrode and the second shared electrode.

20 Claims, 45 Drawing Sheets

(56) References Cited

U.S. PATENT DOCUMENTS

| | | |
|---|---|---|
| 2015/0311253 A1 | 10/2015 | Choi et al. |
| 2016/0225817 A1 | 8/2016 | Machkaoutsan et al. |
| 2017/0170386 A1 | 6/2017 | Chuang et al. |
| 2018/0308899 A1* | 10/2018 | Chuang .................. H01L 43/02 |
| 2019/0096753 A1* | 3/2019 | Lin ....................... H01L 23/535 |
| 2019/0157344 A1 | 5/2019 | Wei et al. |
| 2020/0098440 A1 | 3/2020 | Chuang et al. |

FOREIGN PATENT DOCUMENTS

| | | |
|---|---|---|
| KR | 100512509 B1 | 9/2005 |
| KR | 20150124534 A | 11/2015 |
| TW | 202015219 A | 4/2020 |
| WO | 2020192207 A1 | 10/2020 |

* cited by examiner

MAGNETIC TUNNEL JUNCTION DEVICE AND METHOD

BACKGROUND

Semiconductor memories are used in integrated circuits for electronic applications, including radios, televisions, cell phones, and personal computing devices, as examples. One type of semiconductor memory is magnetoresistive random access memory (MRAM), which involves spin electronics that combines semiconductor technology and magnetic materials and devices. The spins of electrons, through their magnetic moments, are used to indicate bit values. A MRAM cell typically includes a magnetic tunnel junction (MTJ) stack, which includes two ferromagnets separated by a thin insulator.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
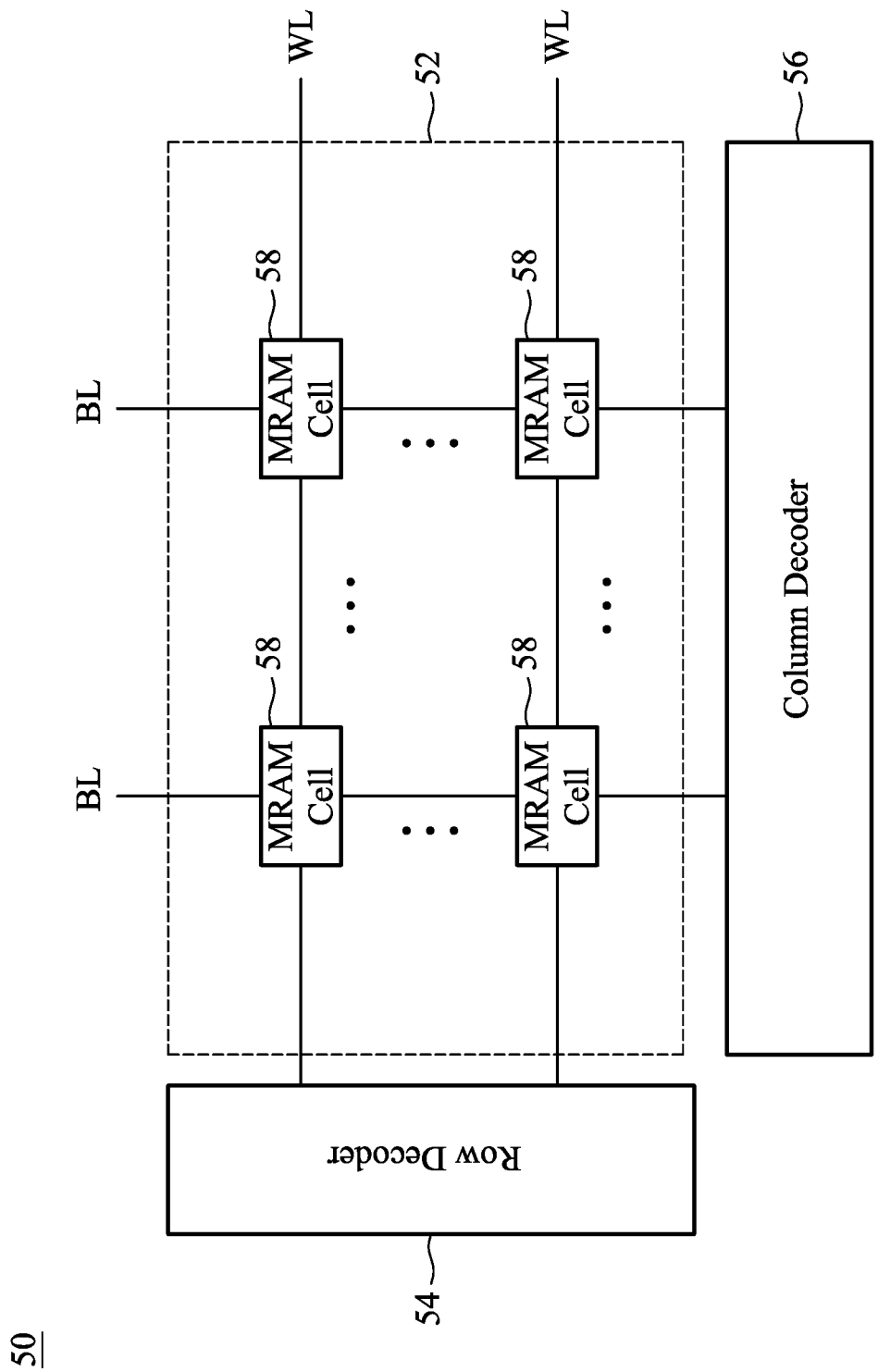
FIG. 1 is a block diagram of a MRAM device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a MRAM array is formed in an interconnect structure, with the MRAM array including shared electrodes for the MTJ stacks in the MRAM array. Specifically, electrodes are shared by multiple MTJ stacks along columns of the MRAM array, and are electrically connected to a same bit line. Forming shared electrodes for the MTJ stacks helps reduce the contact resistance to the MTJ stacks, and reduces the risk of damage to the MTJ stacks during the subsequent formation of overlying metallization layers. In accordance with some other embodiments, dielectric protective structures are formed around the MRAM cells before formation of overlying metallization layers. The protective structures prevent etching of the MTJ stacks during the subsequent formation of overlying metallization layers. By forming the shared electrodes and/or protective structures, damage to the MRAM cells may be avoided during processing, particularly when the MRAM array is formed in a higher level of the interconnect structure.

FIG. 1 is a block diagram of a MRAM device 50, in accordance with some embodiments. The MRAM device 50 includes a MRAM array 52, a row decoder 54, and a column decoder 56. The MRAM array 52 includes MRAM cells 58 arranged in rows and columns. The row decoder 54 may be, e.g., a static CMOS decoder, a pseudo-NMOS decoder, or the like. During operation, the row decoder 54 selects desired MRAM cells 58 in a row of the MRAM array 52 by activating the respective word line WL for the row. The column decoder 56 may be, e.g., a static CMOS decoder, pseudo-NMOS decoder, or the like, and may include writer drivers, sense amplifiers, combinations thereof, or the like. During operation, the column decoder 56 selects bit lines BL for the desired MRAM cells 58 from columns of the MRAM array 52 in the selected row, and reads data from or writes data to the selected MRAM cells 58 with the bit lines BL.

Figure 2:
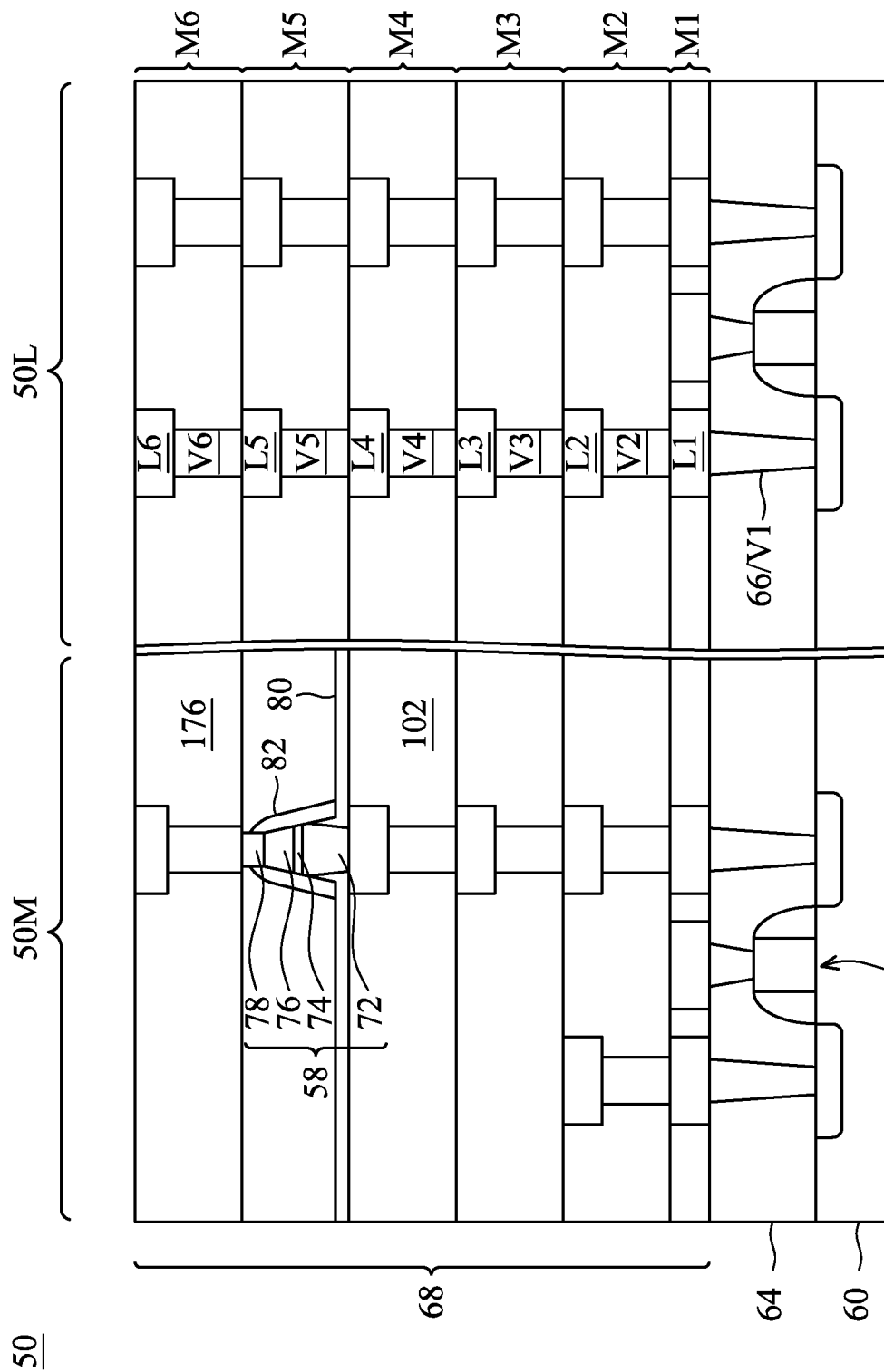
FIG. 2 is a cross-sectional view of a MRAM device, in accordance with some embodiments.

FIG. 2 is a cross-sectional view of the MRAM device 50, in accordance with some embodiments. FIG. 2 is a simplified view, and some features (discussed below) are omitted for clarity of illustration. The MRAM device 50 includes a logic region 50L and a memory region 50M. Memory devices (e.g., MRAMs) are formed in the memory region 50M and logic devices (e.g., logic circuits) are formed in the logic region 50L. For example, the MRAM array 52 (see FIG. 1) can be formed in the memory region 50M, and the row decoder 54 and column decoder 56 (see FIG. 1) can be formed in the logic region 50L. The logic region 50L may occupy most of the area of the MRAM device 50. For example, the logic region 50L may occupy from 95% to 99% of the area of the MRAM device 50, with the memory region 50M occupying the remaining area of the MRAM device 50. The memory region 50M can be disposed at an edge of the logic region 50L, or the logic region 50L can surround the memory region 50M.

The logic region 50L and memory region 50M are formed over a same semiconductor substrate 60. The semiconductor substrate 60 may be silicon, doped or undoped, or an active layer of a semiconductor-on-insulator (SOI) substrate. The semiconductor substrate 60 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 62 are formed at the active surface of the semiconductor substrate 60. The devices 62 may be active devices or passive devices. For example, the electrical components may be transistors, diodes, capacitors, resistors, or the like, formed by any suitable formation method. The devices 62 are interconnected to form the memory devices and logic devices of the MRAM device 50. For example, some of the devices 62 may be access transistors.

One or more inter-layer dielectric (ILD) layer(s) 64 are formed on the semiconductor substrate 60, and electrically conductive features, such as contact plugs 66, are formed electrically connected to the devices 62. The ILD layer(s) 64 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) may be formed by any acceptable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 68 is formed over the semiconductor substrate 60. The interconnect structure 68 interconnects the devices 62 to form integrated circuits in each of the logic region 50L and memory region 50M. The interconnect structure 68 includes multiple metallization layers M1-M6. Although six metallization layers are illustrated, it should be appreciated that more or less metallization layers may be included. Each of the metallization layers M1-M6 includes metallization patterns in dielectric layers. The metallization patterns are electrically coupled to the devices 62 of the semiconductor substrate 60, and include, respectively, metal lines L1-L6 and metal vias V1-V6 formed in one or more inter-metal dielectric (IMD) layers. The interconnect structure 68 may formed by a damascene process, such as a single damascene process, a dual damascene process, or the like. In some embodiments, the contact plugs 66 are also part of the metallization patterns, such as part of the lowest layer of metal vias V1. FIG. 2 is also labeled with some reference numerals that will be described further below.

The MRAM cells 58 are formed in the interconnect structure 68. The MRAM cells 58 can be formed in any of the metallization layers M1-M6, and are illustrated as being formed in an intermediate metallization layer M5. Each MRAM cell 58 includes a conductive via 72, a bottom electrode 74 on the conductive via 72, a MTJ stack 76 on the bottom electrode 74, and a top electrode 78 on the MTJ stack 76. An additional IMD layer 80 can be formed around the MRAM cells 58, with the conductive via 72 extending through the IMD layer 80. Spacers 82 can also be formed around the MRAM cells 58. The IMD layer 80 and/or spacers 82 surround and protect the components of the MRAM cells 58. The resistance of an MTJ stack 76 is programmable, and can be changed between a high resistance ($R_{ap}$), which can signify a value such as a logic "1," and a low resistance ($R_p$), which can signify a value such as a logic "0." As such, a value can be written to a MRAM cell 58 by programming the resistance of the MTJ stack 76 with its corresponding access transistor, and the value can be read from the MRAM cell 58 by measuring the resistance of the MTJ stack 76 with the access transistor.

The MRAM cells 58 are electrically connected to the devices 62. The conductive via 72 is physically and electrically coupled to an underlying metallization pattern, such as to the metal lines L4 in the illustrated example. The top electrode 78 is physically and electrically coupled to an overlying metallization pattern, such as to the metal vias V6 in the illustrated example. The MRAM cells 58 are arranged in a MRAM array having rows and columns of memory. The metallization patterns include access lines (e.g., word lines and bit lines) for the MRAM array. For example, the underlying metallization patterns can include word lines disposed along the rows of the MRAM array and the overlying metallization patterns can include bit lines disposed along the columns of the MRAM array.

FIGS. 3 through 23 are various views of intermediate stages in the manufacturing of an interconnect structure for the MRAM device 50, in accordance with some embodiments. The interconnect structure includes a MRAM array of memory cells. As discussed further below, groups of the memory cells along the columns of the MRAM array share electrodes, which allows the contact resistance to the memory cells to be decreased.

Figure 3:
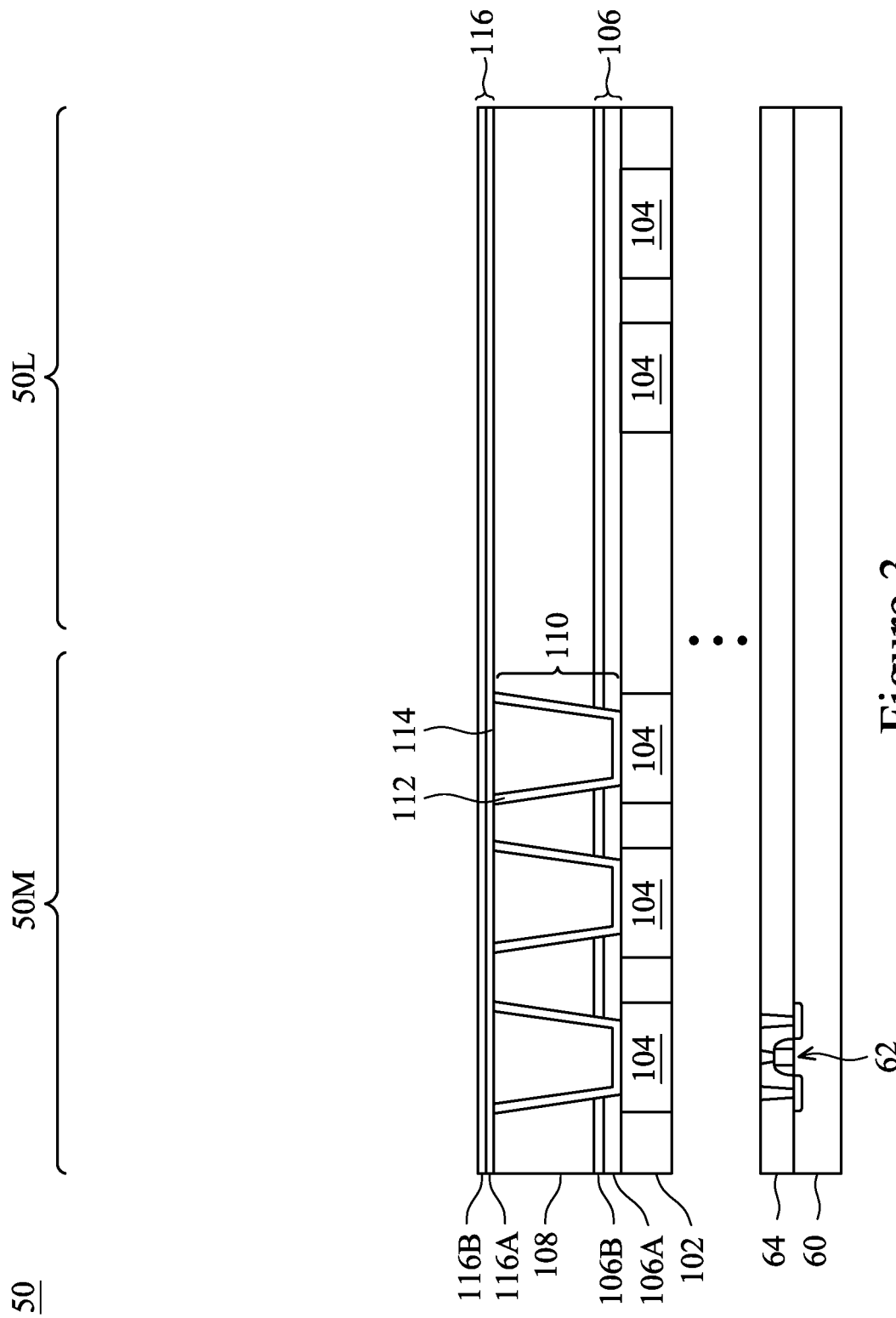
FIGS. 3 through 23 are various views of intermediate stages in the manufacturing of an interconnect structure for a MRAM device, in accordance with some embodiments.

In FIG. 3, a metallization layer (e.g., M4, see FIG. 2) of the interconnect structure is formed. The metallization layer comprises an IMD layer 102 and conductive features 104 (which can correspond to the metal lines L4, see FIG. 2). The IMD layer 102 is formed over the ILD layer(s) 64. The IMD layer 102 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The IMD layer 102 may be formed by any acceptable deposition process, such as spin coating, physical vapor deposition (PVD), chemical vapor deposition (CVD), the like, or a combination thereof. The IMD layer 102 may be a layer formed of a low-k dielectric material having a k-value lower than about 3.0. The IMD layer 102 may be a layer formed of an extra-low-k (ELK) dielectric material having a k-value of less than 2.5.

Conductive features 104 are formed in the IMD layer 102, and are electrically connected to the devices 62. In accordance with some embodiments, the conductive features 104 include diffusion barrier layers and conductive material over the diffusion barrier layers. Openings are formed in the IMD layer 102 using, e.g., an etching process. The openings expose underlying conductive features, such as underlying metal vias. The diffusion barrier layers may be formed of TaN, Ta, TiN, Ti, CoW, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. In some embodiments, the conductive features 104 are metal lines.

One or more etch stop layer(s) 106 are formed on the conductive features 104 and IMD layer 102. The etch stop layer(s) 106 may be formed of a dielectric material such as aluminum nitride, aluminum oxide, silicon oxide, silicon nitride, silicon oxynitride, silicon carbide, a combination thereof, or the like. The etch stop layer(s) 106 may be formed by chemical vapor deposition (CVD), physical vapor deposition (PVD), ALD, a spin-on-dielectric process, the like, or a combination thereof. The etch stop layer(s) 106 may also be a composite layer formed of a plurality of dielectric layers. In this embodiment, the etch stop layer(s) 106 comprise a first etch stop layer 106A and a second etch stop layer 106B over the first etch stop layer 106A. The first etch stop layer 106A can be formed of a first dielectric material, such as silicon carbide, and the second etch stop layer 106B can be formed of a second dielectric material, such as aluminum oxide. The silicon carbide layer is used as a glue layer to improve adhesion between the aluminum oxide layer and the IMD layer 102. The etch stop layer(s) 106 can be formed to a combined thickness in the range of about 30 Å to about 150 Å.

An IMD layer 108 is formed on the etch stop layer(s) 106. In some embodiments, the IMD layer 108 is formed of a tetraethyl orthosilicate (TEOS) oxide (e.g., silicon oxide deposited using, e.g., a chemical vapor deposition (CVD) method with TEOS as a precursor). In some embodiments, the IMD layer 108 may be formed using PSG, BSG, BPSG, undoped silicate glass (USG), fluorosilicate glass (FSG), SiOCH, flowable oxide, a porous oxide, or the like, or combinations thereof. The IMD layer 108 may also be formed of a low-k dielectric material with a k value lower than about 3.0, for example. The IMD layer 108 can be formed to a thickness in the range of about 350 Å to about 550 Å.

Conductive vias no are formed extending through the IMD layer 108 and etch stop layer(s) 106. The conductive vias no can also be referred to as bottom vias. In some embodiments, the conductive vias no include conductive regions 114 and conductive barrier layers 112 lining sidewalls and bottom surfaces of the conductive regions 114. The conductive barrier layers 112 may be formed of titanium, titanium nitride, tantalum, tantalum nitride, cobalt, a combination thereof, or the like. The conductive regions 114 may be formed of metals such as copper, aluminum, tungsten, cobalt, alloys thereof, or the like. The formation of the conductive vias 110 may include etching the IMD layer 108 and etch stop layer(s) 106 to form via openings, forming a blanket conductive barrier layer extending into the via openings, depositing a metallic material over the blanket conductive barrier layer, and performing a planarization process, such as a CMP process or a mechanical grinding process, to remove excess portions of the blanket conductive barrier layer and the metallic material.

One or more bottom electrode layer(s) 116 are formed on the conductive vias 110 and IMD layer 108. In some embodiments, the bottom electrode layer(s) 116 are formed as blanket layers, and may be formed using CVD, physical vapor deposition (PVD), electro-chemical plating (ECP), electroless plating, or the like. The bottom electrode layer(s) 116 may be formed of conductive materials such as Cu, Al, Ti, Ta, W, Pt, Ni, Cr, Ru, TiN, TaN, combinations thereof, multilayers thereof, or the like. For example, the bottom electrode layer(s) 116 can comprise a first bottom electrode layer 116A and a second bottom electrode layer 116B over the first bottom electrode layer 116A. The first bottom electrode layer 116A can be formed of a first conductive material, such as TaN, and the second bottom electrode layer 116B can be formed of a second conductive material, such as TiN. The bottom electrode layer(s) 116 can be formed to a combined thickness in the range of about 20 Å to about 150 Å.

Figure 4:
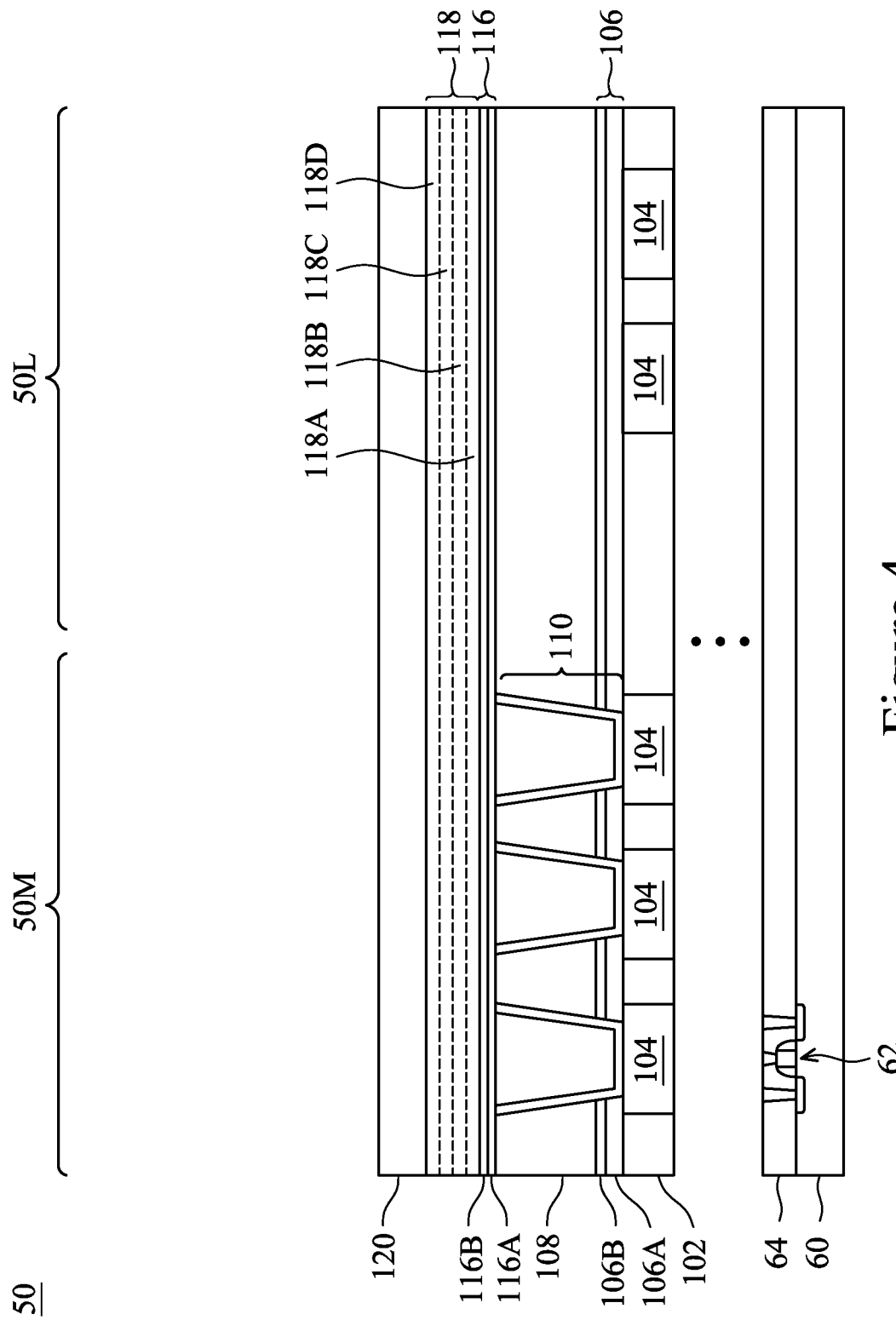

In FIG. 4, a MTJ film stack 118 is formed on the bottom electrode layer(s) 116. The MTJ film stack 118 is a multilayer that includes an anti-ferromagnetic layer 118A, a pinned layer 118B over the anti-ferromagnetic layer 118A, a tunnel barrier layer 118C over the pinned layer 118B, and a free layer 118D over the tunnel barrier layer 118C. The MTJ film stack 118 has an overall thickness in the range of about 200 Å to about 400 Å. Each layer of the MTJ film stack 118 may be deposited using one or more deposition methods such as, CVD, PVD, ALD, a combination thereof, or the like.

The anti-ferromagnetic layer 118A may be formed of a metal alloy including manganese (Mn) and one or more other metal(s) such as platinum (Pt), iridium (Ir), rhodium (Rh), nickel (Ni), palladium (Pd), iron (Fe), osmium (Os), or the like. For example, the anti-ferromagnetic layer 118A can be formed of PtMn, IrMn, RhMn, NiMn, PdPtMn, FeMn, OsMn, or the like. The anti-ferromagnetic layer 118A may have a thickness in the range of about 50 Å to about 200 Å.

The pinned layer 118B may be formed of a ferromagnetic material with a greater coercivity field than the free layer 118D, such as cobalt iron (CoFe), cobalt iron boron (CoFeB), a combination thereof, or the like. The pinned layer 118B may have a thickness in the range of about 50 Å to about 100 Å. In some embodiments, the pinned layer 118B has a synthetic ferromagnetic (SFM) structure, in which the coupling between magnetic layers is ferromagnetic coupling. The pinned layer 118B may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the pinned layer 118B may have a Co layer and repeated $(Pt/Co)_x$ layers over the Co layer, with x representing repeating number that can be any integer equal to or greater than 1, such as 20.

The tunnel barrier layer 118C may be formed of a dielectric material, such as MgO, AlO, AlN, a combination thereof, or the like. The tunnel barrier layer 118C may have a thickness in the range of about 0.5 nm to about 3 nm. The tunnel barrier layer 118C is thicker than the other layers of the MTJ film stack 118.

The free layer 118D may be formed of a ferromagnetic material such as CoFe, NiFe, CoFeB, CoFeBW, a combination thereof, or the like. The free layer 118D may also adopt a synthetic ferromagnetic structure, which is similar to a SAF structure, with the thickness of the non-magnetic spacer layers adjusted to achieve the ferromagnetic coupling between the separated magnetic metals, e.g., causing the magnetic moment to be coupled in the same direction. The magnetic moment of the free layer 118D is programmable, and the resistances of the resulting MTJ stacks is accordingly programmable. Specifically, the resistances of the resulting MTJ stacks can be changed between a high resistance ($R_{ap}$) and a low resistance ($R_p$) based on the programmed magnetic moment of the free layer 118D. As such, the resulting MTJ stacks can also be referred to as programmable resistance elements or programmable resistors. The thickness of the tunnel barrier layer 118C contributes to the $R_{ap}$ and the $R_p$ of the resulting MTJ stacks.

It should be appreciated that the materials and the structure of the MTJ film stack 118 may have many variations, which are also within the scope of the present disclosure. For example, the layers 118A, 118B, 118C, and 118D may be formed in an order inversed from that described above. Accordingly, the free layer 118D may be the bottom layer of the MTJ film stack 118, and the anti-ferromagnetic layer 118A may be the top layer of the MTJ film stack 118.

A top electrode layer 120 is formed on the MTJ film stack 118. In some embodiments, the top electrode layer 120 is formed as a blanket layer, and may be formed using CVD, PVD, ECP, electroless plating, or the like. The material of the top electrode layer 120 may include metals such as titanium, tantalum, tungsten, aluminum, copper, alloys thereof, or the like. For example, the top electrode layer 120 can be formed of TiN, Ta, TaN, Ti, Ru, W, WC, Ru, multi-layers thereof, or the like. In some embodiments, the top electrode layer 120 is formed of titanium nitride. In some embodiments, the top electrode layer 120 has a thickness in the range of about 400 Å to about 1500 Å. In some embodiments, the thickness of the top electrode layer 120 is greater than the combined thickness of the bottom electrode layer(s) 116. The top electrode layer 120 is used as a hard mask in the subsequent patterning of the MTJ film stack 118.

Figure 5:
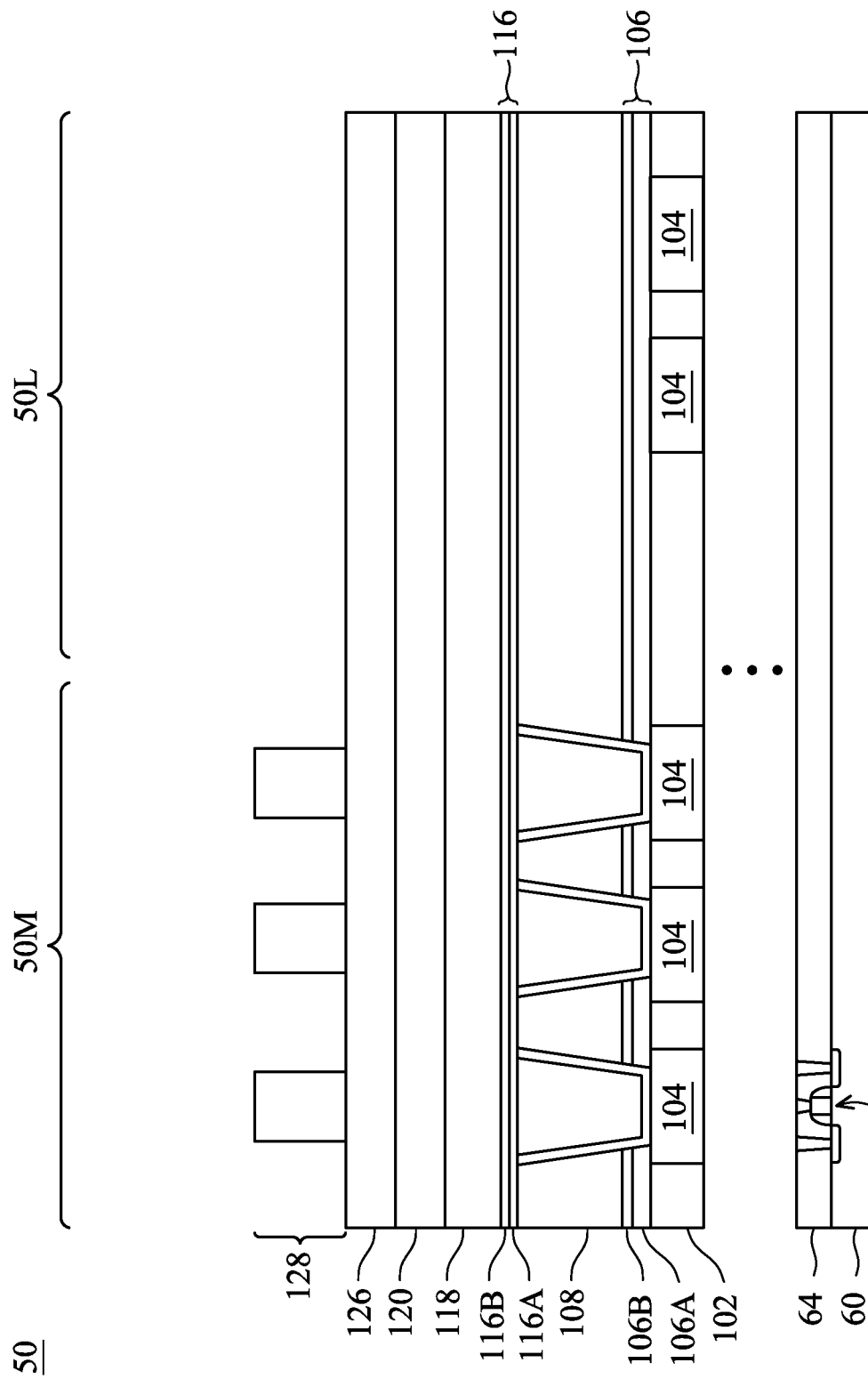

In FIG. 5, one or more masks are formed over the top electrode layer 120. The masks will be used to simultaneously pattern the various layers and form MRAM cells. In some embodiments, the one or more masks may comprise one or more hard masks, a tri-layer mask, a combination thereof, or the like. For example, a hard mask layer 126 can be formed over the top electrode layer 120 and a photosensitive mask 128 can be formed over the hard mask layer 126. In some embodiments, the hard mask layer 126 is formed of an oxide such as titanium oxide, silicon oxide, a combination thereof, or the like. The photosensitive mask 128 may be a photoresist, such as a single-layer photoresist, a bi-layer photoresist, a tri-layer photoresist, or the like. The photosensitive mask 128 is formed in the memory region 50M, with the pattern of the photosensitive mask 128 corresponding to the pattern of the subsequently formed MRAM cells.

Figure 6:
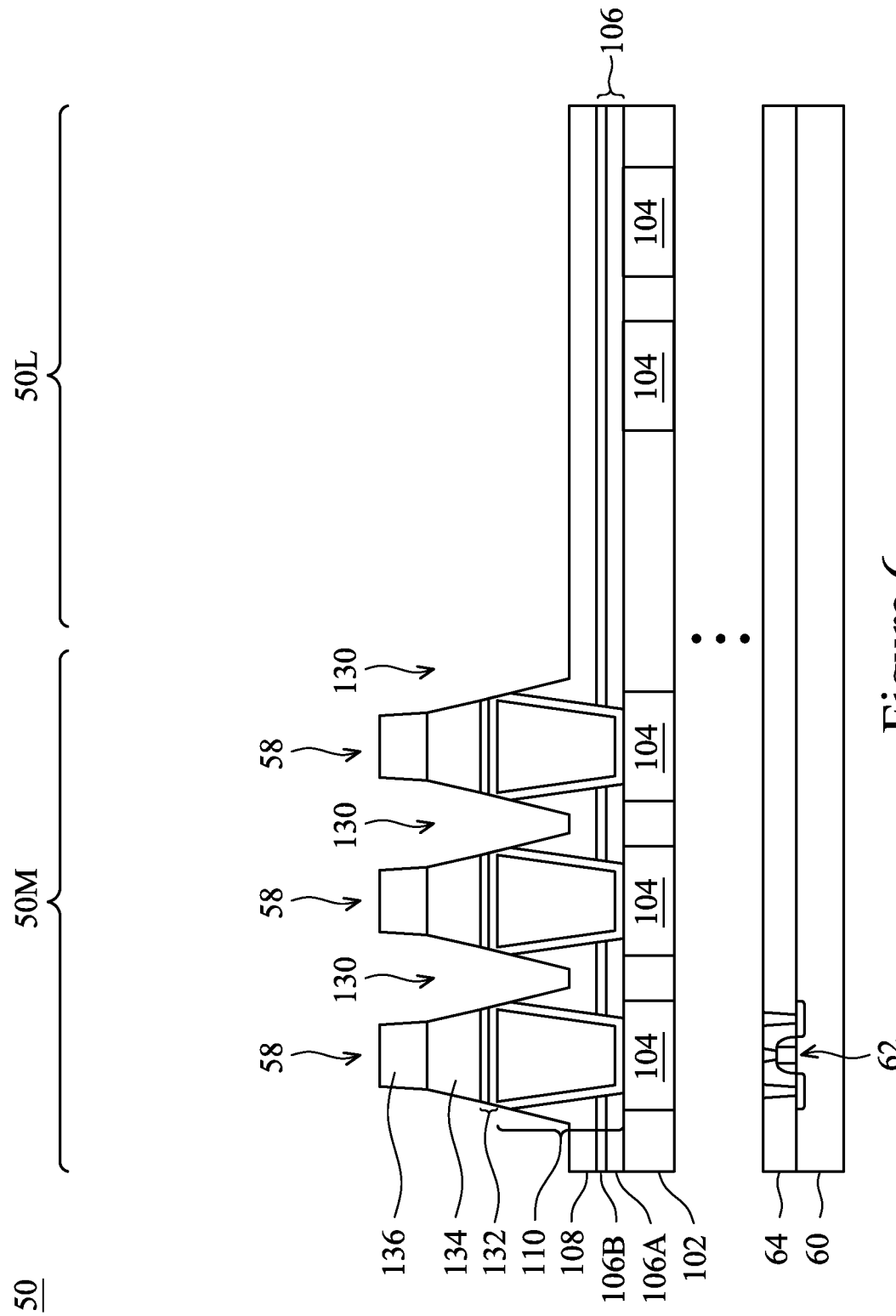

In FIG. 6, the photosensitive mask 128 is used as an etching mask to etch and pattern the hard mask layer 126. The patterned hard mask layer 126 is then used as etching mask to etch and pattern the top electrode layer 120, MTJ film stack 118, and bottom electrode layer(s) 116. The patterning may include one or more etching processes, and can form recesses 130 in the IMD layer 108. The etching method may include a plasma etching method, such as ion beam etching (IBE). IBE offers a high level of precision (e.g., high anisotropism), which can help control the profile of the resulting MRAM cells. The etching may be implemented using glow discharge plasma (GDP), capacitive coupled plasma (CCP), inductively coupled plasma (ICP), or the like. The photosensitive mask 128 and hard mask layer 126 may be consumed in the etching process, or may be removed after the etching process.

The etching process forms bottom electrodes 132, MTJ stacks 134, and top electrodes 136, which together form MRAM cells 58. Each MRAM cell 58 includes a bottom electrode 132, a MTJ stack 134, and a top electrode 136. The bottom electrodes 132 comprise remaining portions of the bottom electrode layer(s) 116. The MTJ stacks 134 comprise remaining portions of the MTJ film stack 118. The top electrodes 136 comprise remaining portions of the top electrode layer 120. In some embodiment, the etching process partially etches the IMD layer 108 and conductive vias 110. In such embodiments, the remaining portions of the IMD layer 108 have sloped sidewalls, and have trapezoidal shapes in the illustrated cross-section. After the etching process, the remaining portions of the IMD layer 108 in the logic region 50L can have a thickness in the range of about 30 Å to about 300 Å. The MTJ stacks 134 and bottom electrodes 132 also have sloped sidewalls, and have trapezoidal shapes in the illustrated cross-section.

Figure 7:
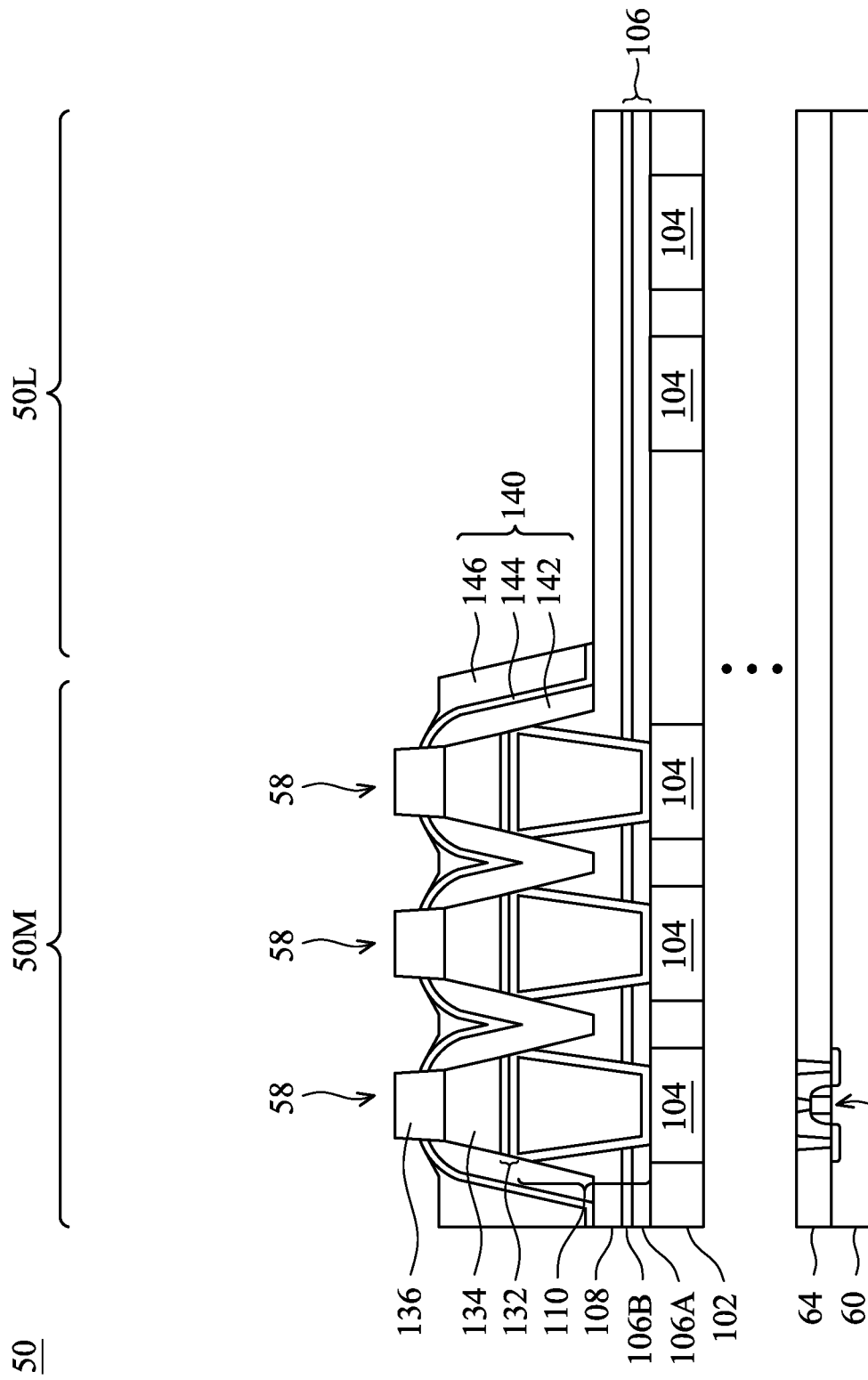

In FIG. 7, spacers 140 are formed on the sidewalls of the MRAM cells 58. The spacers 140 surround and protect the components of the MRAM cells 58. The spacers 140 may be formed of an oxide (e.g., silicon oxide, aluminum oxide, etc.), a nitride (e.g., silicon nitride, aluminum nitride, etc.), a carbide (e.g., silicon carbide), combinations thereof (e.g., silicon oxynitride, silicon carbonitride, etc.), multilayers thereof, or the like.

In an embodiment where the spacers 140 comprise a multilayer, the spacers 140 comprise passivation layers 142 and 144 and an oxide layer 146. As an example to form the spacers 140, the passivation layer 142 can be blanket formed over the MRAM cells 58 and in the recesses 130 (see Figure 6). In some embodiments, the passivation layer 142 may comprise silicon oxide, silicon nitride, silicon oxynitride, silicon carbide, silicon carbonitride, a combination thereof, or the like, and may be formed using CVD, plasma-enhanced chemical vapor deposition (PECVD), ALD, plasma-enhanced atomic layer deposition (PEALD), PVD, a combination thereof, or the like. In some embodiments, the passivation layer 142 may reduce or prevent moisture (e.g., $H_2O$) diffusion into the MRAM cells 58 during subsequent processing. The passivation layer 142 is then patterned to expose portions of the top electrodes 136. In some embodiments, the patterning is a dry etching process, such as an anisotropic etching process. The patterning removes horizontal portions of the passivation layer 142. Subsequently, another passivation layer 144 is formed over the passivation layer 142. In some embodiments, the passivation layer 144 is formed of one of the candidate materials and methods for the passivation layer 142, but is formed of a different material than the passivation layer 142. For example, the passivation layer 142 can be formed of an oxide, e.g., silicon oxide, and the passivation layer 144 can be formed of a nitride, e.g., silicon nitride. The oxide layer 146 is then formed over the passivation layer 144. In some embodiments, the oxide layer 146 may comprise silicon oxide, or the like, and may be formed using CVD, PECVD, ALD, PEALD, a combination thereof, or the like. Subsequently, one or more dry etching processes are performed to etch the passivation layer 144 and the oxide layer 146 and to expose portions of the top electrodes 136. In some embodiments, the one or more dry etching processes are anisotropic etching processes and remove horizontal portions of the oxide layer 146. The remaining portions of the passivation layer 142, the passivation layer 144, and the oxide layer 146 form the spacers 140. The IMD layer 108 in the logic region 50L is exposed after the spacers 140 are patterned.

Figure 8:
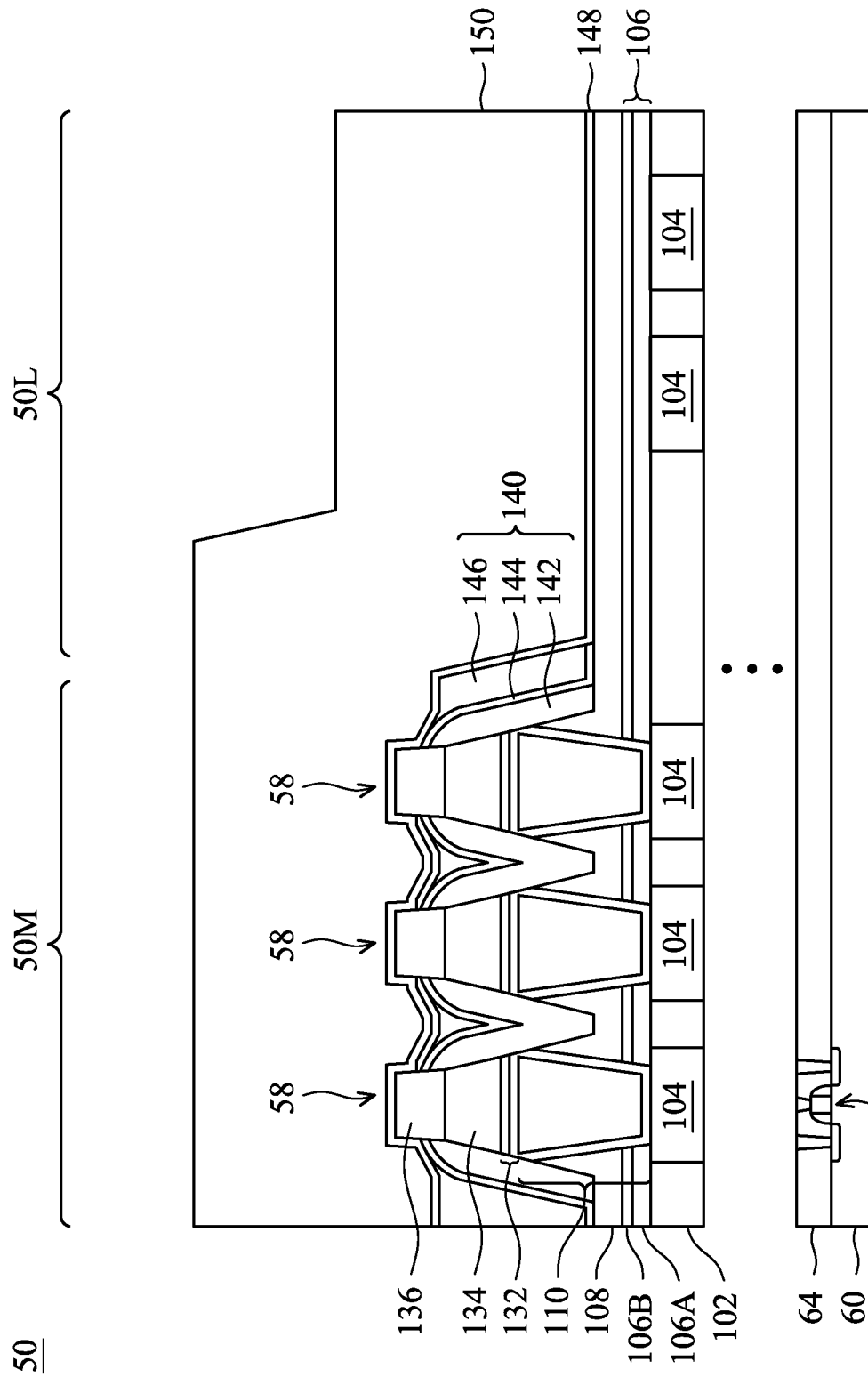

In FIG. 8, an etch stop layer 148 is formed over exposed portions of the spacers 140, top electrodes 136, and IMD layer 108. An IMD layer 150 is then formed on the etch stop layer 148. The etch stop layer 148 can be formed of a dielectric material such as aluminum nitride, aluminum oxide, silicon carbide, silicon carbonitride, a combination thereof, multilayers thereof, or the like. In some embodiments, the IMD layer 150 is formed using similar materials and methods as the IMD layer 108. In some embodiments, the etch stop layer 148 is formed of aluminum nitride and the IMD layer 150 is formed of silicon oxide. Aluminum nitride and silicon oxide have a high selectivity relative an etching process that will be used to pattern the IMD layer 150 (discussed further below). The IMD layer 150 is formed to a thickness in the range of about 1200 Å to about 1600 Å.

Due to pattern loading, portions of the IMD layer 150 in the memory region 50M can extend above portions of the IMD layer 150 in the logic region 50L. The IMD layer 150 is formed to a sufficient thickness that the portions of the IMD layer 150 in the logic region 50L have a greater thickness than the MRAM cells 58.

Figure 9:
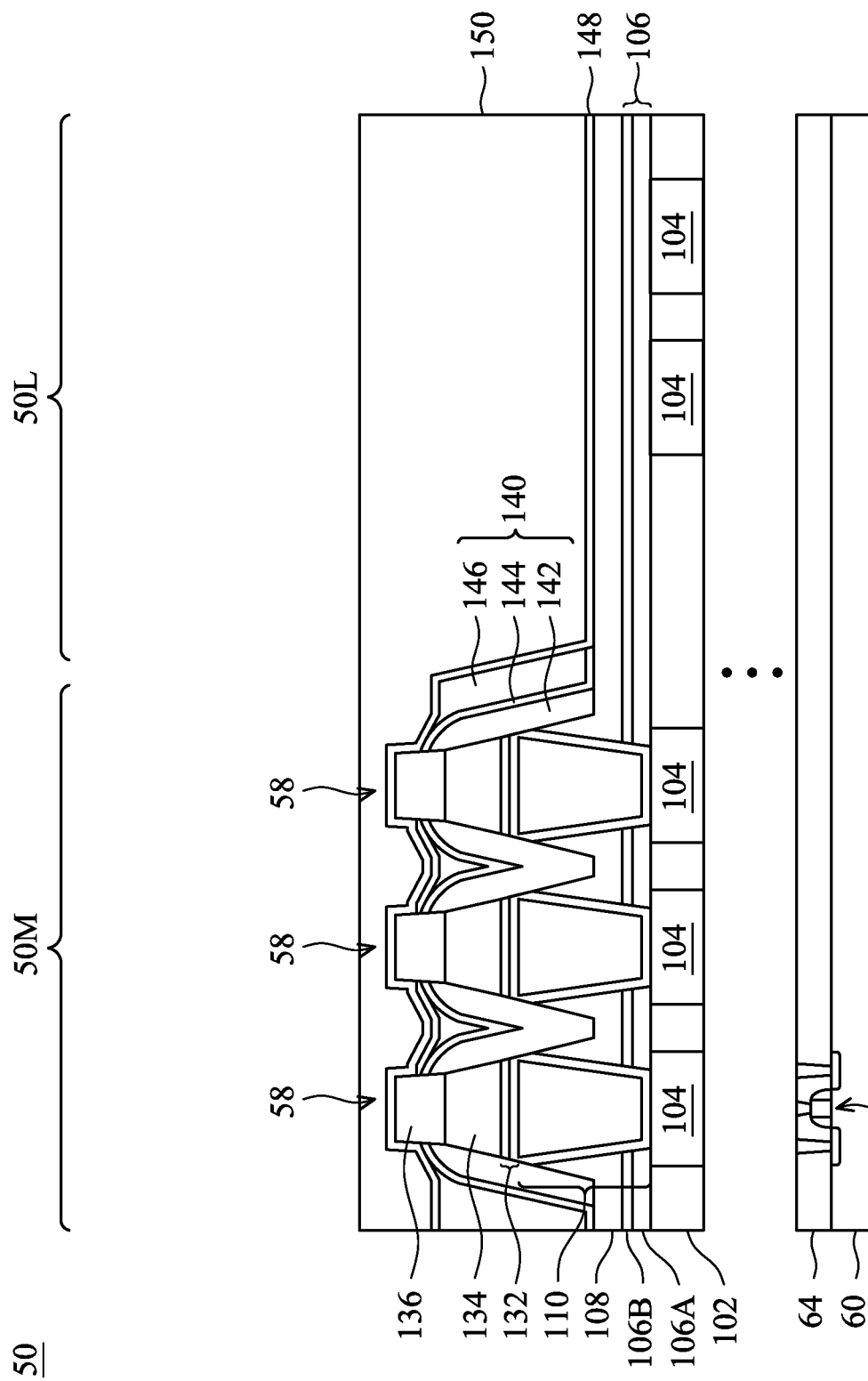

In FIG. 9, a planarization process is performed to planarize the IMD layer 150. The planarization process can be a CMP process, a mechanical grinding process, or the like. The MRAM cells 58 remain buried after the planarization process, and portions of the IMD layer 150 in the logic region 50L and the memory region 50M share a planar topmost surface after the planarization process.

Figure 10:
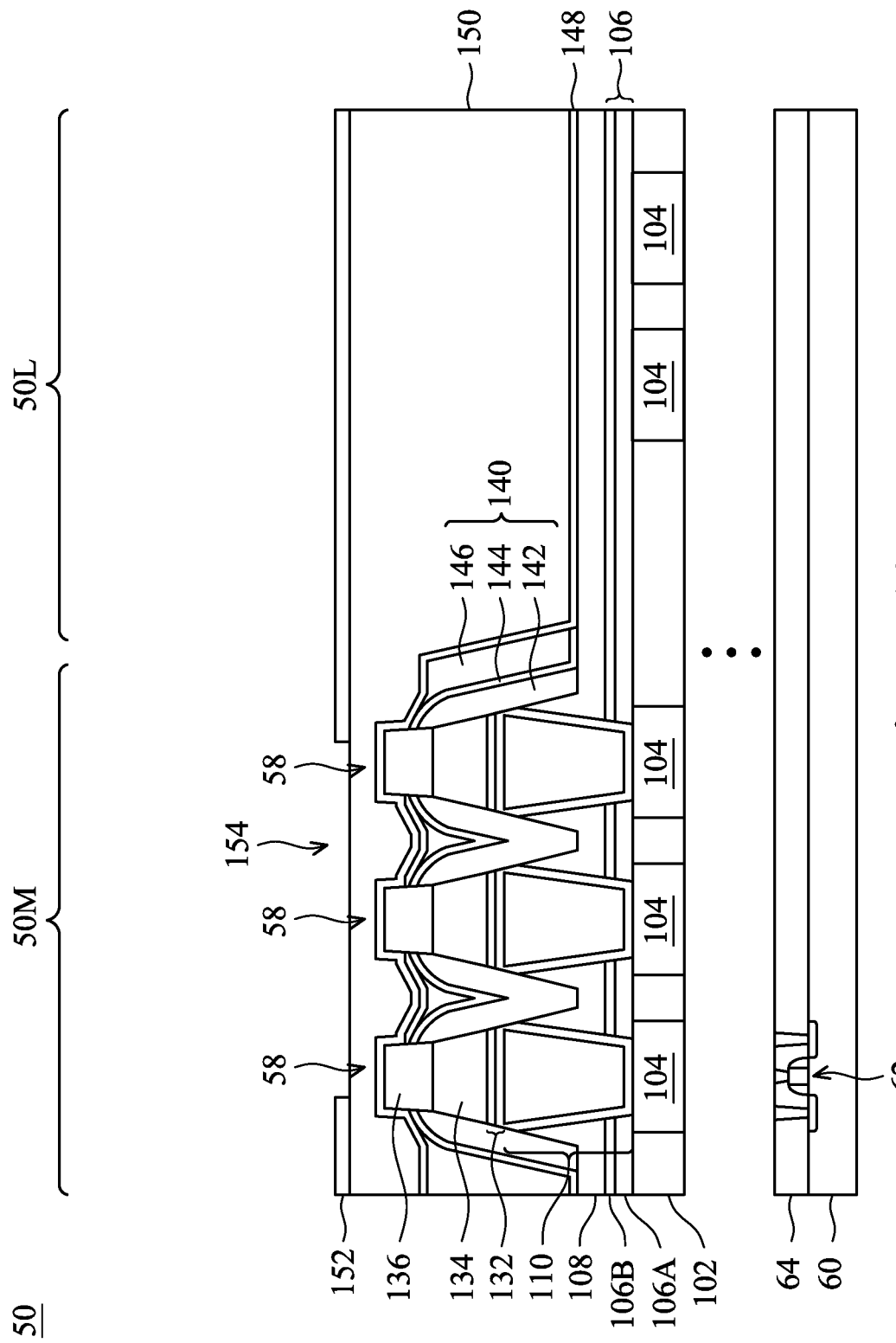

In FIG. 10, a hard mask 152 is formed on the planar topmost surface of the IMD layer 150. The hard mask 152 may comprise a dielectric material such as silicon oxide, silicon nitride, titanium oxide, BSG, BPSG, USG, FSG, SiOCH, flowable oxide, a porous oxide, or the like; a conductive material such as titanium, tantalum, tungsten, alloys thereof, or the like; multilayers thereof; or the like. For example, the hard mask 152 can include a silicon carbide layer and a titanium nitride layer formed on the silicon carbide layer, with the titanium nitride layer having a thickness in the range of about 200 Å to about 400 Å, and the silicon carbide layer having a thickness in the range of about 50 Å to about 150 Å. The silicon carbide layer is used as a glue layer to improve adhesion between the titanium nitride layer and the IMD layer 150. After the masking material of the hard mask 152 is formed, a patterning process is performed, with remaining portions of the masking material forming the hard mask 152. The patterning can be a dry etching process, such as an anisotropic etching process, using a photoresist as an etching mask. The photoresist can be a single-layer photoresist, a bi-layer photoresist, a tri-layer photoresist, or the like. The resulting hard mask 152 has openings 154, exposing underlying portions of the IMD layer 150.

Figure 11:
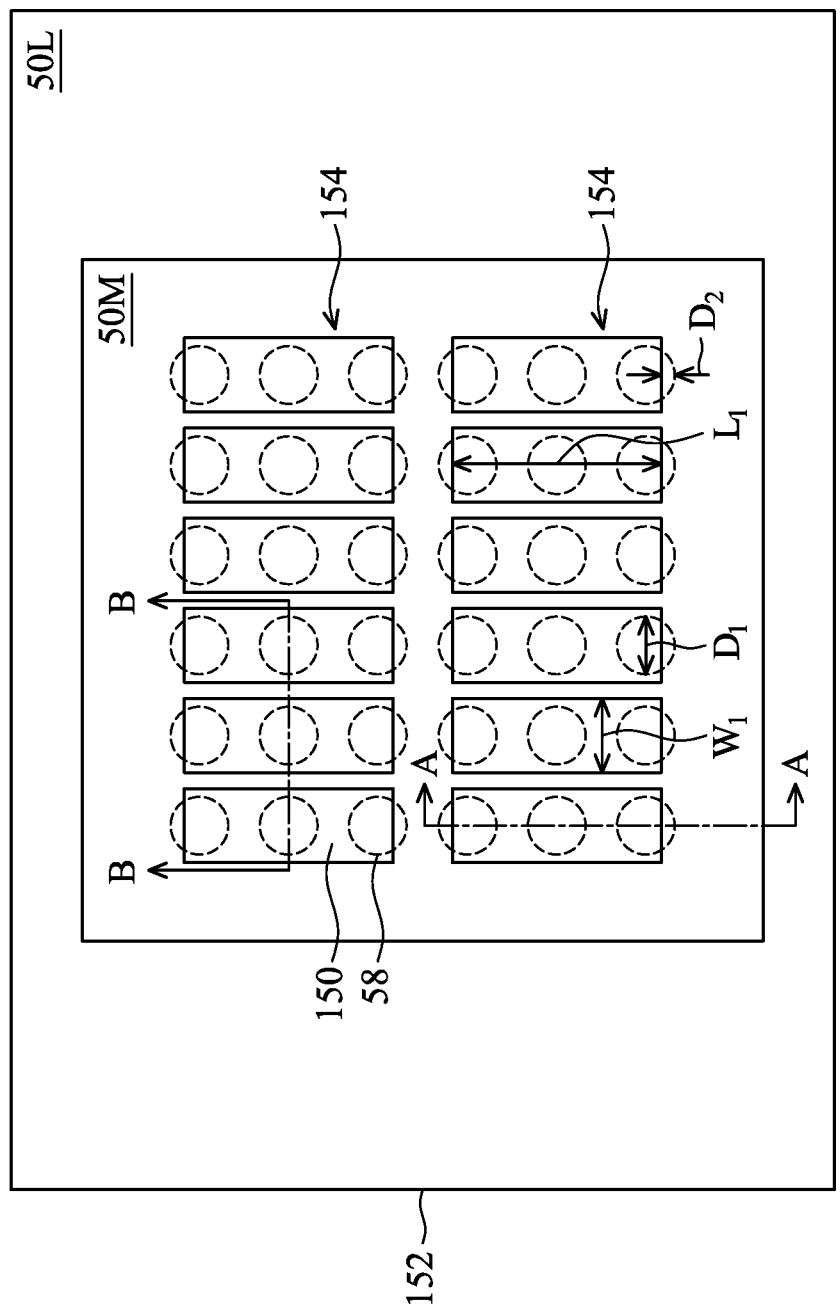

FIG. 11 is a top-down view of the MRAM device 50 after formation of the hard mask 152. As discussed further below, the hard mask 152 will be used to pattern openings 156 (see FIG. 12) in the IMD layer 150, exposing the underlying MRAM cells 58. The openings 154 in the hard mask 152 are each disposed over several MRAM cells 58 along columns of the MRAM array 52 (see FIG. 1). As such, each opening 156 (see FIG. 12) subsequently formed in the IMD layer 150 will expose multiple MRAM cells 58 along columns of the resulting MRAM array 52.

Each opening 154 will be used to expose the same quantity of MRAM cells 58 in the memory region 50M. The openings 154 in the hard mask 152 are of uniform dimensions, e.g., uniform widths $W_1$ and uniform lengths $L_1$. The widths $W_1$ of the openings 154 are can be in the range of about 250 Å to about 450 Å, and are larger than diameters $D_1$ of the MRAM cells 58, such as the diameters of the top electrodes 136. The diameter $D_1$ can be in the range of about 300 Å to about 400 Å. The lengths L1 can be in the range of about 1400 Å to about 50 µm, and are large enough to span several MRAM cells 58. In the illustrated embodiment, the openings 154 fully expose MRAM cells 58 in the center region of the openings 154, and partially expose MRAM cells 58 at the end regions of the openings 154. Specifically, the openings 154 can overlap with MRAM cells 58 at the end regions of the openings 154 by a distance $D_2$, which can be less than about 100 Å.

FIG. 11 further illustrates reference cross-sections that are used in later figures. Cross-section A-A is along a column of the MRAM array 52 (see FIG. 1) and in a direction of, for example, a bit line for the MRAM array 52. Cross-section B-B is perpendicular to cross-section A-A and is along a row of the MRAM array 52 and in a direction of, for example, a word line for the MRAM array 52. Subsequent figures refer to these reference cross-sections for clarity. Specifically, FIGS. 12A, 13A, and 14A are illustrated along cross-section A-A, and FIGS. 12B, 13B, and 14B are illustrated along cross-section B-B.

Figure 12A:
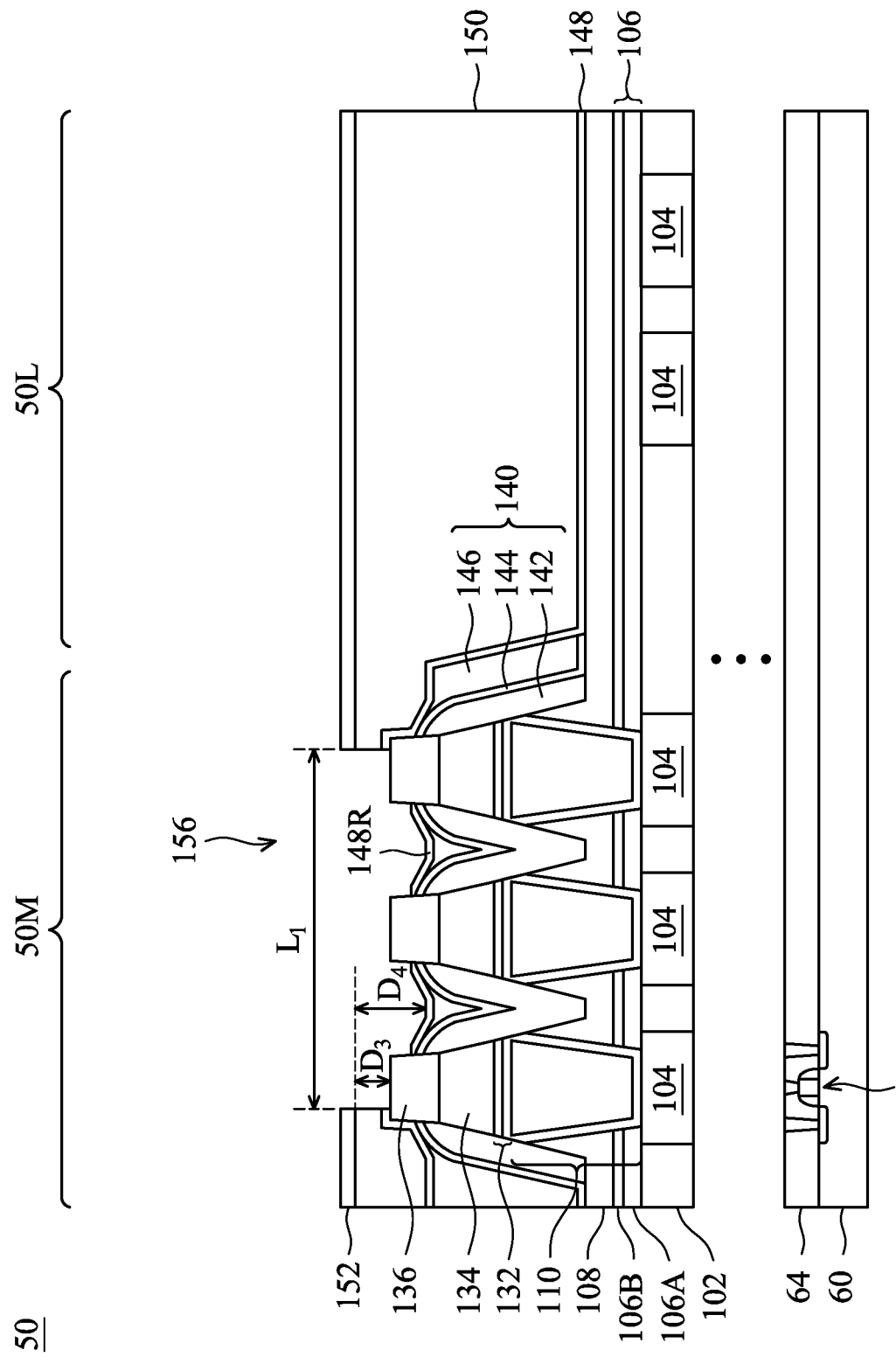
Figure 12B:
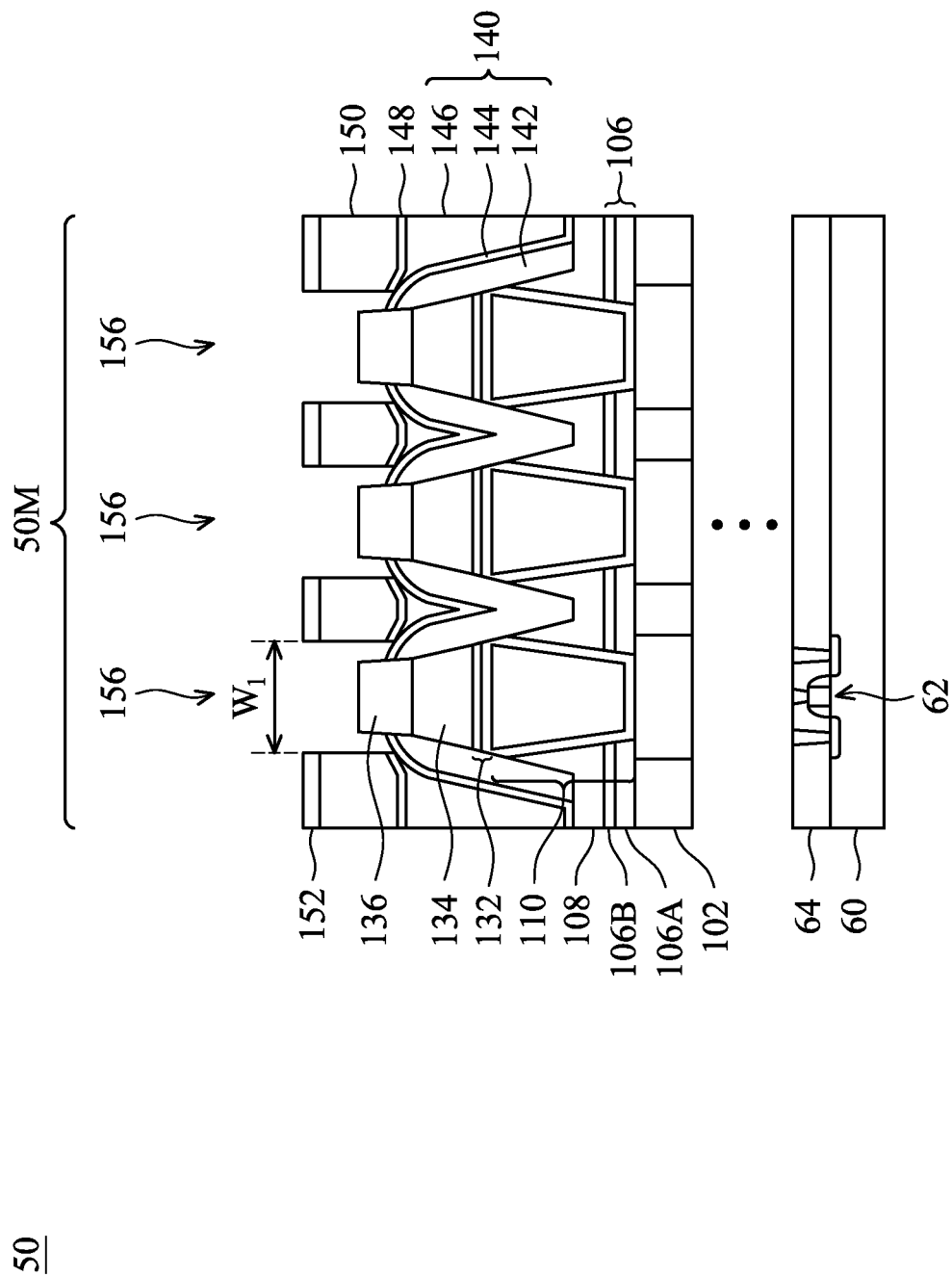

In FIGS. 12A and 12B, the hard mask 152 is used as an etching mask to pattern the IMD layer 150 and etch stop layer 148. The patterning may include one or more etching processes, and forms openings 156 in the IMD layer 150 and etch stop layer 148. As shown, the openings 156 have substantially the same top-down shape and dimensions (e.g., the same width $W_1$ and same length $L_1$) as the openings 154 in the hard mask 152 (see FIG. 11). Specifically, a first etching process can be performed to form the openings 156 in the IMD layer 150, and a second etching process can be performed to extend the openings 156 through the etch stop layer 148. In some embodiments, the patterning is one or more dry etching process(es), such as one or more anisotropic etching process(es). The etch stop layer 148 helps protect the top electrodes 136, and thus the MTJ stacks 134, from over-etching damage during the etching of the IMD layer 150. Because the width $W_1$ of the openings 156 is greater than the diameter $D_1$ of the MRAM cells 58 (see FIG. 11), the openings 156 expose sidewalls of the top electrodes 136 in the cross-section illustrated by FIG. 12B. In some embodiments, residual portions 148R of the etch stop layer 148 can remain between adjacent top electrodes 136. Although the residual portions 148R of the etch stop layer 148 can remain, top surfaces of the top electrodes 136 are exposed.

The openings 156 have several depths, as measured from the planar topmost surface of the IMD layer 150. The openings 156 have a depth $D_3$ over the top electrodes 136, which can be in the range of about 100 Å to about 300 Å. The openings 156 have a depth $D_4$ over the residual portions 148R of the etch stop layer 148, which can be in the range of about 300 Å to about 400 Å. In this embodiment, the openings 156 do not fully expose the top surfaces of all of the top electrodes 136. Rather, some of the top surfaces of the top electrodes 136 are only partially exposed. In other embodiments (discussed further below), the openings 156 fully expose the top surfaces of all of the top electrodes 136.

Figure 13A:
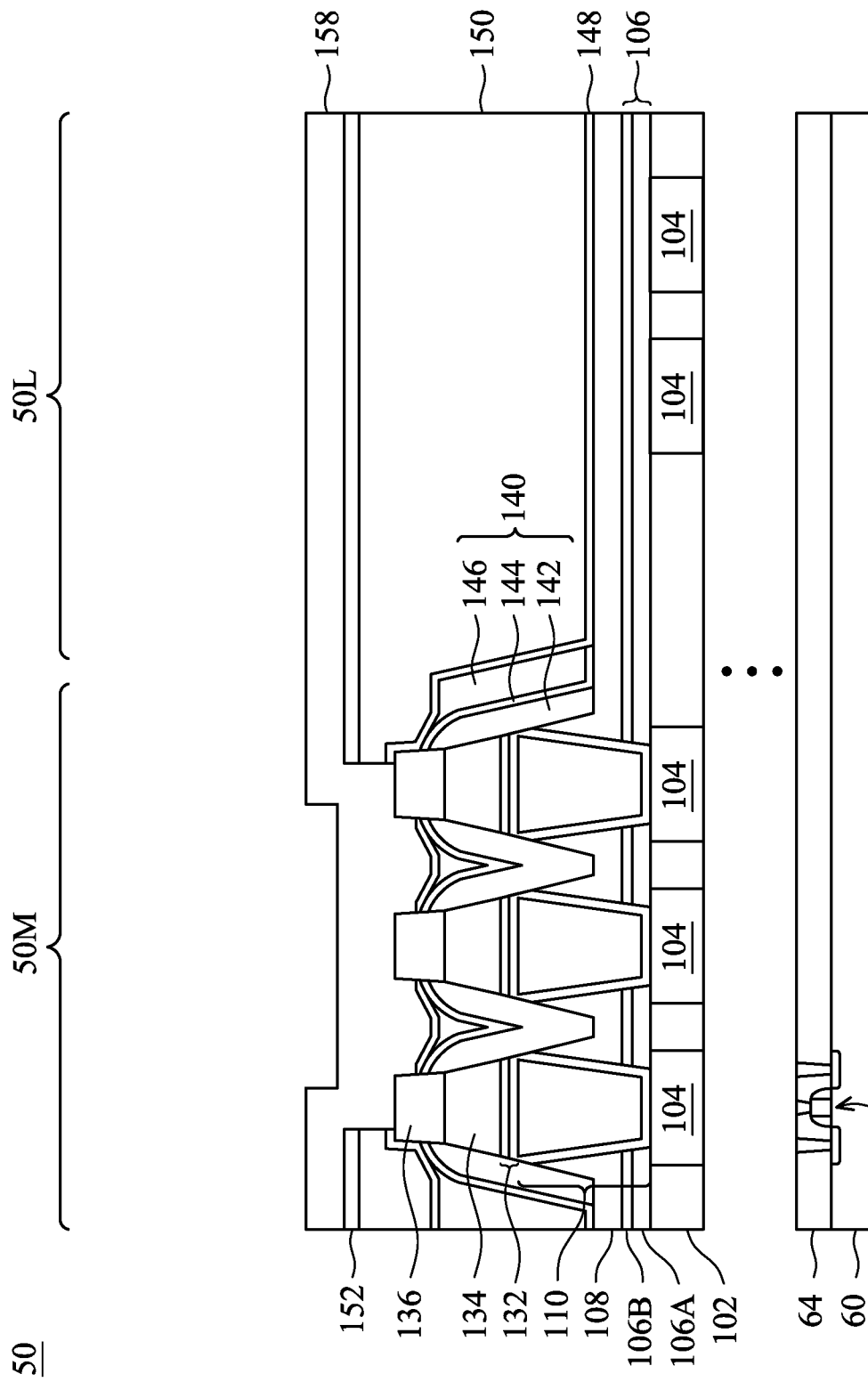
Figure 13B:
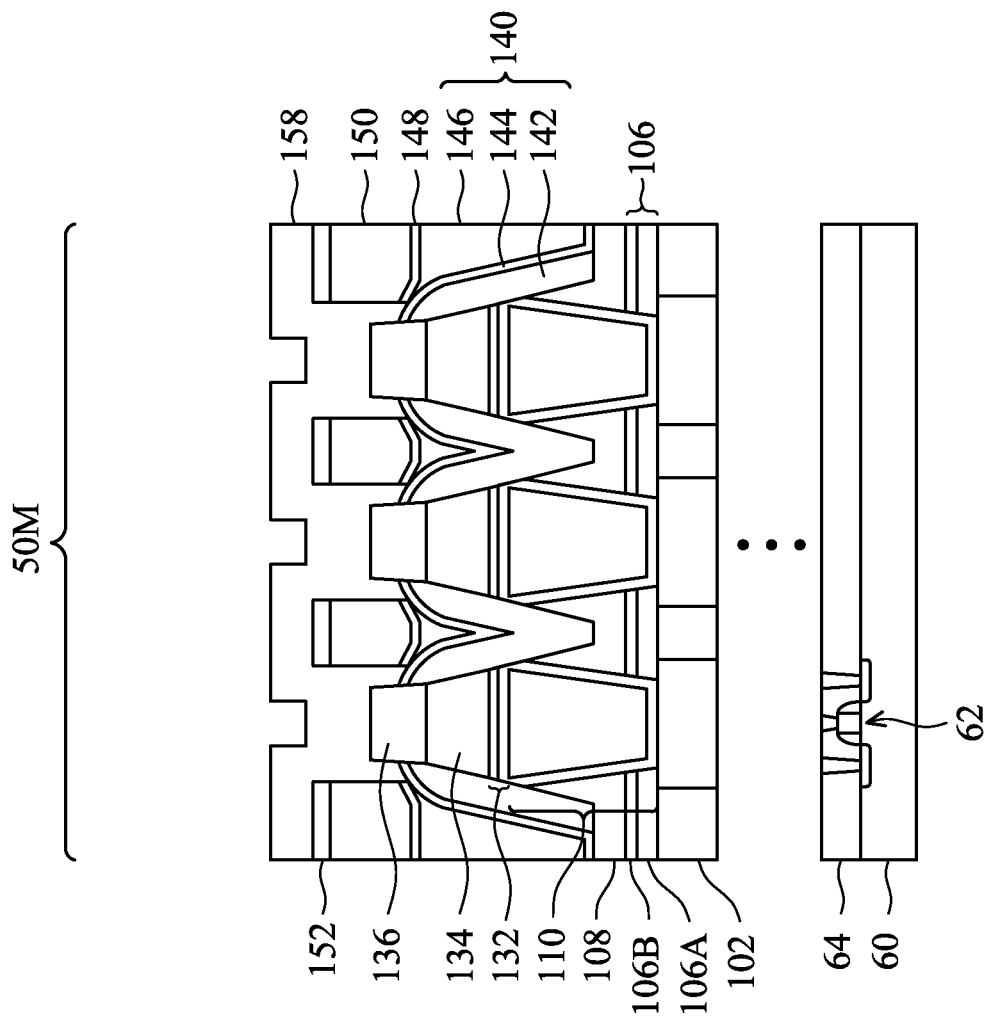
Figure 14A:
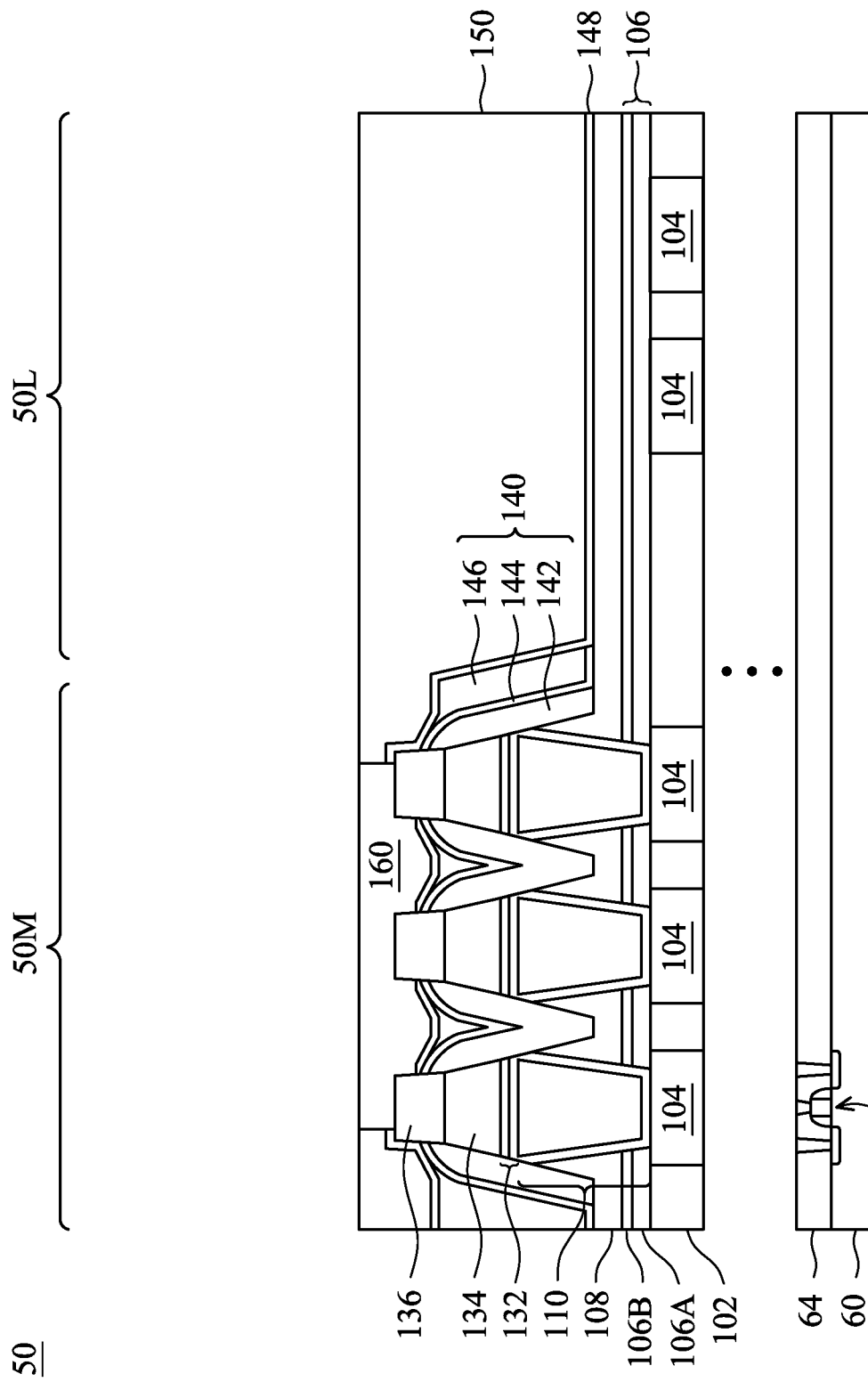
Figure 14B:
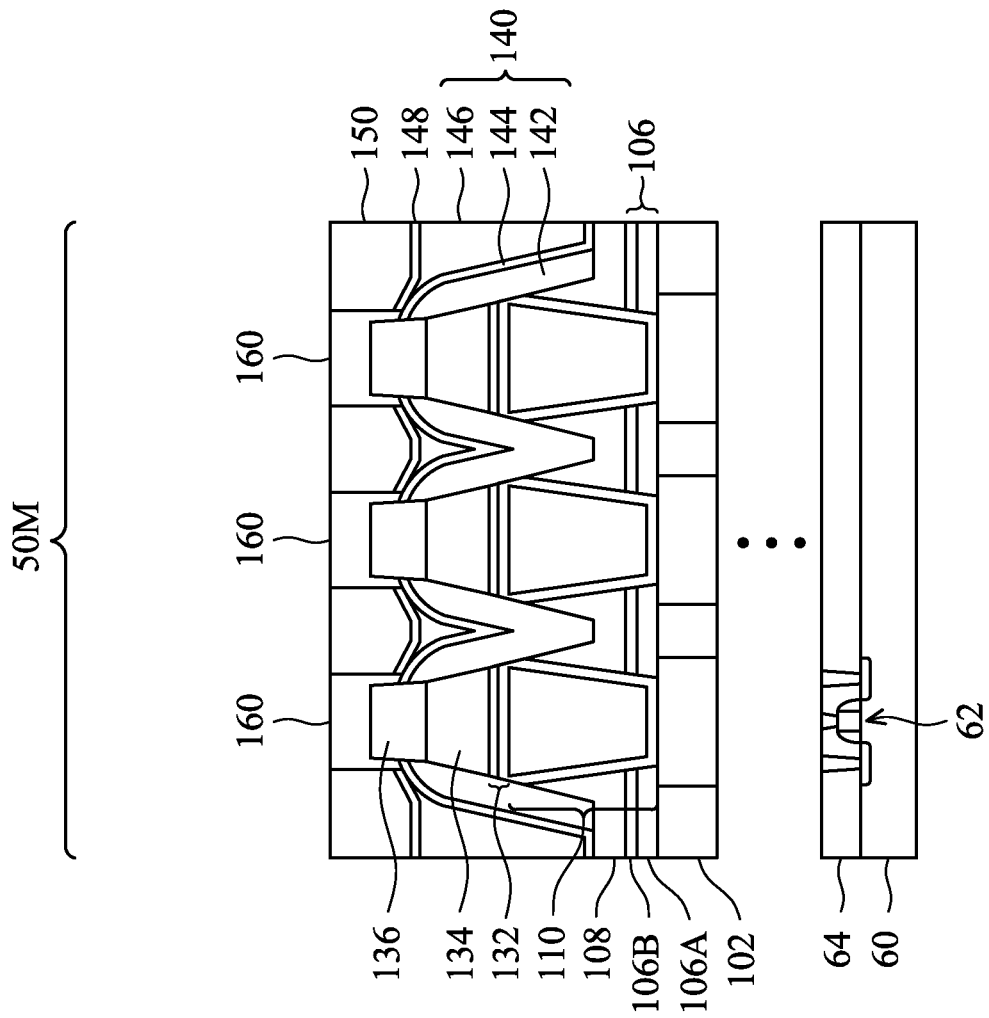

In FIGS. 13A and 13B, a shared electrode layer 158 is formed on the hard mask 152 and in the openings 156 (see FIGS. 12A and 12B). The shared electrode layer 158 can be formed of a conductive material. In some embodiments, the shared electrode layer 158 is formed using similar materials and methods as the top electrode layer 120 (see FIG. 4) and/or the hard mask 152, in embodiments where the hard mask 152 comprises a conductive material. The shared electrode layer 158 can be formed to a thickness in the range of about 500 Å to about 800 Å.

In FIGS. 14A and 14B, a planarization process is performed to planarize the shared electrode layer 158 and IMD layer 150. The planarization process can be a CMP process, a mechanical grinding process, or the like. The hard mask 152 and excess portions of the shared electrode layer 158 outside of the openings 156 (see FIGS. 13A and 13B) are removed by the planarization process. The planarization process forms shared electrodes 160, which comprise remaining portions of the shared electrode layer 158.

Figure 15:
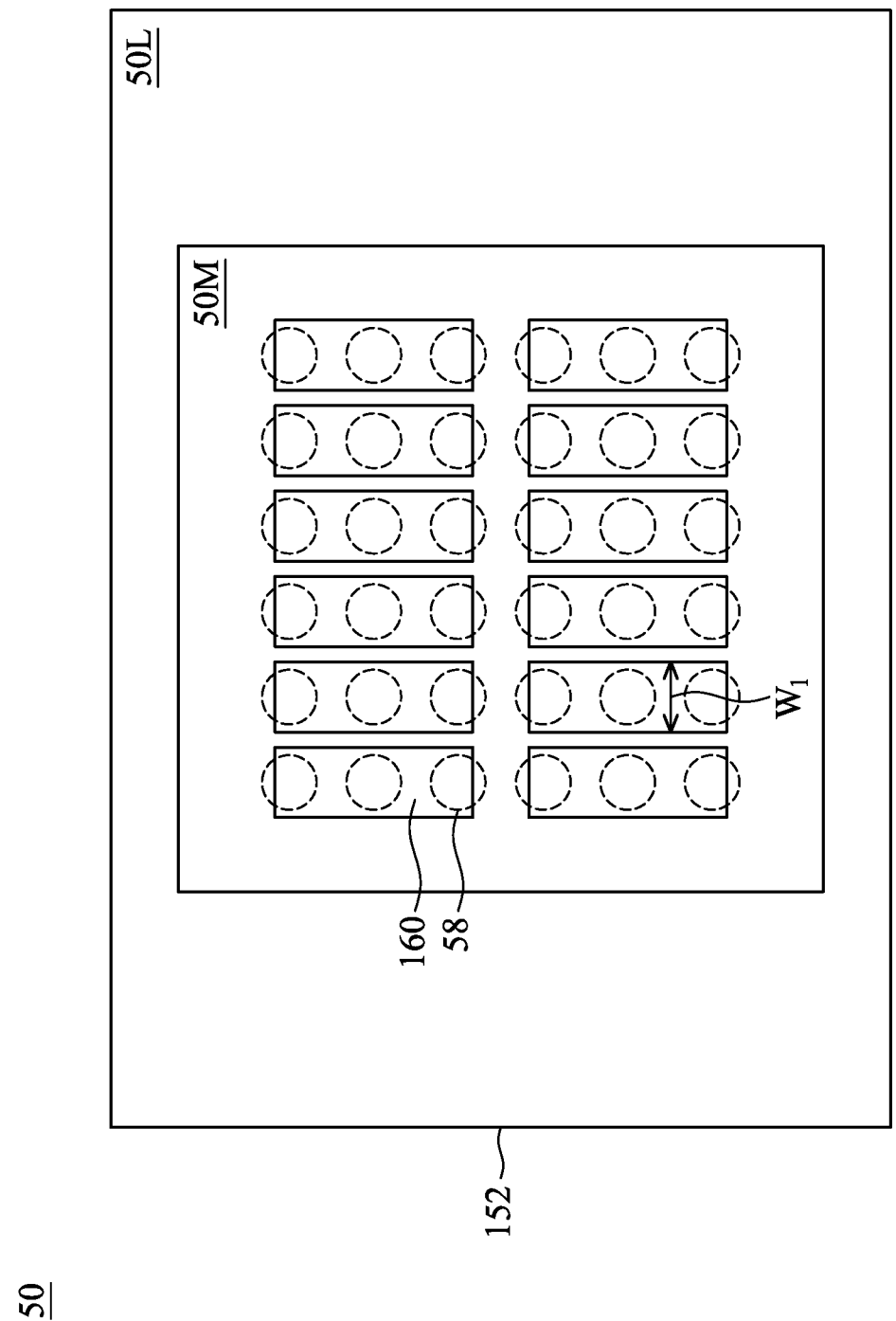

FIG. 15 is a top-down view of the MRAM device 50 after formation of the shared electrodes 160. As shown, the shared electrodes 160 have substantially the same top-down shape and dimensions (e.g., the same width $W_1$ and same length $L_1$) as the openings 154 in the hard mask 152 (see FIG. 11). In this embodiment, the shared electrodes 160 fully overlap with MRAM cells 58 in the center regions of the shared electrodes 160, but only partially overlap with the MRAM cells 58 at the end regions of the shared electrodes 160.

Figure 16:
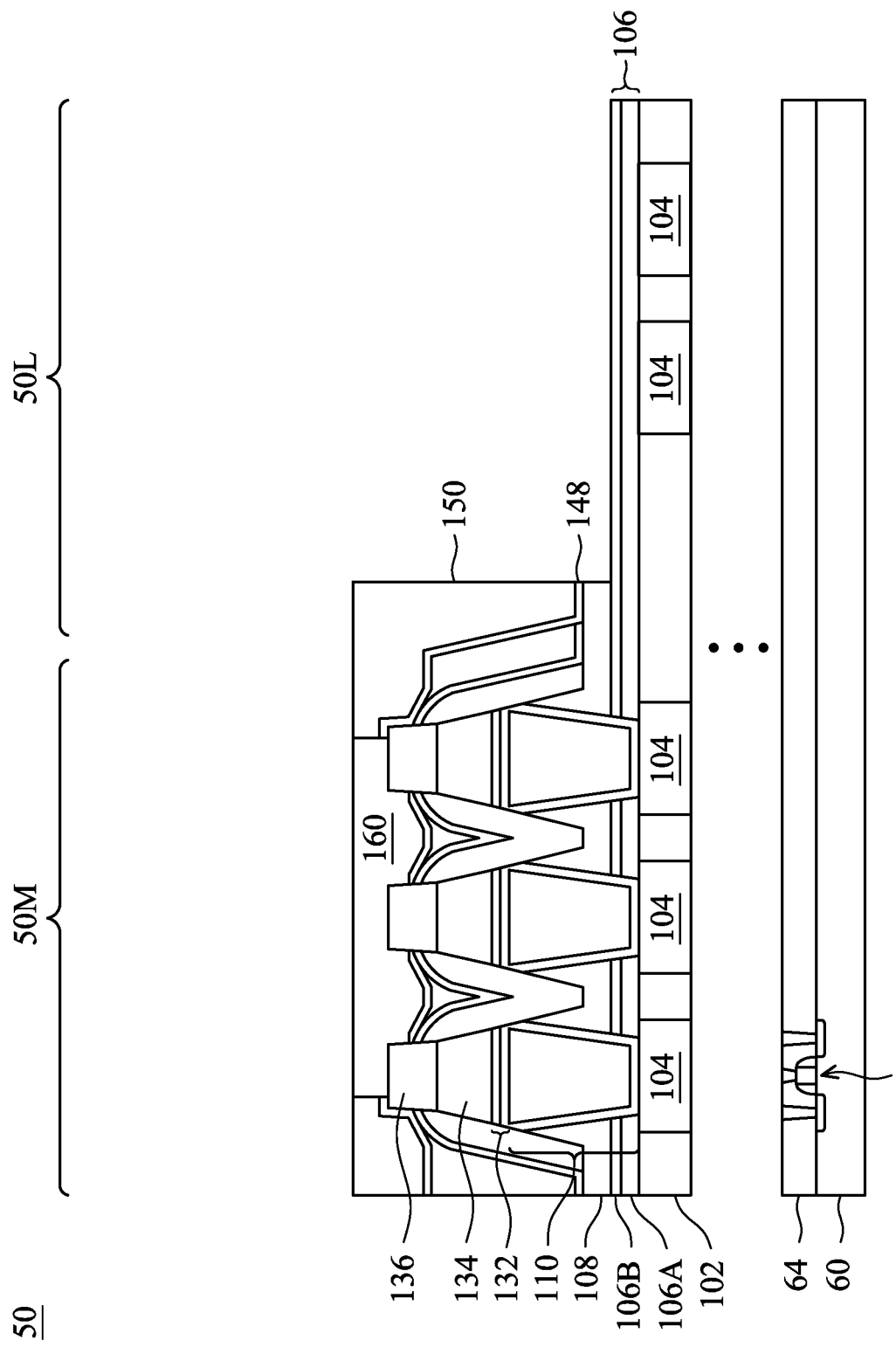

In FIG. 16, the IMD layer 150, etch stop layer 148, and IMD layer 108 are patterned to expose the etch stop layer(s) 106 in the logic region 50L. In some embodiments, the patterning process may comprise suitable photolithography and etching processes. Portions of the IMD layer 150, etch stop layer 148, and IMD layer 108 in the memory region 50M remain after the patterning process.

Figure 17:
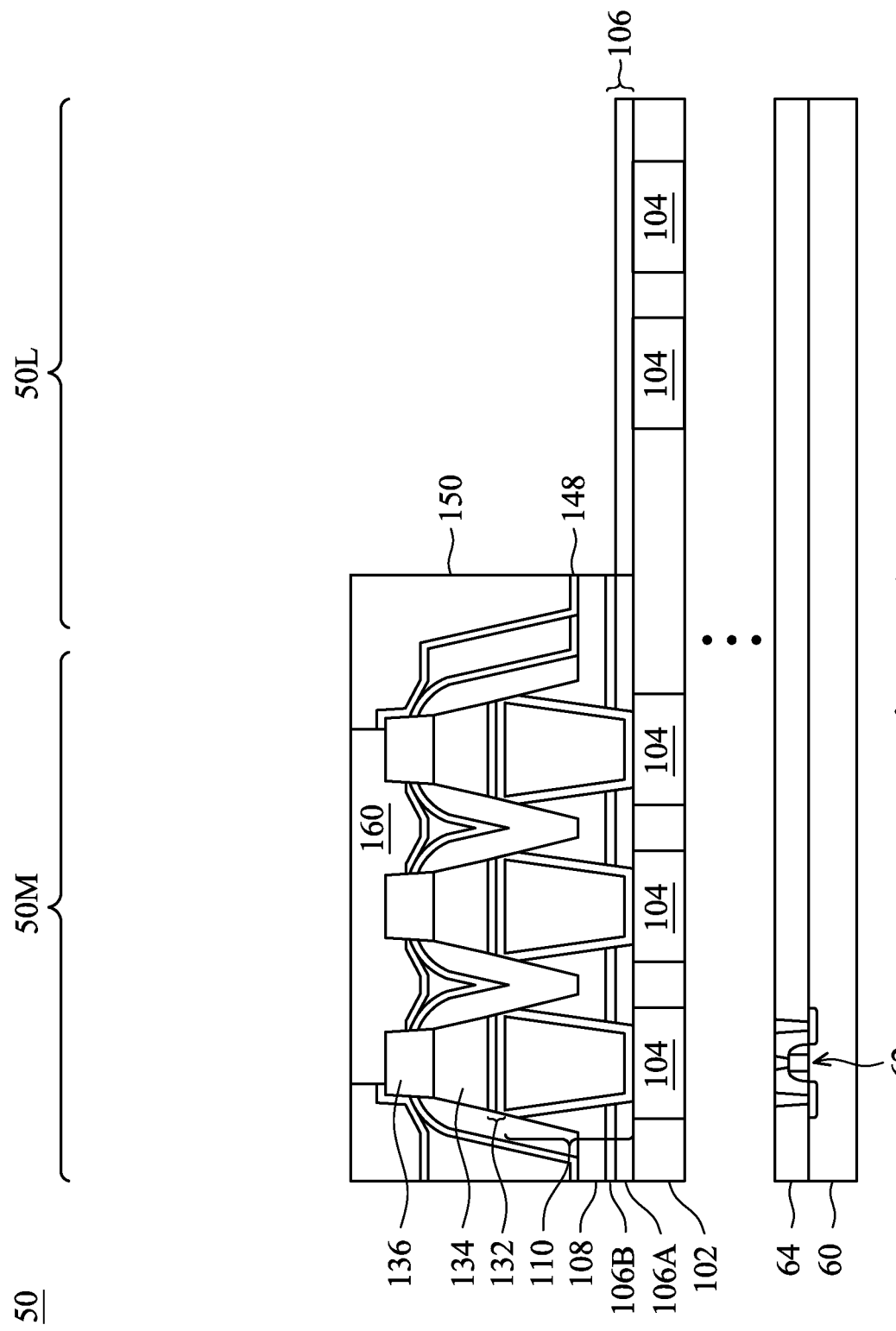

In FIG. 17, some of the etch stop layer(s) 106 may optionally be removed, such as in embodiments where the etch stop layer(s) 106 comprise a multilayer. For example, when the etch stop layer(s) 106 comprise a first etch stop layer 106A and a second etch stop layer 106B, portions of the second etch stop layer 106B in the logic region 50L can be removed to expose the underlying first etch stop layer 106A. The second etch stop layer 106B may be removed using an isotropic wet clean process that is selective to the material of the second etch stop layer 106B. The etching process used to remove the second etch stop layer 106B may be different from the etching process(es) used to pattern the IMD layer 150, etch stop layer 148, and IMD layer 108 (e.g., different etchants and/or other etching process parameters may be used). Using multilayered etch stop layer(s) 106 may be advantageous in some embodiments. For example, the second etch stop layer 106B can be etched slower than the first etch stop layer 106A by the etching process(es) used to etch the IMD layer 150, etch stop layer 148, and IMD layer 108 (see FIG. 16). Likewise, the first etch stop layer 106A can be etched slower than the second etch stop layer 106B by one or more etching process(es) that will be subsequently used to pattern openings for conductive features in the logic region 50L (see FIG. 21).

Figure 18:
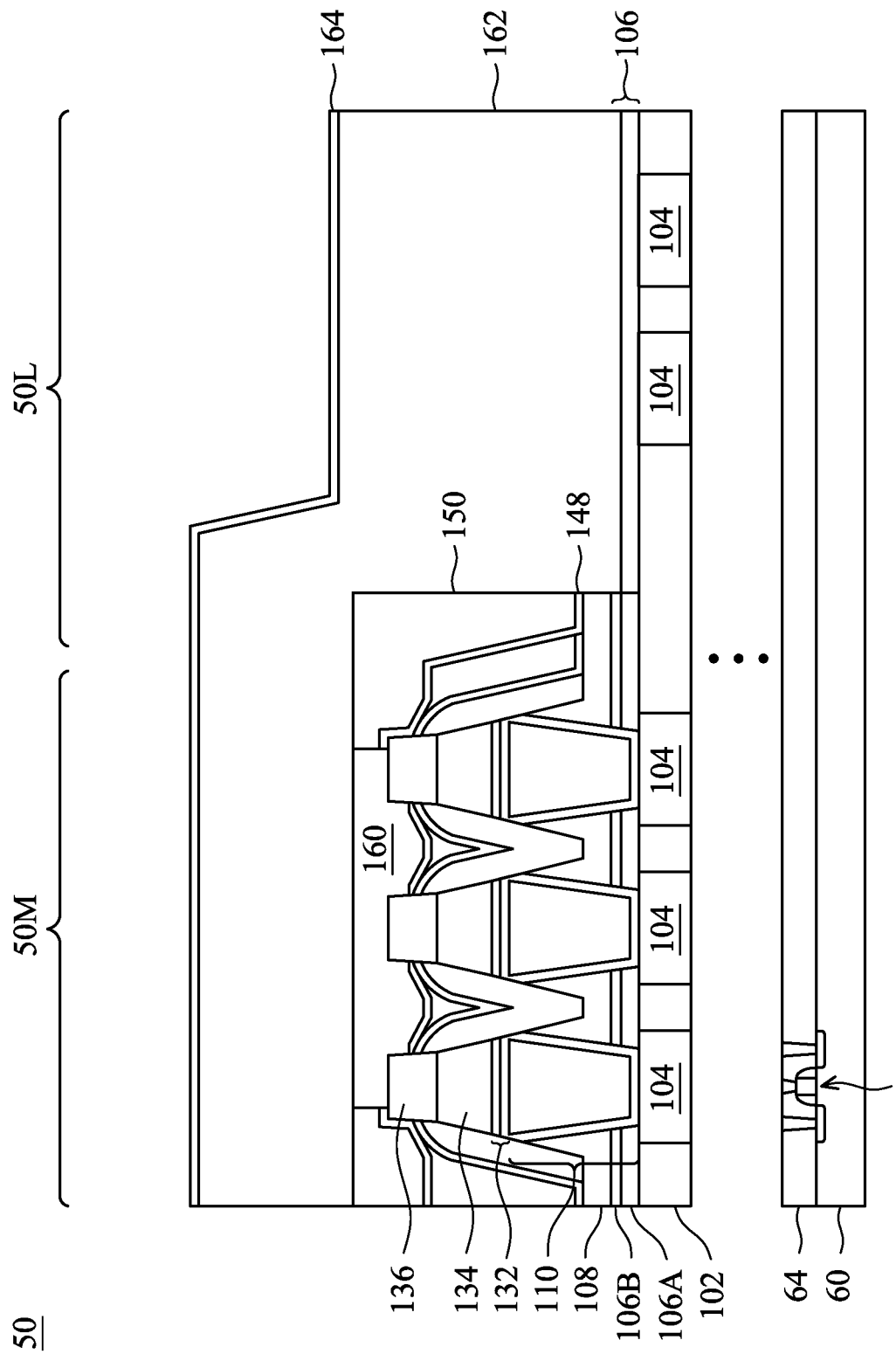

In FIG. 18, an IMD layer 162 is formed on the shared electrodes 160, IMD layer 150, and first etch stop layer 106A. In some embodiments, the IMD layer 162 is formed using similar materials and methods as the IMD layer 108. The IMD layer 162 can be formed to a thickness in the range of about 1100 Å to about 1650 Å. An anti-reflective layer 164 is then formed on the IMD layer 162. The anti-reflective layer 164 may be a nitrogen-free anti-reflective layer (NFARL), and can be formed of a nitrogen-free dielectric material such as silicon oxycarbide. The anti-reflective layer 164 can be formed to a thickness in the range of about 150 Å to about 400 Å. The anti-reflective layer 164 will be used to protect the memory region 50M during subsequent processing of the logic region 50L.

Figure 19:
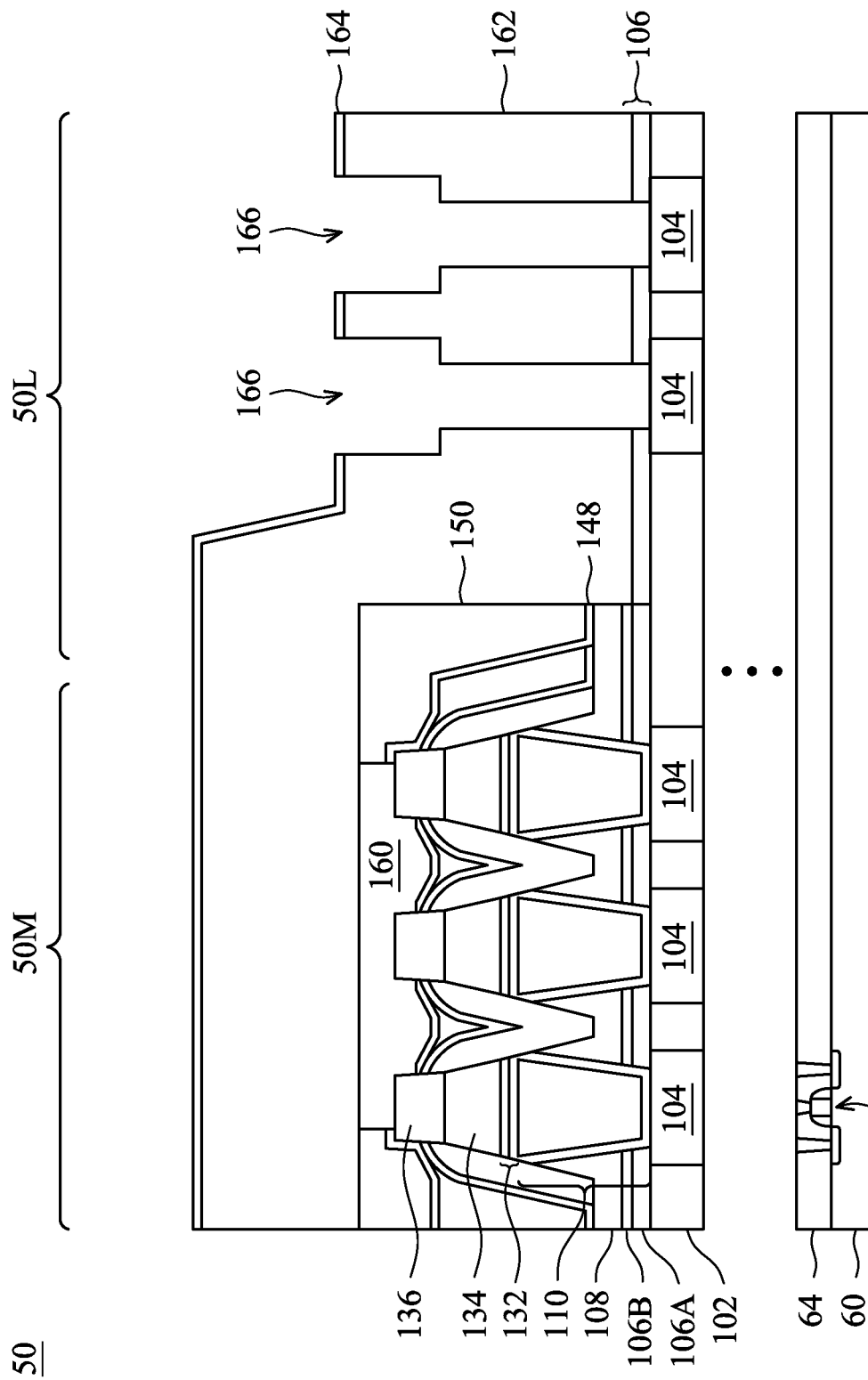

In FIG. 19, openings 166 are formed in the logic region 50L, exposing the conductive features 104 in the logic region 50L. Specifically, the openings 166 are formed through the anti-reflective layer 164, IMD layer 162, and first etch stop layer 106A. The openings 166 can be patterned by suitable photolithography and etching processes. Each of the openings 166 has an upper (e.g., trench) portion, in which a conductive line will be formed, and a lower (e.g., via) portion, in which a conductive via will be formed. In some embodiments, the openings 166 are formed by a via-first process. In other embodiments, the openings 166 are formed by a trench-first process. As discussed further below, an etchback process can optionally be performed to remove portions of the IMD layer 162 and anti-reflective layer 164 over the MRAM cells 58 before the openings 166 are formed.

Figure 20:
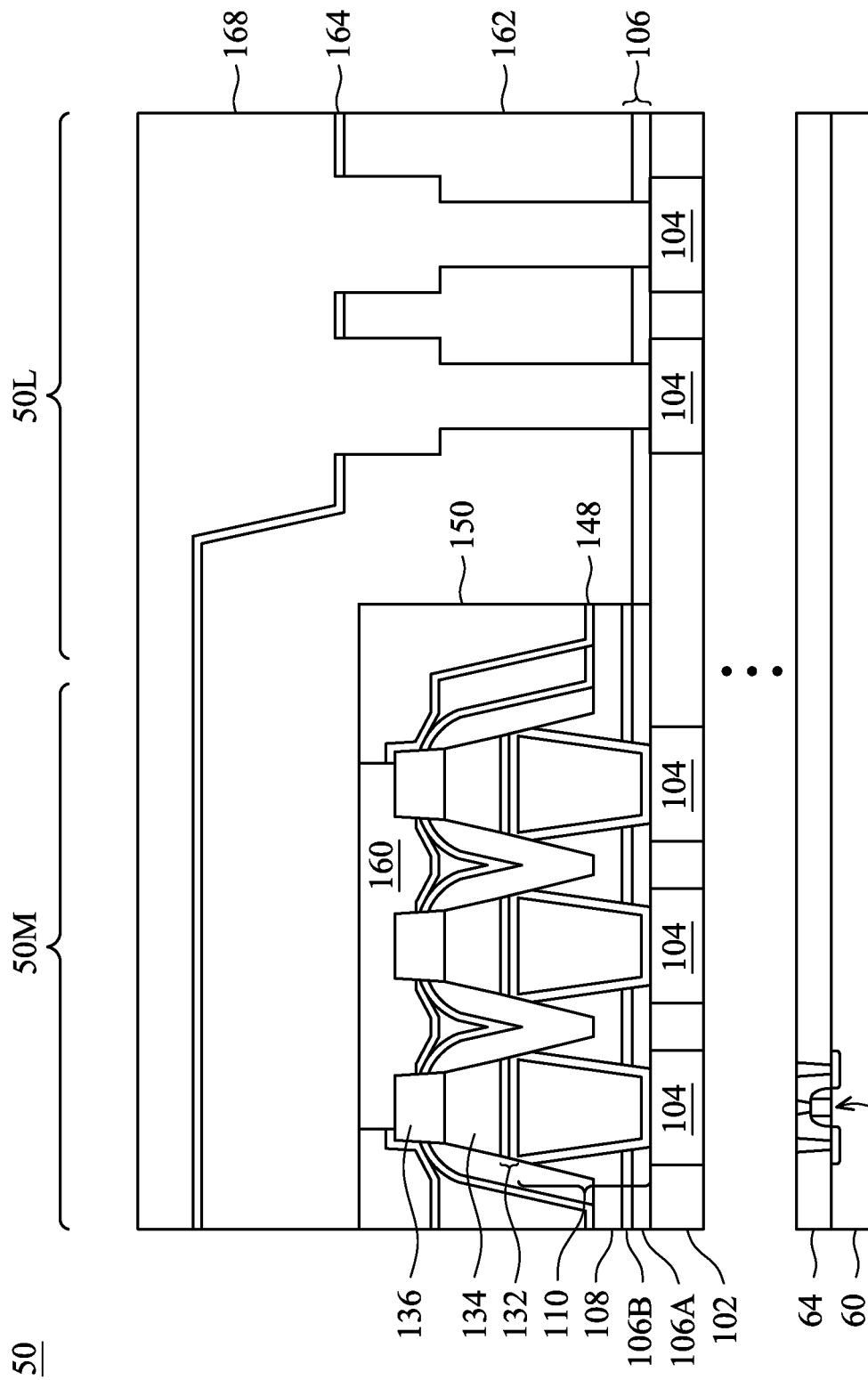

In FIG. 20, a conductive material 168 is formed in the openings 166. The conductive material 168 may overfill the openings 166 and may also be formed over the IMD layer 162 and anti-reflective layer 164. The conductive material 168 can be copper, aluminum, tungsten, gold, combinations thereof, or the like, and can be formed in the openings 166 by an electro-chemical plating process, CVD, ALD, PVD, the like, or a combination thereof.

Figure 21:
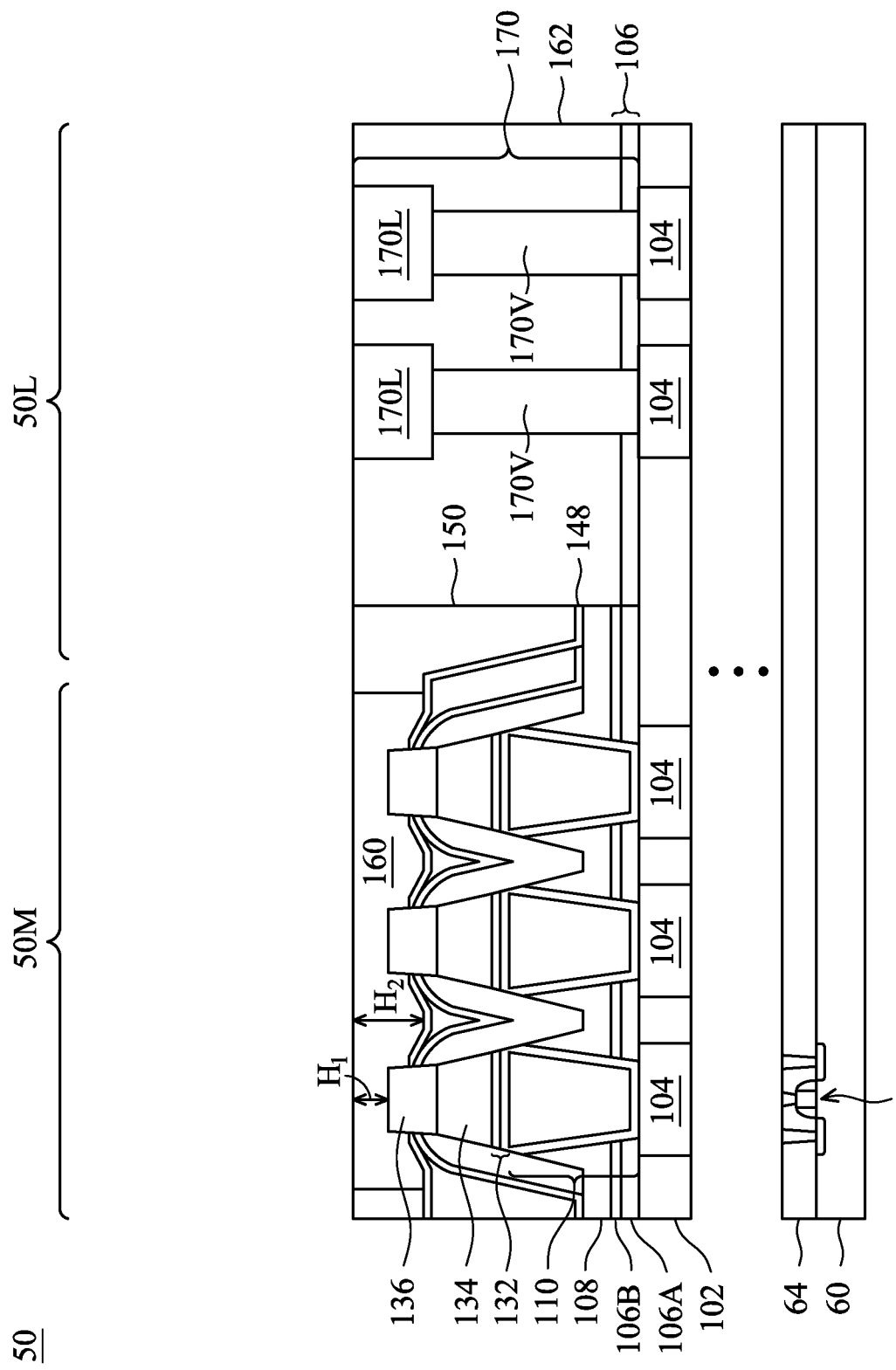

In FIG. 21, a planarization process is performed to remove excess of the conductive material 168 outside of the openings 166. The planarization process can be a CMP process, a mechanical grinding process, or the like. The planarization process can remove the anti-reflective layer 164, and expose the topmost surfaces of the IMD layer 150 and shared electrodes 160. The planarization process forms conductive features 170, which comprise remaining portions of the conductive material 168 in the openings 166. The conductive features 170 include conductive vias 170V, which are formed in the lower (e.g., via) portions of the openings 166, and conductive lines 170L, which are formed in the upper (e.g., trench) portions of the openings 166. The memory region 50M may be free from the conductive vias 170V and conductive lines 170L. Although each conductive via 170V and corresponding conductive line 170L is illustrated as a separate element, it should be appreciated that they may be a continuous conductive feature, such as in embodiments where they are formed by a dual damascene process. After the planarization process, top surfaces of the conductive features 170, IMD layer 162, IMD layer 150, and shared electrodes 160 are planar.

After the planarization process, the shared electrodes 160 have several heights, as measured from the planar topmost surface of the IMD layer 150. The shared electrodes 160 have a height $H_1$ over the top electrodes 136, which can be in the range of about 150 Å to about 250 Å. The shared electrodes 160 have a height $H_2$ over the residual portions 148R (see FIG. 12A) of the etch stop layer 148, which can be in the range of about 230 Å to about 350 Å.

Figure 22:
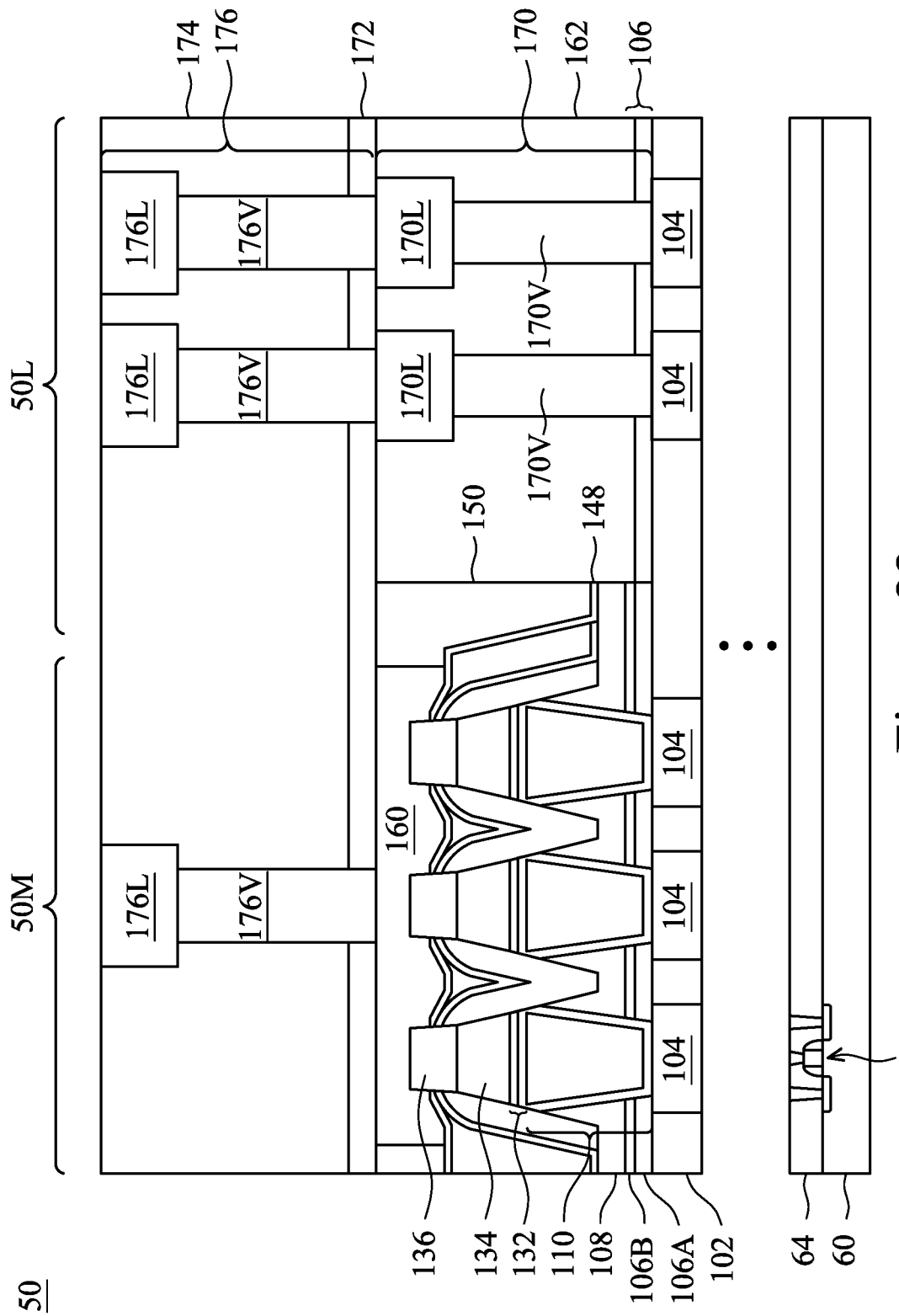

In FIG. 22, another metallization layer (e.g., M6, see FIG. 2) of the interconnect structure is formed. The metallization layer comprises one or more etch stop layer(s) 172, an IMD layer 174, and conductive features 176. The conductive features 176 include conductive vias 176V (which can correspond to the metal vias V6, see FIG. 2) and conductive lines 176L (which can correspond to the metal lines L6, see FIG. 2), and are formed in both the logic region 50L and memory region 50M. In some embodiments, the etch stop layer(s) 172 can be formed using similar materials and methods as the etch stop layer(s) 106. In some embodiments, the IMD layer 174 is formed using similar materials and methods as the IMD layer 162. In some embodiments, the conductive vias 176V and conductive lines 176L are formed using similar materials and methods as, respectively, the conductive vias 170V and conductive lines 170L. Although each conductive via 176V and corresponding conductive line 176L is illustrated as a separate element, it should be appreciated that they may be a continuous conductive feature, such as in embodiments where they are formed by a dual damascene process. Notably, the conductive vias 176V and conductive lines 176L may be formed of a different conductive material than the shared electrodes 160. Selection of the various conductive materials allows the contact resistance to the shared electrodes 160 to be tuned. The conductive features 176 are electrically connected to the memory devices (e.g., MRAMs) formed in the memory region 50M and the logic devices (e.g., logic circuits) formed in the logic region 50L. Specifically, some of the conductive vias 176V are physically and electrically connected to the shared electrodes 16o. In some embodiments, the conductive vias 176V and conductive lines 176L electrically connect the memory devices in the memory region 50M to the logic devices in the logic region 50L. In some embodiments, the conductive features 176 in the logic region 50L and the memory region 50M are formed in a same process. In some embodiments, the conductive features 176 in the logic region 50L and the conductive features 176 in the memory region 50M are formed in different processes. For example, because the shared electrodes 160 provide an increased landing area, the conductive features 176 in the memory region 50M may be formed larger (e.g., wider) than the conductive features 176 in the logic region 50L, which can help reduce the contact resistance to the MRAM cells 58.

Figure 23:
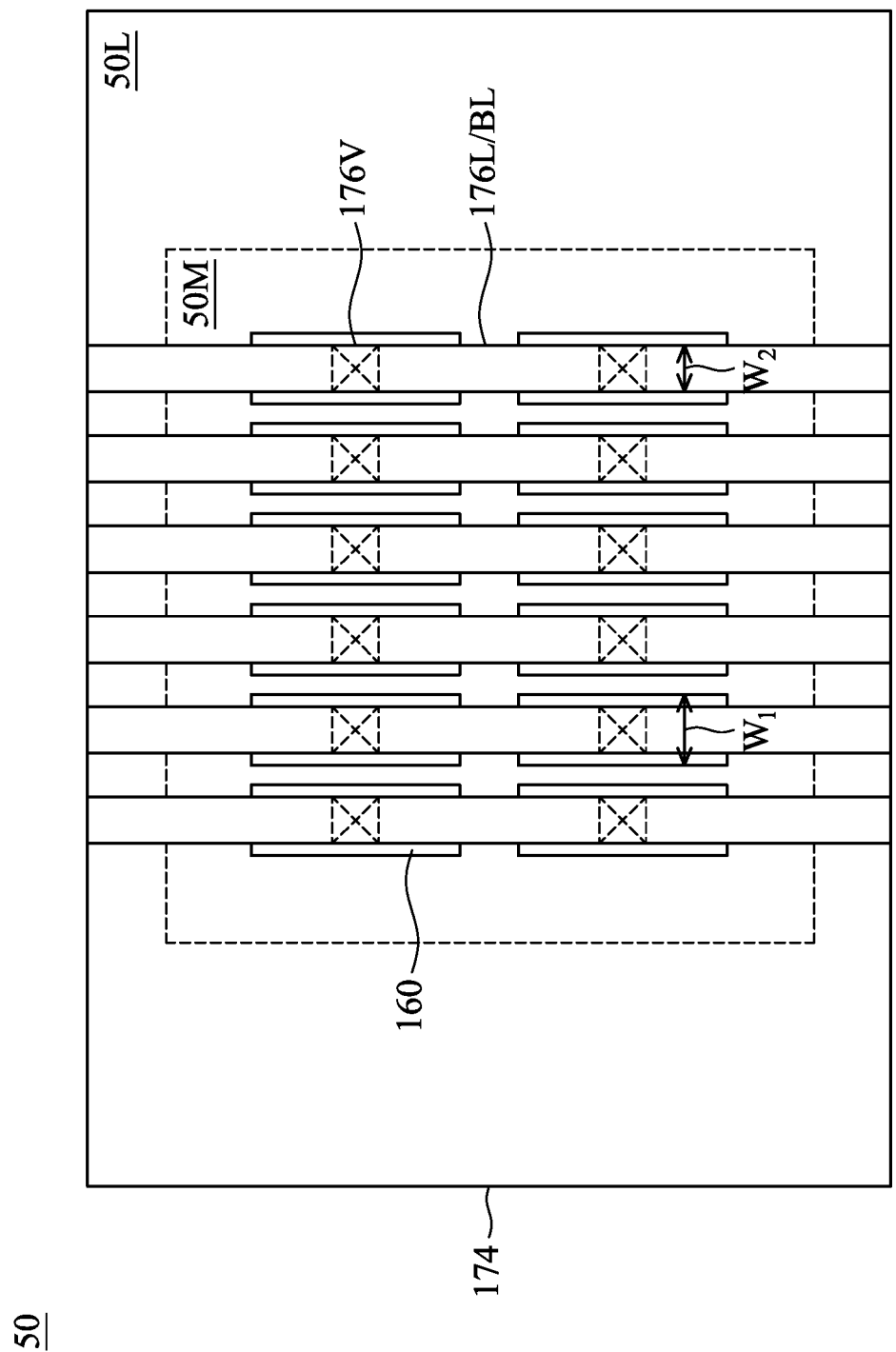

FIG. 23 is a top-down cutaway view of the MRAM device 50 after formation of the conductive vias 176V and conductive lines 176L. As shown, the conductive lines 176L include bit lines BL for the MRAM array 52 (see FIG. 1). Each bit line BL is electrically connected to multiple shared electrodes 160 by the conductive vias 176V. In turn, each of the shared electrodes 160 is electrically connected to multiple MRAM cells 58 (see FIG. 15). The conductive vias 176V have a width $W_2$, which can be in the range of about 450 Å to about 650 Å. The widths $W_1$ of the shared electrodes 160 are greater than the widths $W_2$ of the conductive vias 176V.

Embodiments may achieve advantages. The diameters $D_1$ of the MRAM cells 58 (see FIG. 11) can be small. Specifically, the diameters $D_1$ of the MRAM cells 58 are smaller than the widths $W_2$ of the conductive vias 176V, particularly when the MRAM cells 58 are formed in a higher level (e.g., M5 in FIG. 2) of an interconnect structure. However, the widths $W_1$ of the shared electrodes 160 are greater than the widths $W_2$ of the conductive vias 176V. Advantageously, the shared electrodes 160 thus provide landing pads of sufficient size for the conductive vias 176V, which can prevent punch-through to the underlying layers during formation of the conductive vias 176V. For example, the top electrodes 136 and MTJ stacks 134 can be protected from over-etching damage when etching the openings for the conductive vias 176V. Further, by providing a larger contact area, the contact resistance of the conductive vias 176V can be reduced. Finally, as noted above, the conductive material selected for the shared electrodes 160 can be different from that of overlying conductive features 176, which allows the contact resistance to the shared electrodes 160 to be tuned.

Figure 24:
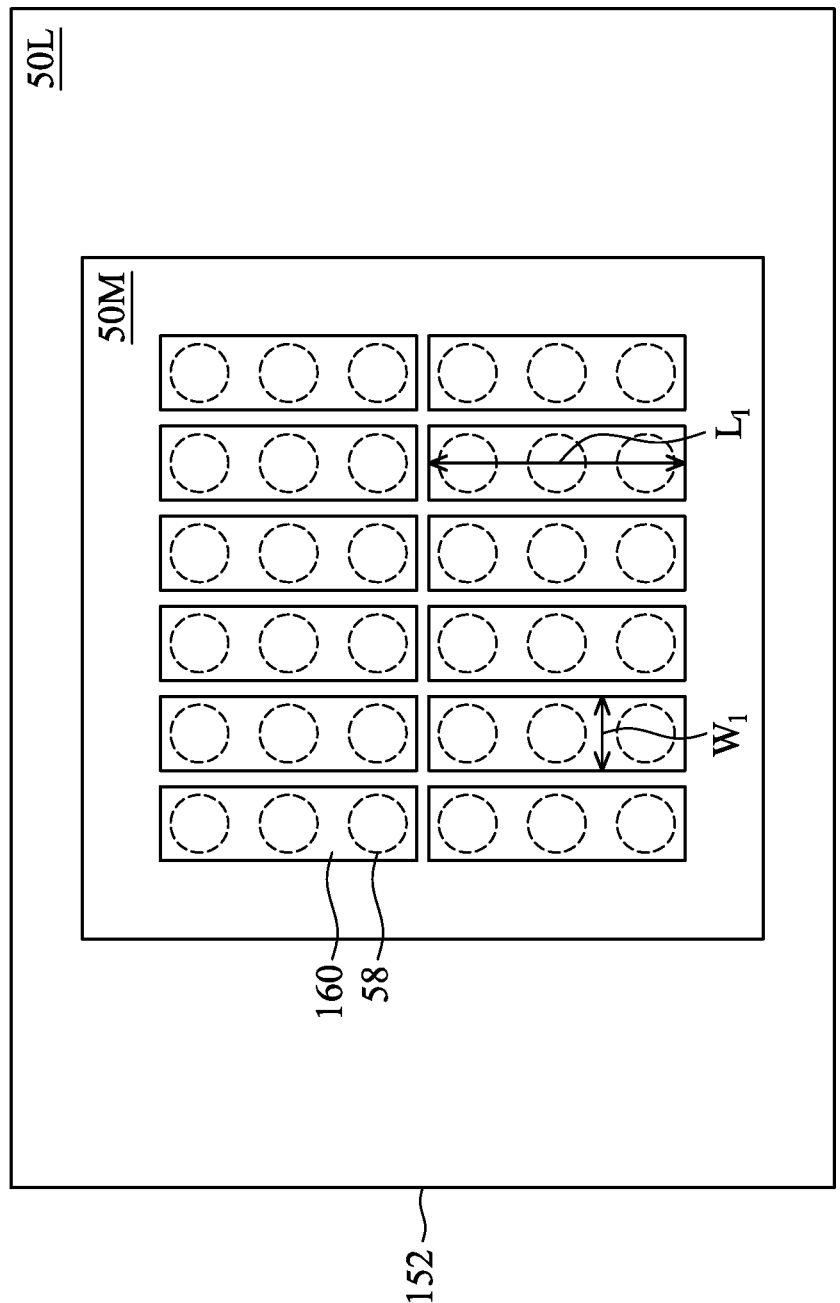
FIGS. 24 and 25 are various views of a MRAM device, in accordance with some embodiments.
Figure 25:
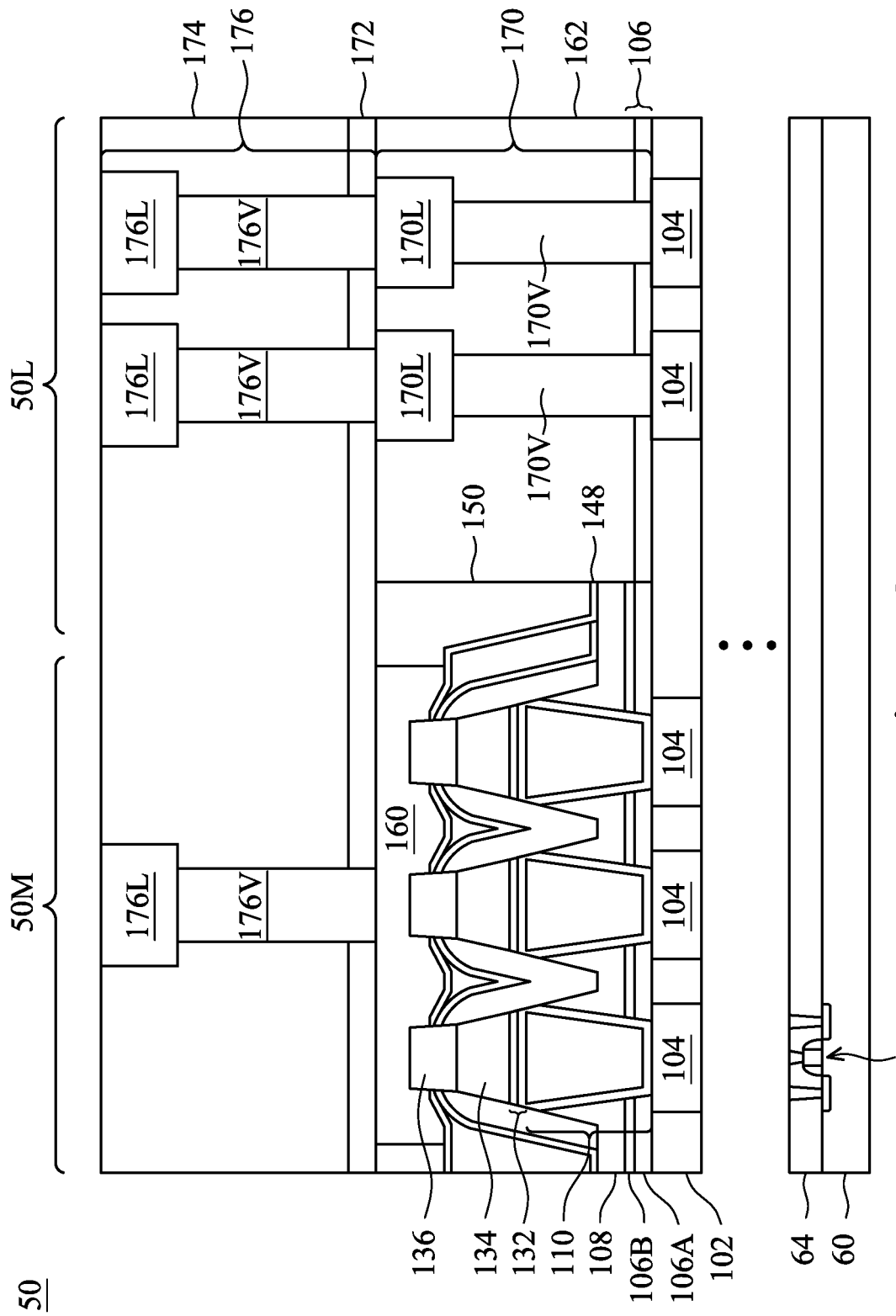

FIGS. 24 and 25 are various views of a MRAM device 50, in accordance with some embodiments. FIG. 24 is shown at a similar stage of manufacturing as FIG. 15, and FIG. 25 is shown at a similar stage of manufacturing as FIG. 22. In this embodiment, the shared electrodes 160 are formed to a greater length $L_1$ than the previous embodiment. For example, in this embodiment, the lengths $L_1$ can be in the range of about 1500 Å to about 50 μm. As a result of their longer lengths $L_1$, the shared electrodes 160 do not partially overlap with the MRAM cells 58 at the end regions of the shared electrodes 160. Rather, in this embodiment, the shared electrodes 160 fully overlap with all of the MRAM cells 58 that the shared electrodes 160 are in contact with. Increasing the contact area may allow the contact resistance to the MRAM cells 58 to be further reduced.

FIGS. 26 through 40 are cross-sectional views of intermediate stages in the manufacturing of an interconnect structure for the MRAM device 50, in accordance with some other embodiments. The interconnect structure also includes a MRAM array of memory cells. As discussed further below, protective structures will be formed around the memory cells of the MRAM array, which helps protect the memory cells during the subsequent formation of overlying metallization layers. Some features shown in FIGS. 26 through 40 are similar to features shown in FIGS. 3 through 23, and their descriptions are not repeated. Such features are shown using similar reference numerals.

Figure 26:
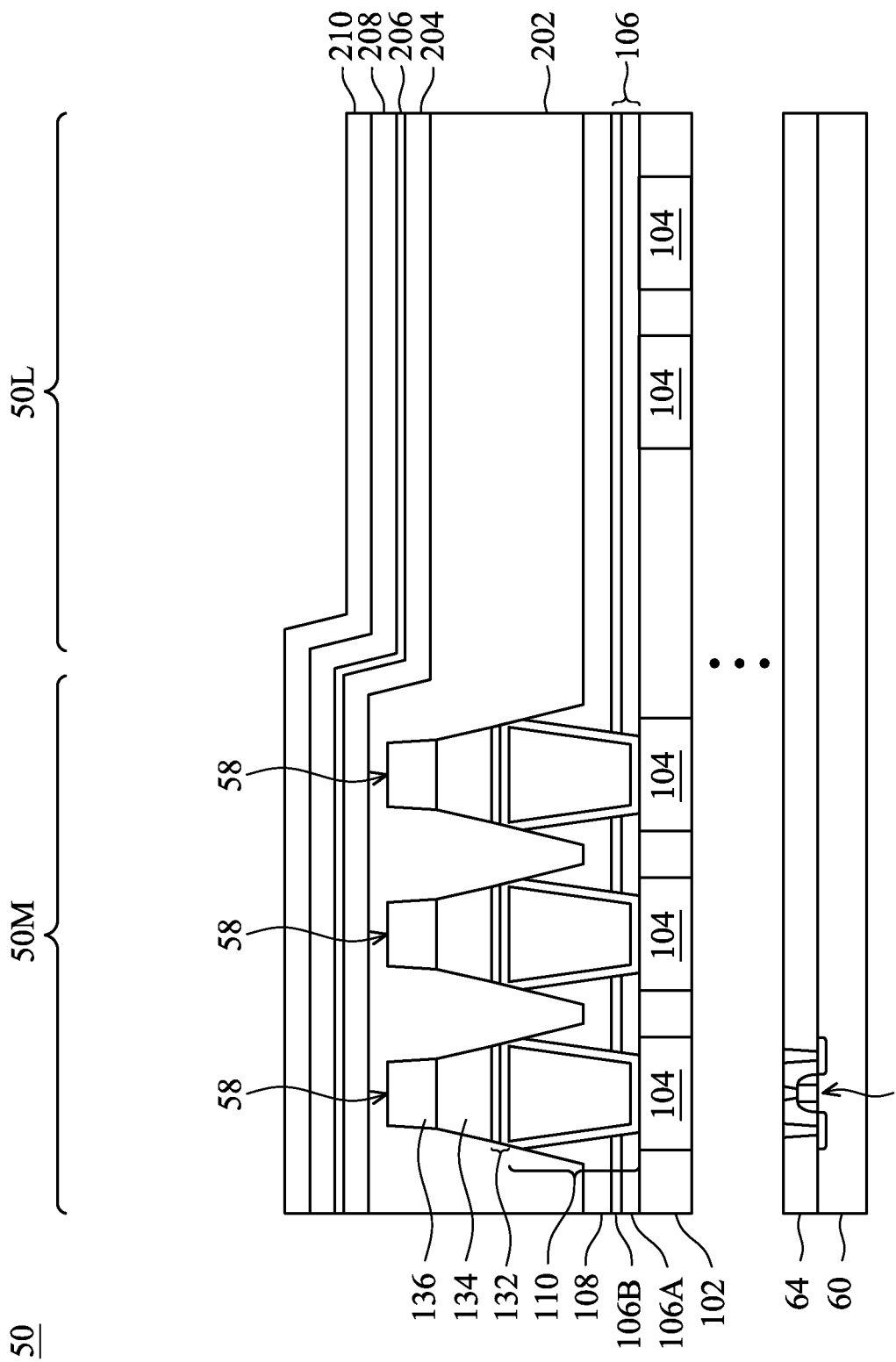
FIGS. 26 through 40 are cross-sectional views of intermediate stages in the manufacturing of an interconnect structure for a MRAM device, in accordance with some other embodiments.

In FIG. 26, an intermediate structure similar to that described with respect to FIG. 6 is obtained. A passivation layer 202 is then blanket formed over the MRAM cells 58 and in the recesses 130 (see FIG. 6). In some embodiments, the passivation layer 202 may comprise silicon oxide, silicon nitride, silicon oxynitride, silicon carbide, silicon carbonitride, a combination thereof, or the like, and may be formed using CVD, plasma-enhanced chemical vapor deposition (PECVD), ALD, plasma-enhanced atomic layer deposition (PEALD), PVD, a combination thereof, or the like. In some embodiments, the passivation layer 202 is a nitride such as silicon nitride. The passivation layer 202 can reduce or prevent moisture (e.g., $H_2O$) diffusion into the MRAM cells 58 during subsequent processing. The passivation layer 202 is formed to a thickness in the range of about 500 Å to about 15000 Å. Specifically, the passivation layer 202 is formed to a sufficient thickness to fill the recesses 130 and bury the MRAM cells 58.

A dielectric layer 204 is then formed over the passivation layer 202. In some embodiments, the dielectric layer 204 is formed using similar materials and methods as the IMD layer 108. For example, the dielectric layer 204 can be formed of an oxide, such as silicon oxide. The dielectric layer 204 can be formed to a thickness in the range of about 100 Å to about 300 Å.

A planarization stop layer 206 is then formed on the dielectric layer 204. The planarization stop layer 206 may be a nitrogen-free layer, and may be formed of a nitrogen-free dielectric material. For example, the planarization stop layer 206 can be formed of a doped or undoped oxide, such as silicon oxycarbide. The planarization stop layer 206 can be formed to a thickness in the range of about 80 Å to about 150 Å. The planarization stop layer 206 will be used to protect the logic region 50L during subsequent processing (discussed further below).

A dielectric layer 208 is then formed over the planarization stop layer 206. In some embodiments, the dielectric layer 208 is formed using similar materials and methods as the IMD layer 108 and dielectric layer 204. For example, the dielectric layer 208 can be formed of silicon oxide. The dielectric layer 208 can be formed to a thickness in the range of about 200 Å to about 400 Å.

A coating layer 210 is then formed over the dielectric layer 208. The coating layer 210 acts as a buffer layer to help reduce topography variations during a subsequent etchback process. The coating layer 210 can be formed using a coating process, such as a spin coating process. The coating layer 210 can be formed of a material that is ashable and fluid, such as a bottom layer of photoresist. After the spin coating process, the material can be cured. Curing the material hardens the coating layer 210. In some embodiments, curing the material comprises exposing the material to an elevated temperature.

Figure 27:
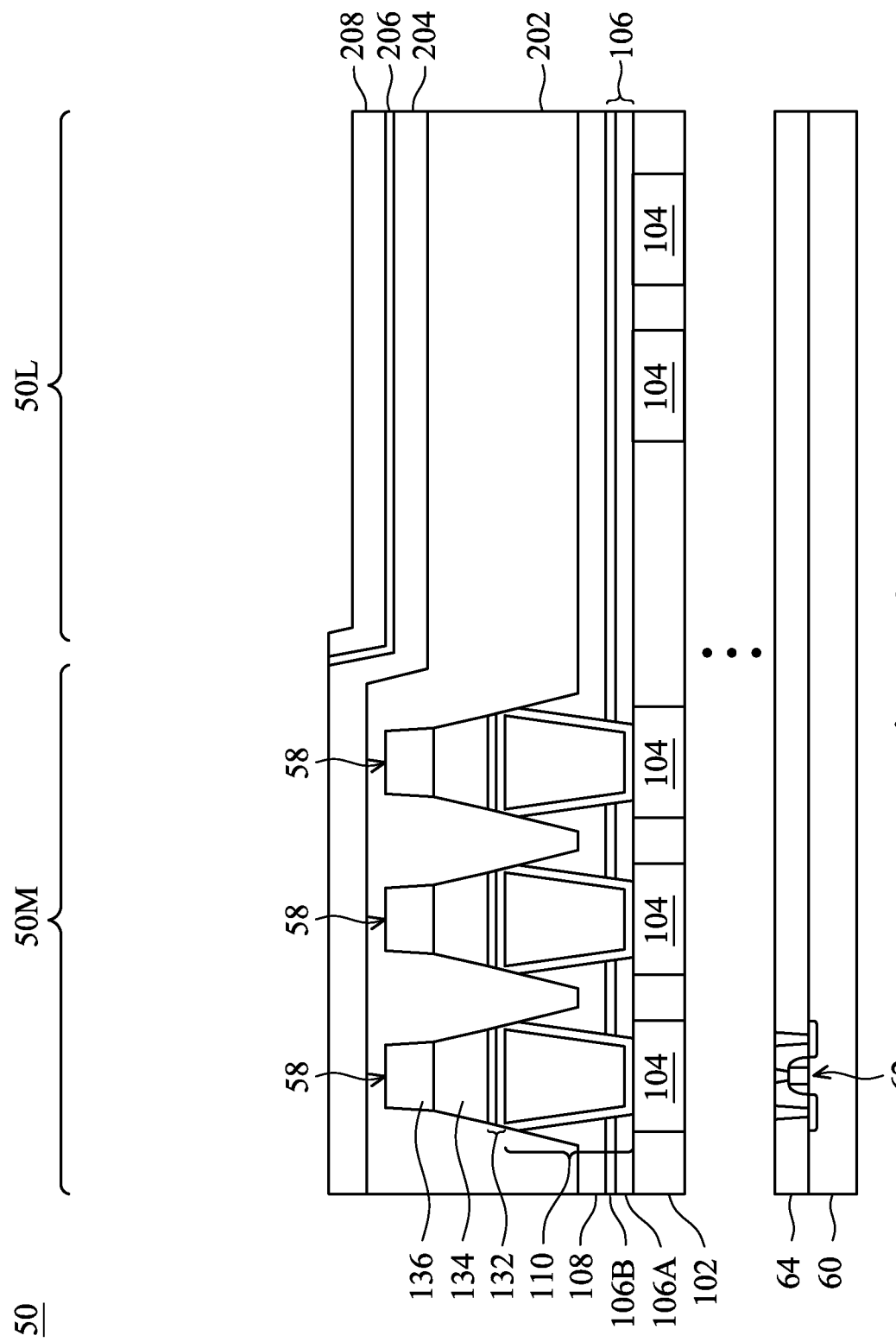

In FIG. 27, an etchback process is performed to remove portions of the coating layer 210, dielectric layer 208, and planarization stop layer 206. Specifically, the etchback process removes portions of the planarization stop layer 206 in the memory region 50M to expose portions of the dielectric layer 204 over the MRAM cells 58. The logic region 50L is covered by remaining portions of the planarization stop layer 206. The etchback process may be a dry etching process, using an etchant such as $CH_xF_y$, $CF_4$, He, $O_2$, $N_2$, Ar, $NF_3$, $SF_6$, combinations thereof, or the like as an etching gas. The coating layer 210 can be consumed by the etchback process, or the coating layer 210 can be removed after the etchback process by, e.g., a suitable ashing or stripping process. In some embodiments, some portions of the coating layer 210 remain in the logic region 50L after the etchback process, and those portions are removed after the etchback process.

Figure 28:
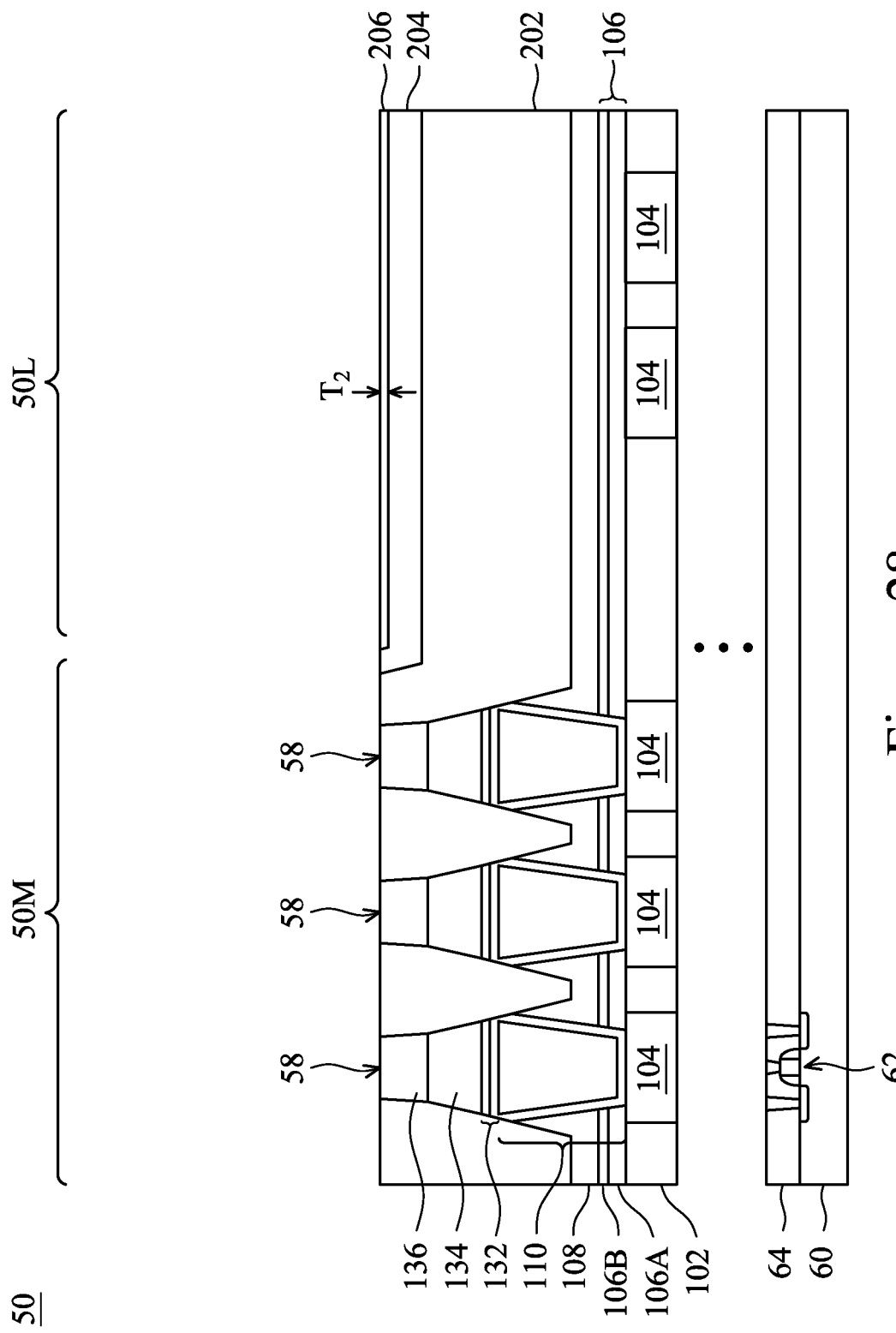

In FIG. 28, a planarization process is performed to expose the top electrodes 136 of the MRAM cells 58. The planarization process can be a CMP process, a mechanical grinding process, or the like. The planarization process removes remaining portions of the dielectric layer 208 and also removes portions of the dielectric layer 204 over the MRAM cells 58. The planarization stop layer 206 has a lower removal rate than the dielectric layers 204 and 208, relative to the planarization process. As such, the planarization process can be performed until the planarization stop layer 206 (and thus the top electrodes 136) is exposed. In some embodiments, the topmost surface of the planarization stop layer 206 is formed to a sufficient thickness such that it extends above the topmost surfaces of the top electrodes 136, and the top electrodes 136 are exposed by, e.g., dishing that can occur during the planarization process. The exposed portions of the planarization stop layer 206 cover the logic region 50L, and can cover a portion of the memory region 50M. Although the planarization process does not remove the planarization stop layer 206, it can reduce the thickness of the planarization stop layer 206. After the planarization process, the planarization stop layer 206 can have a thickness $T_1$ in the range of about 50 Å to about 100 Å.

Figure 29:
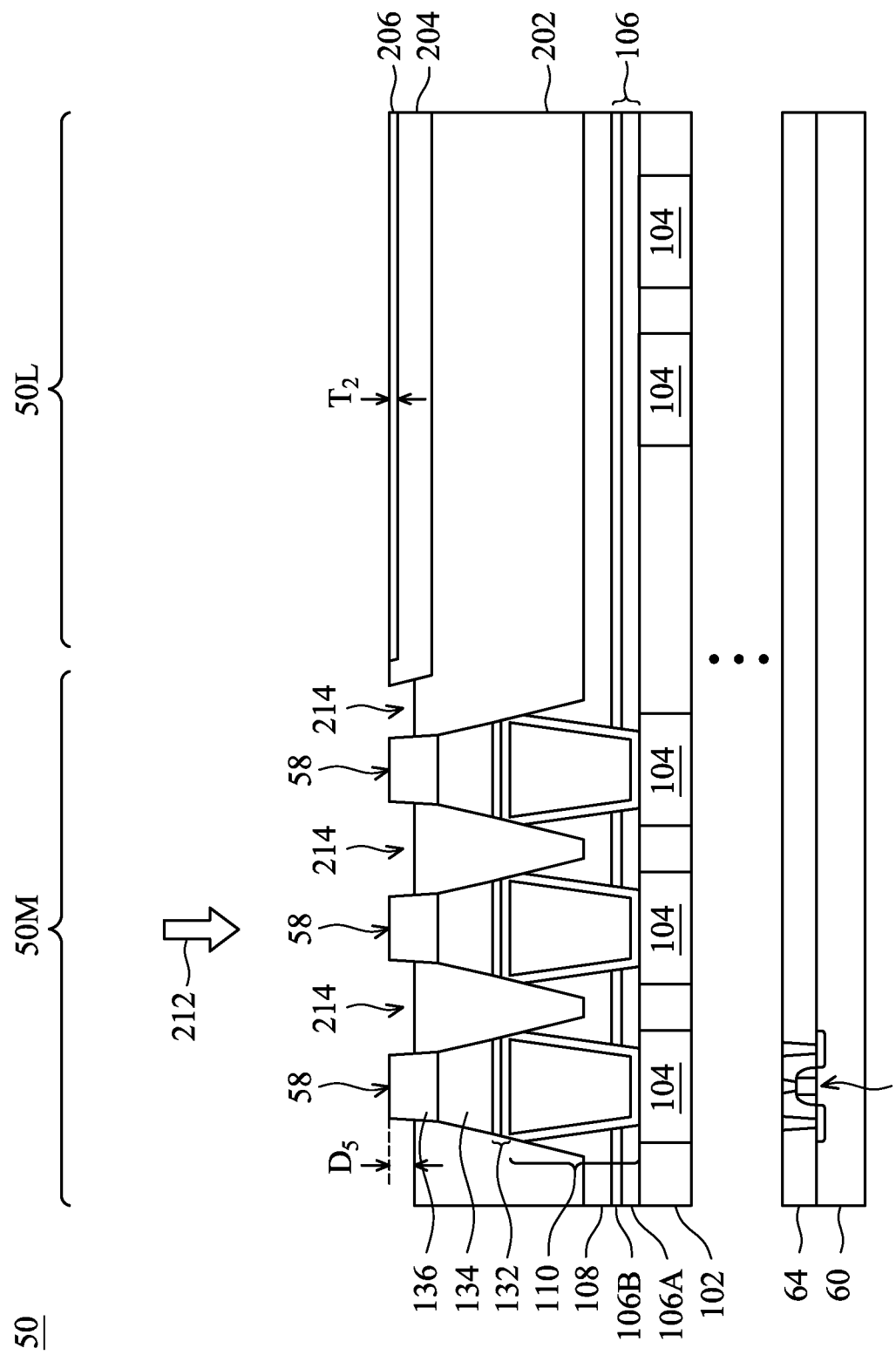

In FIG. 29, an etchback process 212 is performed to recess the passivation layer 202 and form recesses 214 around the top electrodes 136 of the MRAM cells 58. The recesses 214 are formed to a depth $D_5$, which can in the range of about 50 Å to about 200 Å. The recesses 214 expose the sidewalls of the top electrodes 136, but do not expose the sidewalls of the MTJ stacks 134. The sidewalls of the MTJ stacks 134 remain covered and protected by the passivation layer 202 after the etchback process 212.

The etchback process 212 is selective to the material of the passivation layer 202. As noted above, in some embodiments, the passivation layer 202 is a nitride, and the dielectric layer 204 and planarization stop layer 206 are oxides. In such embodiments, the etchback process 212 can etch the material of the passivation layer 202 (e.g., nitrides) at a higher rate than the material(s) of the dielectric layer 204 and planarization stop layer 206 (e.g., oxides). For example, the ratio of the etch rate of the passivation layer 202 to the etch rates of the dielectric layer 204 and planarization stop layer 206, relative to the etchback process 212, can be in the range of about 3:1 to about 10:1. As an example of the etchback process 212, a dry etching process such as IBE, Reactive Ion Etching (RIE), or the like can be performed using an etchant such as HBr, $CF_4$, He, $O_2$, $N_2$, $CH_xF_y$, combinations thereof, or the like as an etching gas. $N_2$, Ar, He, combinations thereof, or the like may be used as carrier gases for the etching gas. The etching may be implemented using glow discharge plasma (GDP), capacitive coupled plasma (CCP), inductively coupled plasma (ICP), or the like. The etching can be performed with a source power in the range of about 100 watts and about 1500 watts, and can be performed with a bias voltage of up to about 1000 volts. The etching can be performed for a duration in the range of about 7 seconds and about 300 seconds. Performing the etchback process 212 with such parameters allows for a high etch selectivity between the material of the passivation layer 202 (e.g., nitrides) and the material(s) of the dielectric layer 204 and planarization stop layer 206 (e.g., oxides).

Although the etchback process 212 is selective to the material of the passivation layer 202, some etching of the planarization stop layer 206 can still occur. For example, the etchback process 212 can reduce the thickness of the planarization stop layer 206 to a thickness $T_2$ in the range of about 10 Å to about 50 Å. The new thickness $T_2$ of the planarization stop layer 206 is smaller than the original thickness $T_1$ of the planarization stop layer 206, but is still of sufficient thickness to withstand subsequent processing. In some embodiments, the new thickness $T_2$ of the planarization stop layer 206 is at least half of the original thickness $T_1$ of the planarization stop layer 206.

Figure 30:
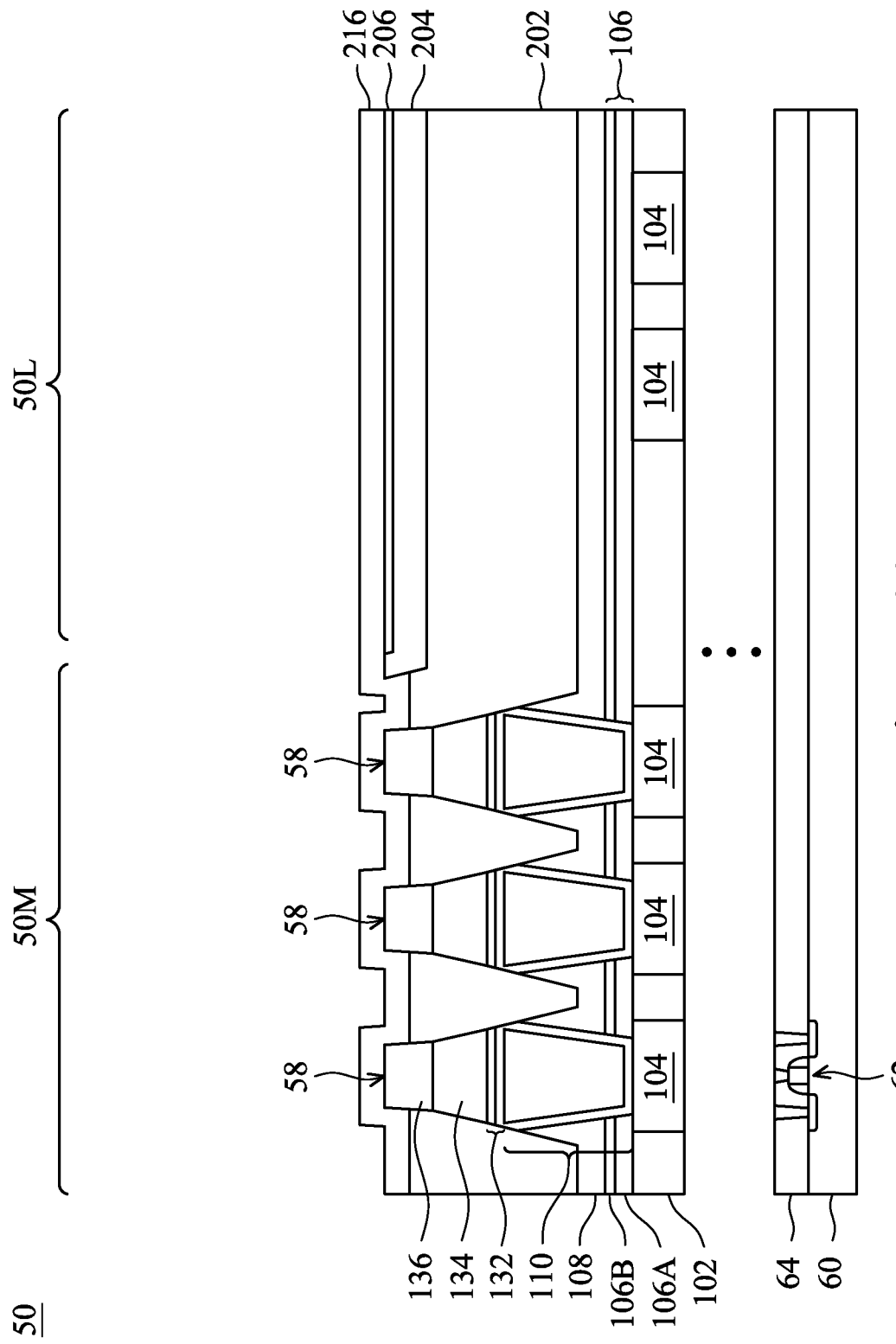

In FIG. 30, a protection layer 216 is formed in the recesses 214, and on exposed surfaces of the MRAM cells 58, dielectric layer 204, and planarization stop layer 206. The protection layer 216 is formed of a dielectric material such as aluminum nitride, aluminum oxide, silicon carbide, silicon carbonitride, a combination thereof, multilayers thereof, or the like, and is formed by a deposition process such as physical vapor deposition (PVD), chemical vapor deposition (CVD), ALD, combinations thereof, or the like. The protection layer 216 is formed of a material that has a high selectivity relative an etching process that will be used to pattern subsequently formed metallization layers of the interconnect structure (discussed further below). For example, the protection layer 216 can be a silicon carbide layer, an aluminum oxide layer, or a multilayer comprising a silicon carbide sub-layer and an aluminum oxide sub-layer on the silicon carbide sub-layer. After formation, the protection layer 216 surrounds the top electrodes 136 of the MRAM cells 58. Advantageously, forming the protection layer 216 in the recesses 214 allows the protection layer 216 to be self-aligned to the top electrodes 136.

Figure 31:
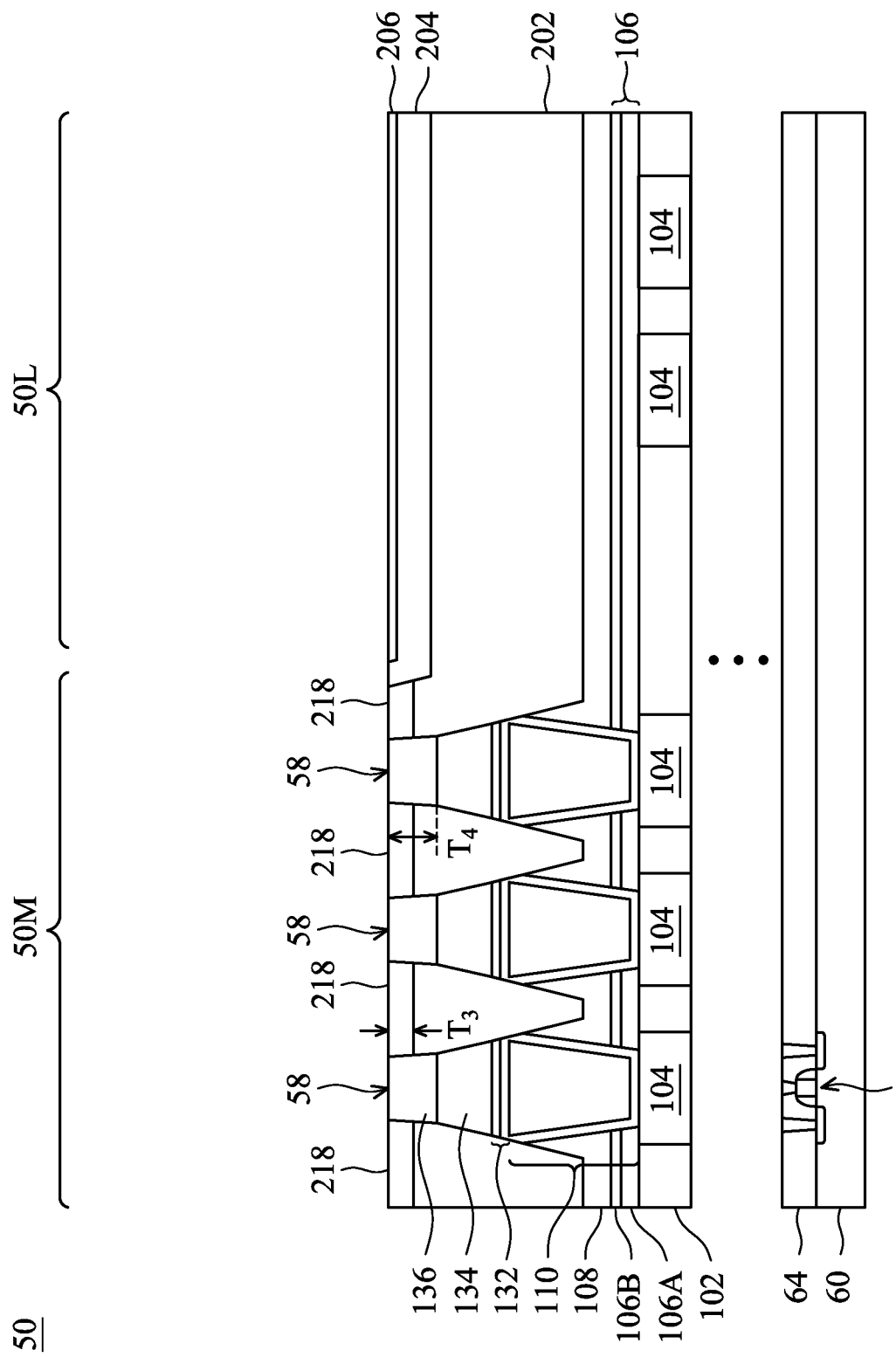

In FIG. 31, a planarization process is performed to expose the top electrodes 136 of the MRAM cells 58. The planarization process removes portions of the protection layer 216 outside of the recesses 214 (see FIG. 29), e.g., portions of the protection layer 216 over the MRAM cells 58, dielectric layer 204, and planarization stop layer 206. The planarization process can be a CMP process, a mechanical grinding process, or the like. The planarization stop layer 206 has a lower removal rate than the protection layer 216, relative to the planarization process. As such, the planarization process can be performed until the planarization stop layer 206 is exposed. The top electrodes 136 are exposed after the planarization process. The planarization process forms protective structures 218, which comprise the portions of the protection layer 216 remaining in the recesses 214 after the planarization process.

Multiple planarization processes are performed using the planarization stop layer 206. Specifically, the planarization process of FIG. 28 and FIG. 31 are both performed, and both are stopped on the planarization stop layer 206. Performing multiple planarization processes helps reduce uneven topography that can be caused by pattern density variations between the logic region 50L and memory region 50M, helping ensure the features in the logic region 50L and the memory region 50M share a planar top surface.

After the planarization process, the protective structures 218 have a thickness $T_3$, which can be in the range of about 80 Å to about 200 Å, and the top electrodes 136 have a thickness $T_4$, which can be in the range of about 150 Å to about 300 Å. The thickness $T_3$ is less than the thickness $T_4$.

Specifically, the thickness $T_3$ of the protective structures 218 is sufficient to ensure the MRAM cells 58 are protected in subsequent processing, but small enough to ensure the sidewalls of the MTJ stacks 134 are free from undesired materials (thus retaining their desired high resistance ($R_{ap}$) and a low resistance ($R_p$) values), such as residue from a subsequent contact etch process (discussed further below).

Figure 32:
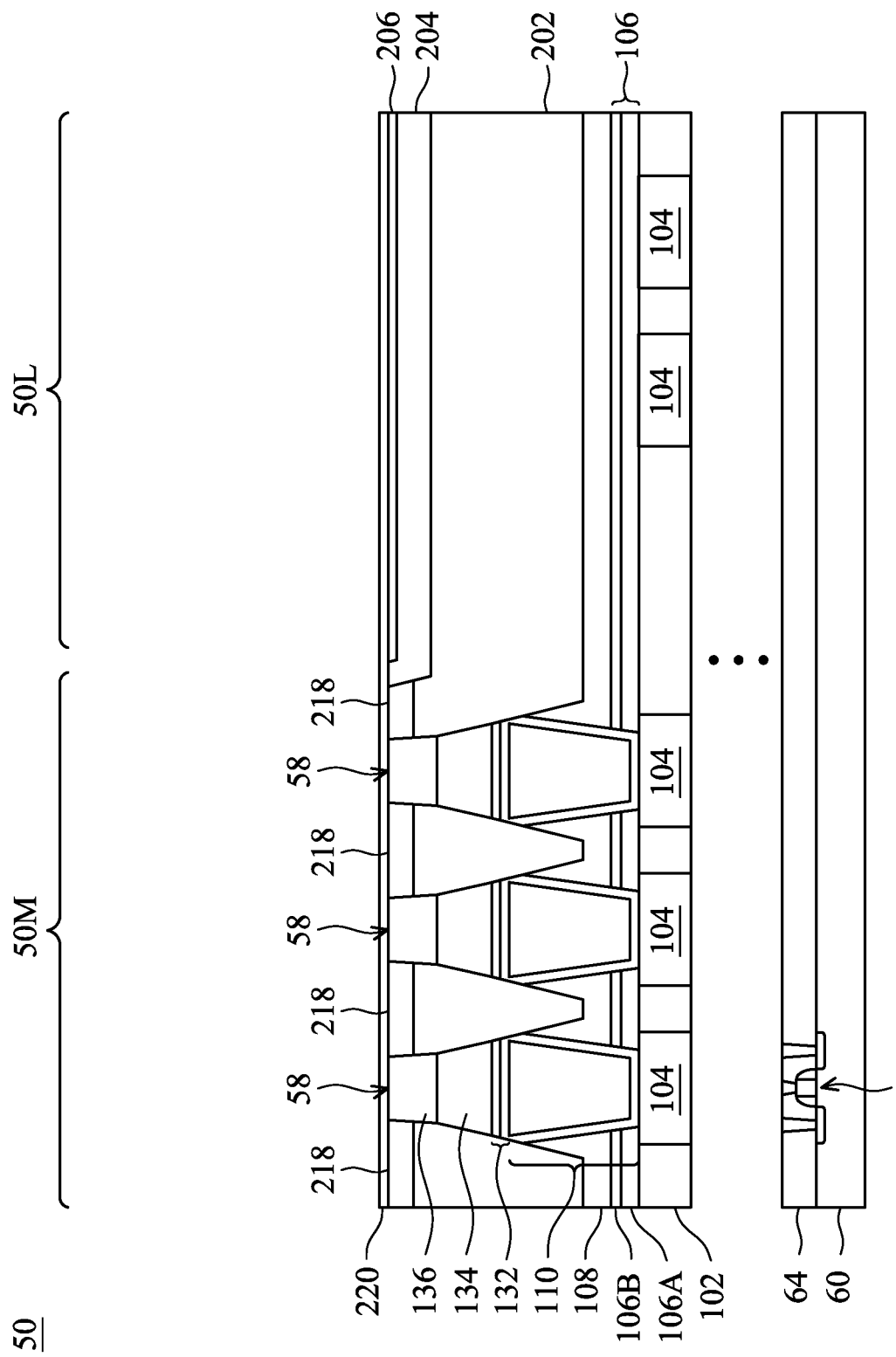

In FIG. 32, an anti-reflective layer 220 is formed on the planarized surface of the intermediate structure. Specifically, the anti-reflective layer 220 is formed on planarized surfaces of the protective structures 218, top electrodes 136, planarization stop layer 206, and dielectric layer 204. The anti-reflective layer 220 may be a nitrogen-free anti-reflective layer (NFARL), and can be formed of a nitrogen-free dielectric material such as silicon oxycarbide. In some embodiments, the anti-reflective layer 220 is formed of a different material than the protective structures 218. The anti-reflective layer 220 can be formed to a thickness in the range of about 100 Å to about 350 Å. The anti-reflective layer 220 will be used to protect the memory region 50M during subsequent processing of the logic region 50L.

Figure 33:
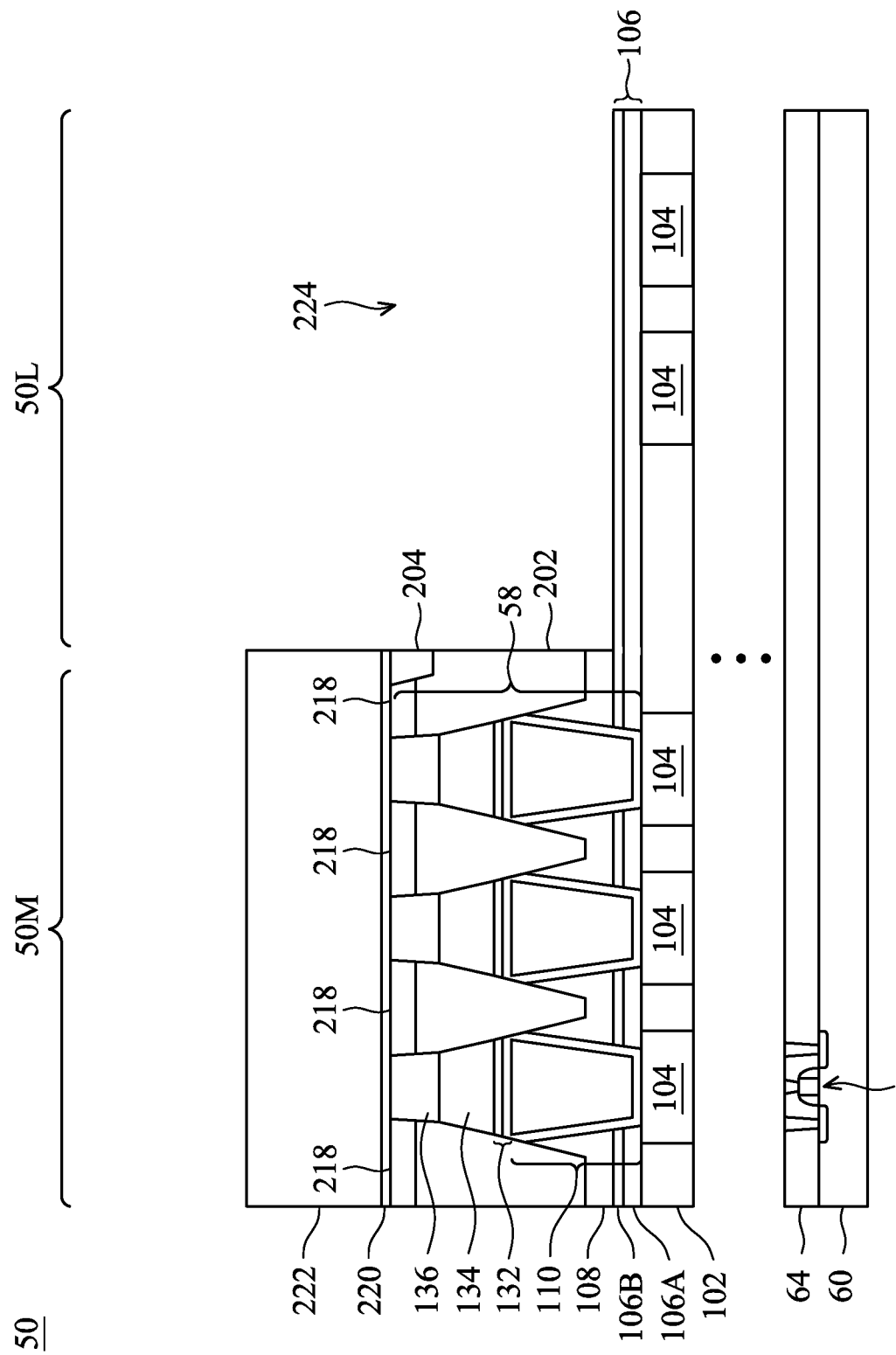

In FIG. 33, the intermediate structure is patterned to expose the etch stop layer(s) 106 in the logic region 50L. The patterning can comprise suitable photolithography and etching processes. For example, one or more dry etching process(es) can be performed using an etching mask 222 to etch the anti-reflective layer 220, planarization stop layer 206, dielectric layer 204, passivation layer 202, and IMD layer 108. The etching mask 222 may be a photoresist, such as a single-layer photoresist, a bi-layer photoresist, a tri-layer photoresist, or the like. In some embodiments, the remaining portions of the planarization stop layer 206 are removed by the etching process(es). In some embodiments (discussed below), portions of the planarization stop layer 206 can remain after the etching process(es). Some portions of the dielectric layer 204 can remain in the memory region 50M after the etching process(es). The etching process(es) forms one or more opening(s) 224 exposing the etch stop layer(s) 106, such as the second etch stop layer 106B in embodiments where the etch stop layer(s) 106 comprise a multilayer. The etching mask 222 can be consumed by the etching process(es), or the etching mask 222 can be removed after the etching process(es) by, e.g., a suitable ashing or stripping process.

Figure 34:
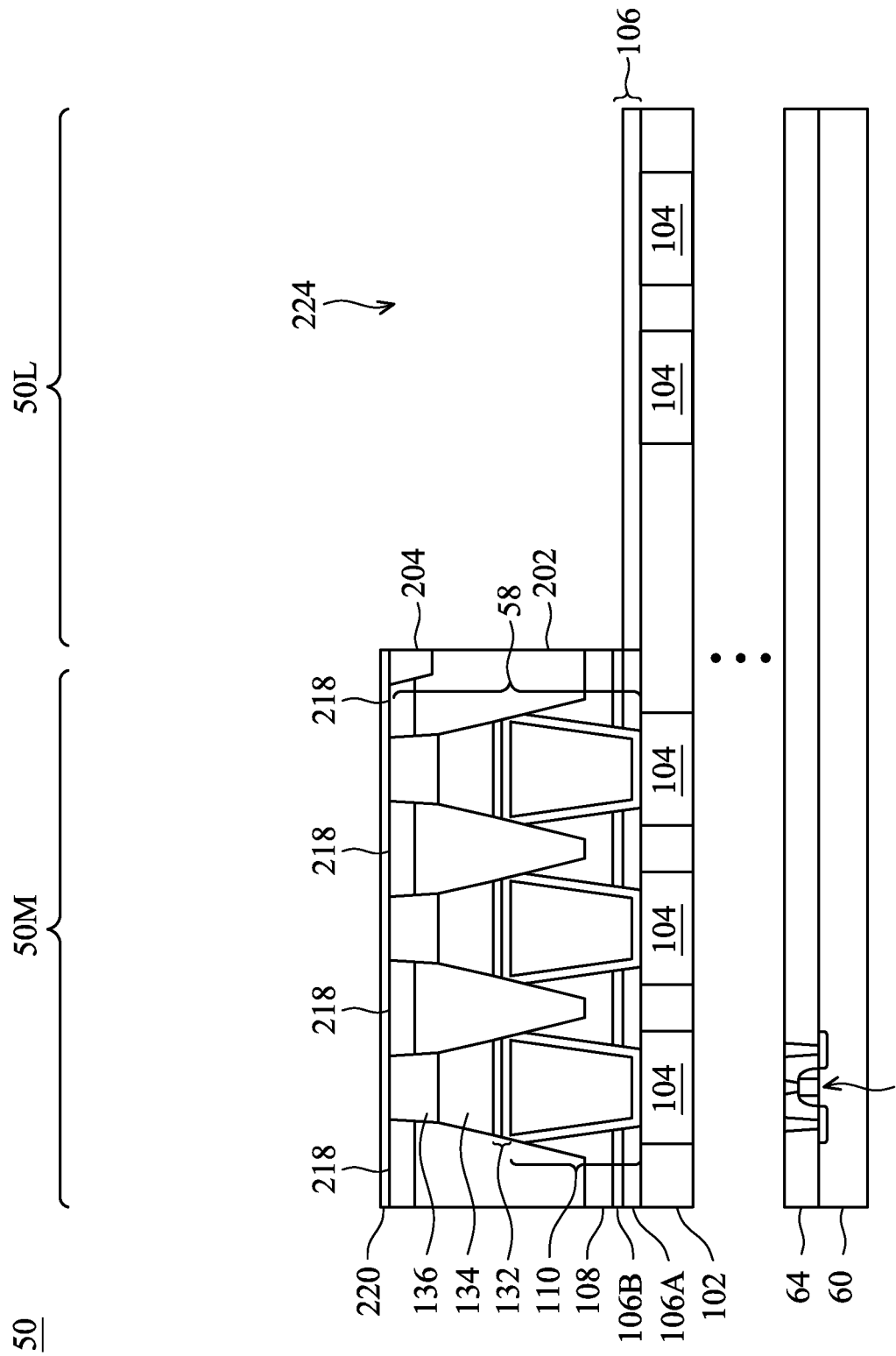

In FIG. 34, some of the etch stop layer(s) 106 may optionally be removed, such as in embodiments where the etch stop layer(s) 106 comprise a multilayer. For example, when the etch stop layer(s) 106 comprise a first etch stop layer 106A and a second etch stop layer 106B, portions of the second etch stop layer 106B in the opening(s) 224 can be removed to expose the underlying first etch stop layer 106A. The second etch stop layer 106B may be removed using an isotropic wet clean process that is selective to the material of the second etch stop layer 106B. The etching process used to remove the second etch stop layer 106B may be different from the etching process(es) used to initially form the opening(s) 224 (e.g., different etchants and/or other etching process parameters may be used). Using multilayered etch stop layer(s) 106 may be advantageous in some embodiments. For example, the second etch stop layer 106B can be etched slower than the first etch stop layer 106A by the etching process(es) used to etch the anti-reflective layer 220, planarization stop layer 206, dielectric layer 204, passivation layer 202, and IMD layer 108 (see FIG. 32). Likewise, the first etch stop layer 106A can be etched slower than the second etch stop layer 106B by one or more etching process(es) that will be subsequently used to pattern openings for conductive features in the logic region 50L (see FIG. 39).

Figure 35:
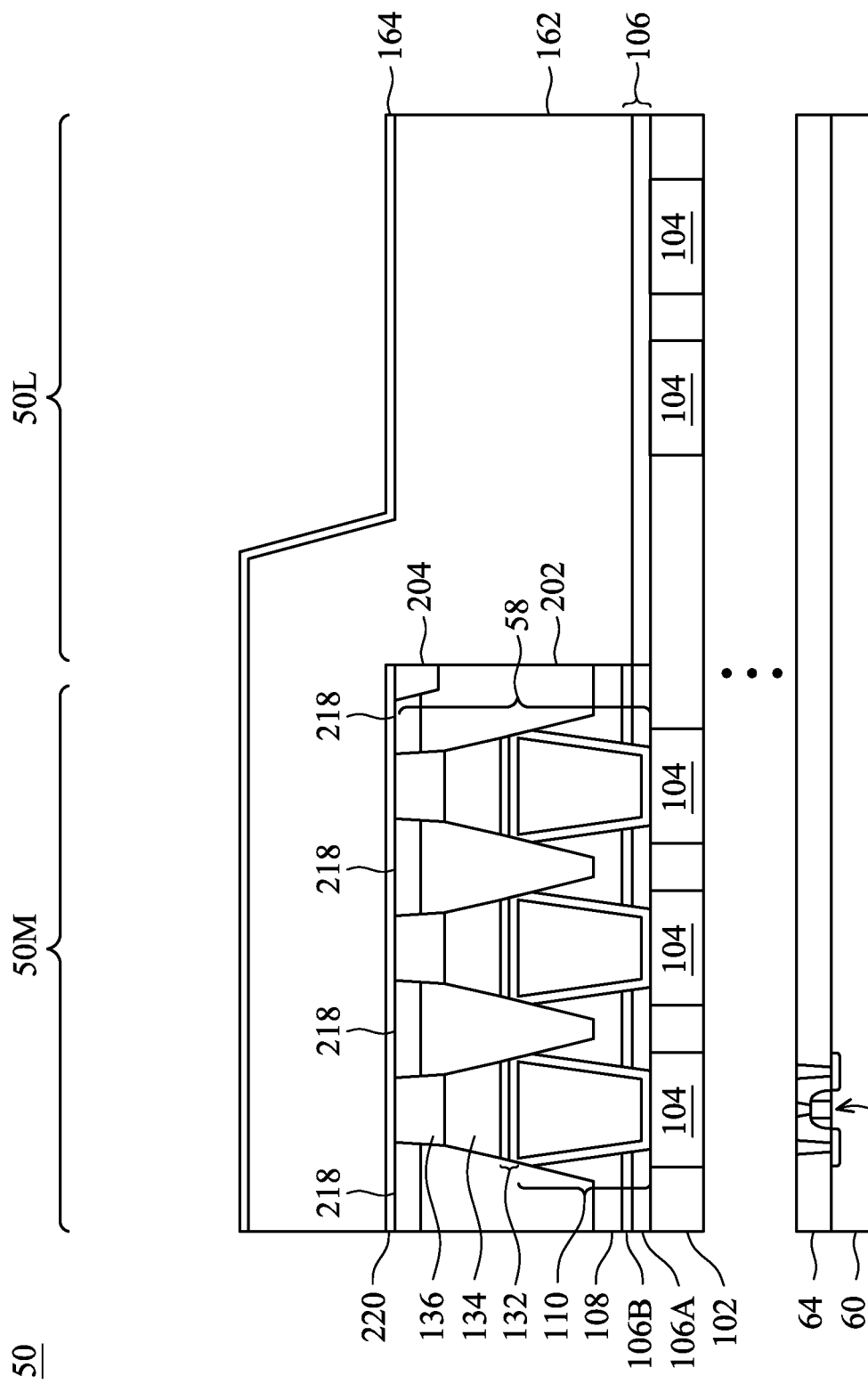

In FIG. 35, the IMD layer 162 is formed in the opening(s) 224 and over the MRAM cells 58 and protective structures 218, such as on the anti-reflective layer 220. The anti-reflective layer 164 is then formed on the IMD layer 162. The anti-reflective layer 164 will be used to protect the memory region 50M during subsequent processing of the logic region 50L.

Figure 36:
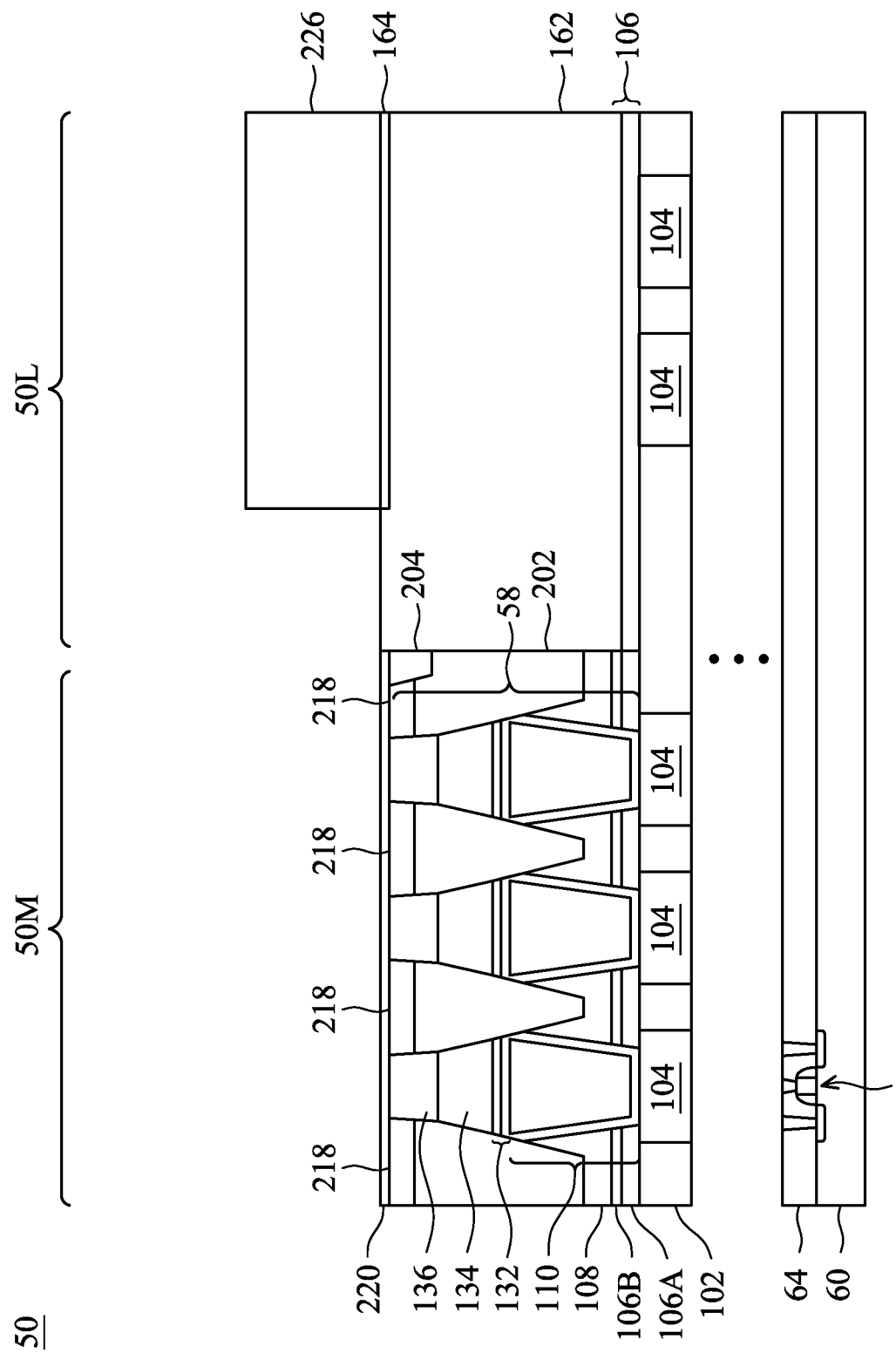

In FIG. 36, an etchback process can optionally be performed to remove portions of the IMD layer 162 and anti-reflective layer 164 over the MRAM cells 58, thus exposing the anti-reflective layer 220. Portions of the logic region 50L, such as portions over the conductive features 104, can be covered by an etching mask 226 during the etchback process. The etchback process may be a dry etching process, using an etchant such as $CH_xF_y$, $CF_4$, He, $O_2$, $N_2$, Ar, $NF_3$, $SF_6$, combinations thereof, or the like as an etching gas. The etching mask 226 can be consumed by the etchback process, or the etching mask 226 can be removed after the etchback process by, e.g., a suitable ashing or stripping process. After the etchback process, the remaining portions of the anti-reflective layer 164 are disposed in the logic region 50L, and do not extend into the memory region 50M. In some embodiments, the etchback process is omitted, and the portions of the IMD layer 162 and anti-reflective layer 164 over the MRAM cells 58 can be removed during a subsequent planarization process (discussed further below).

Figure 37:
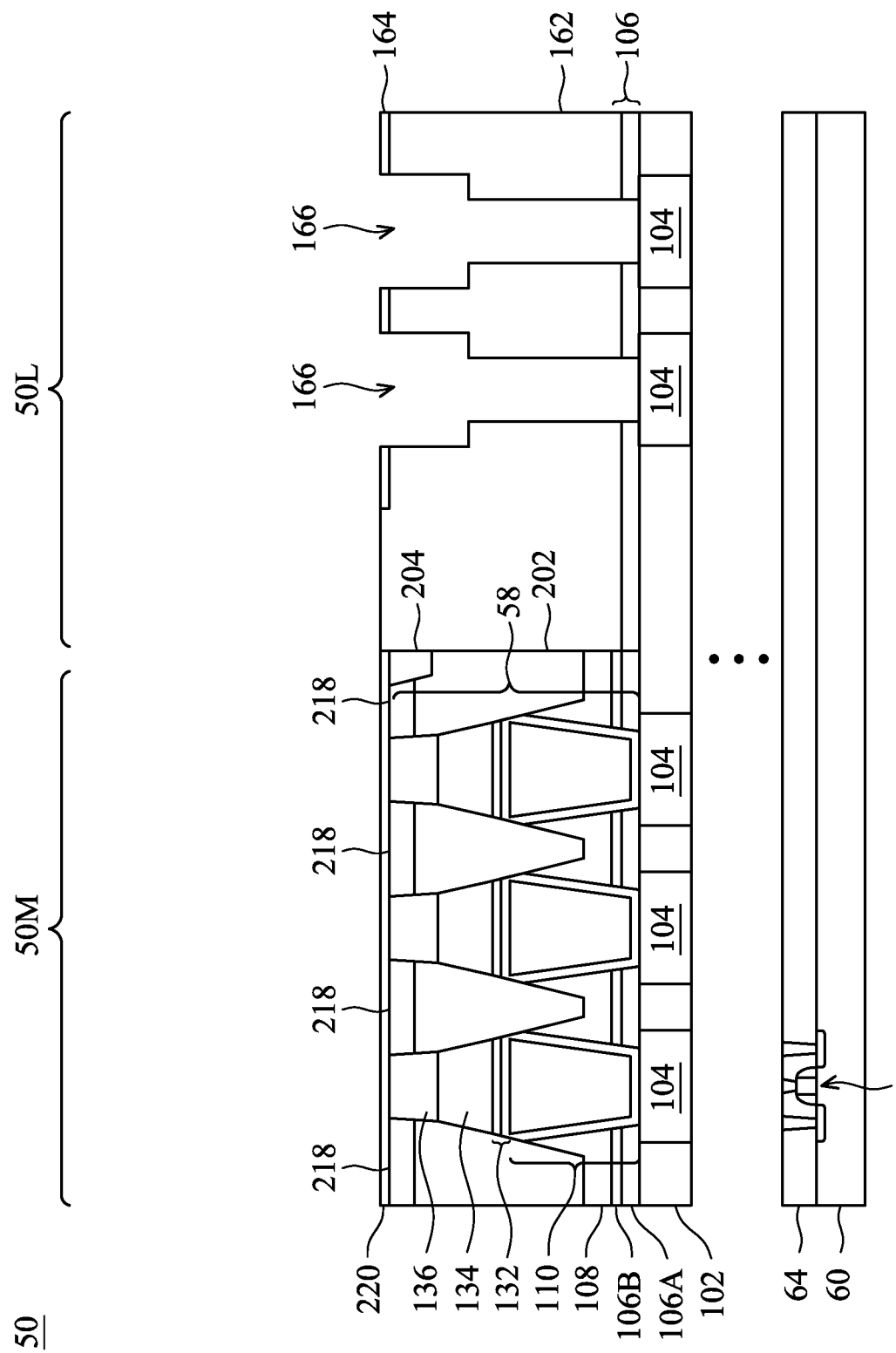

In FIG. 37, the openings 166 are formed in the logic region 50L, exposing the conductive features 104 in the logic region 50L. Specifically, the openings 166 are formed through the anti-reflective layer 164, IMD layer 162, and any of the etch stop layer(s) 106 (e.g., the first etch stop layer 106A) remaining in the logic region 50L. The openings 166 can be formed using similar processes and materials as those discussed above with respect to FIG. 19.

Figure 38:
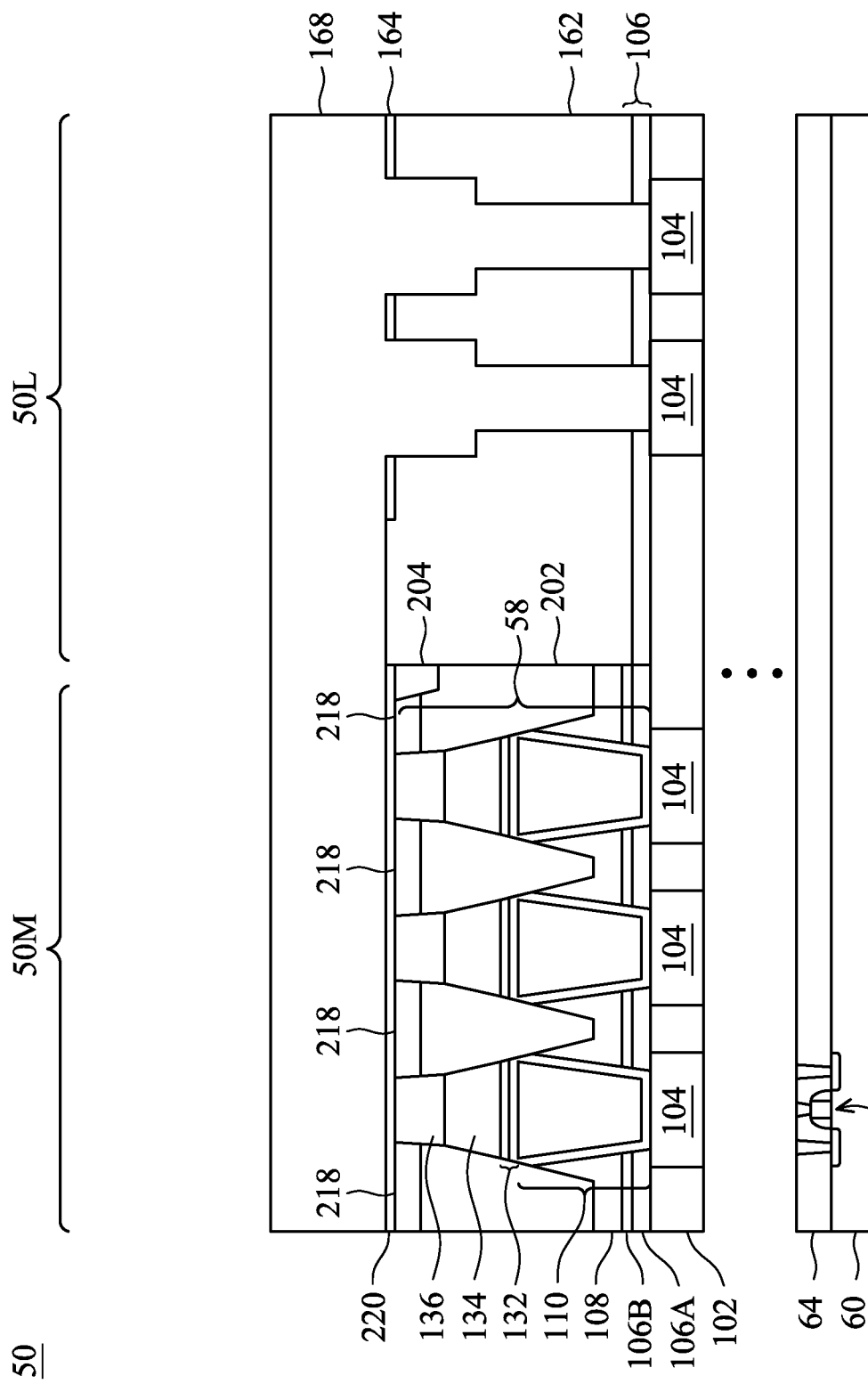

In FIG. 38, the conductive material 168 is formed in the openings 166. The conductive material 168 may overfill the openings 166 and may also be formed over the IMD layer 162 and anti-reflective layers 164 and 220. The conductive material 168 can be formed using similar processes and materials as those discussed above with respect to FIG. 20.

Figure 39:
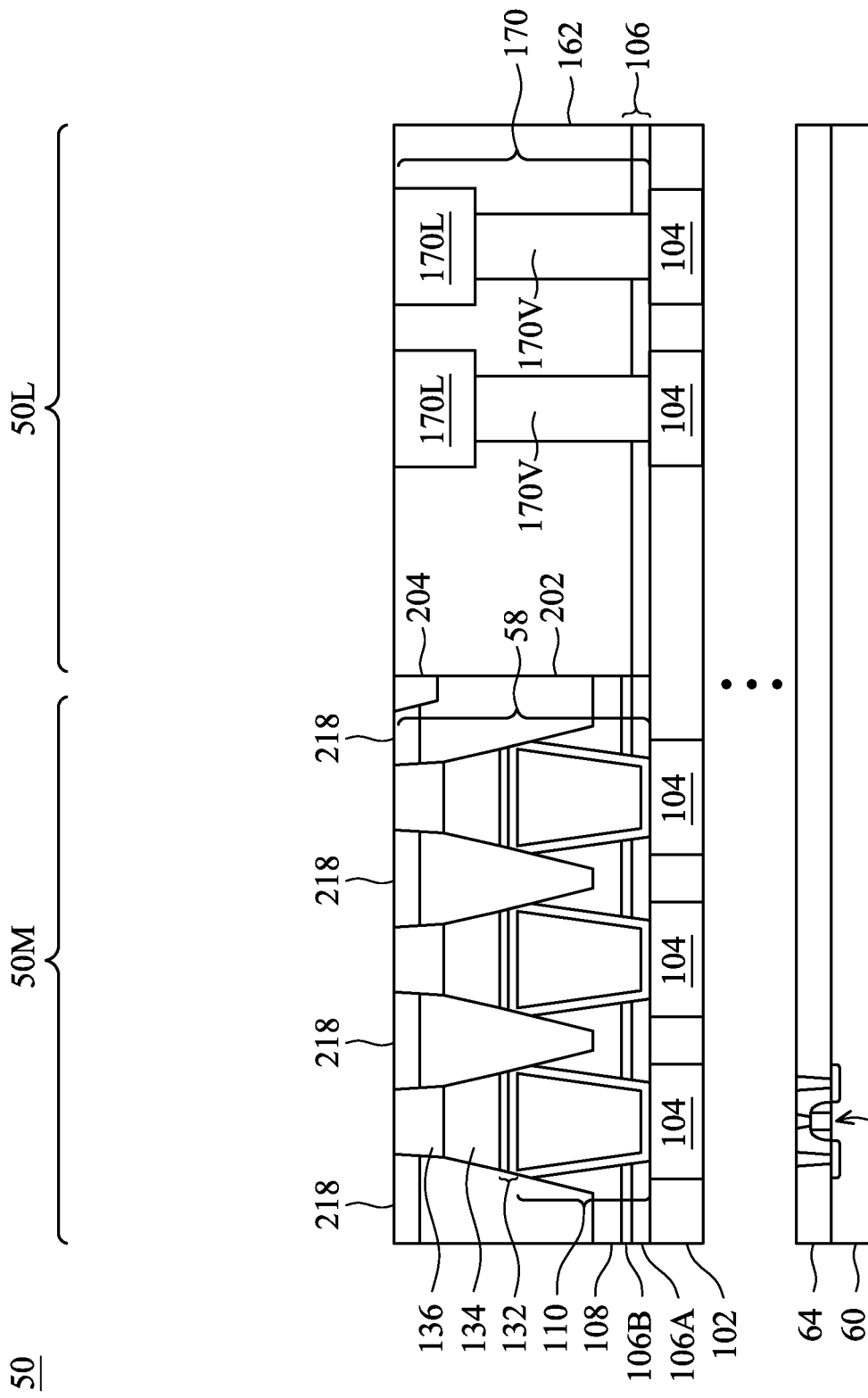

In FIG. 39, a planarization process is performed to remove excess of the conductive material 168 outside of the openings 166. The planarization process can be a CMP process, a mechanical grinding process, or the like. The planarization process can remove the anti-reflective layers 164 and 220, and expose the top electrodes 136 and protective structures 218. The planarization process forms the conductive features 170. After the planarization process, top surfaces of the conductive features 170, IMD layer 162, protective structures 218, dielectric layer 204, and top electrodes 136 are planar.

As noted above, the etchback process shown in FIG. 36 is optional. The etchback process can help reduce uneven topography that can be caused by pattern density variations between the logic region 50L and memory region 50M. In some embodiments, the etchback process shown in FIG. 36 is omitted, and the portions of the IMD layer 162 and anti-reflective layer 164 over the MRAM cells 58 can instead be removed during the planarization process shown in FIG. 39.

Figure 40:
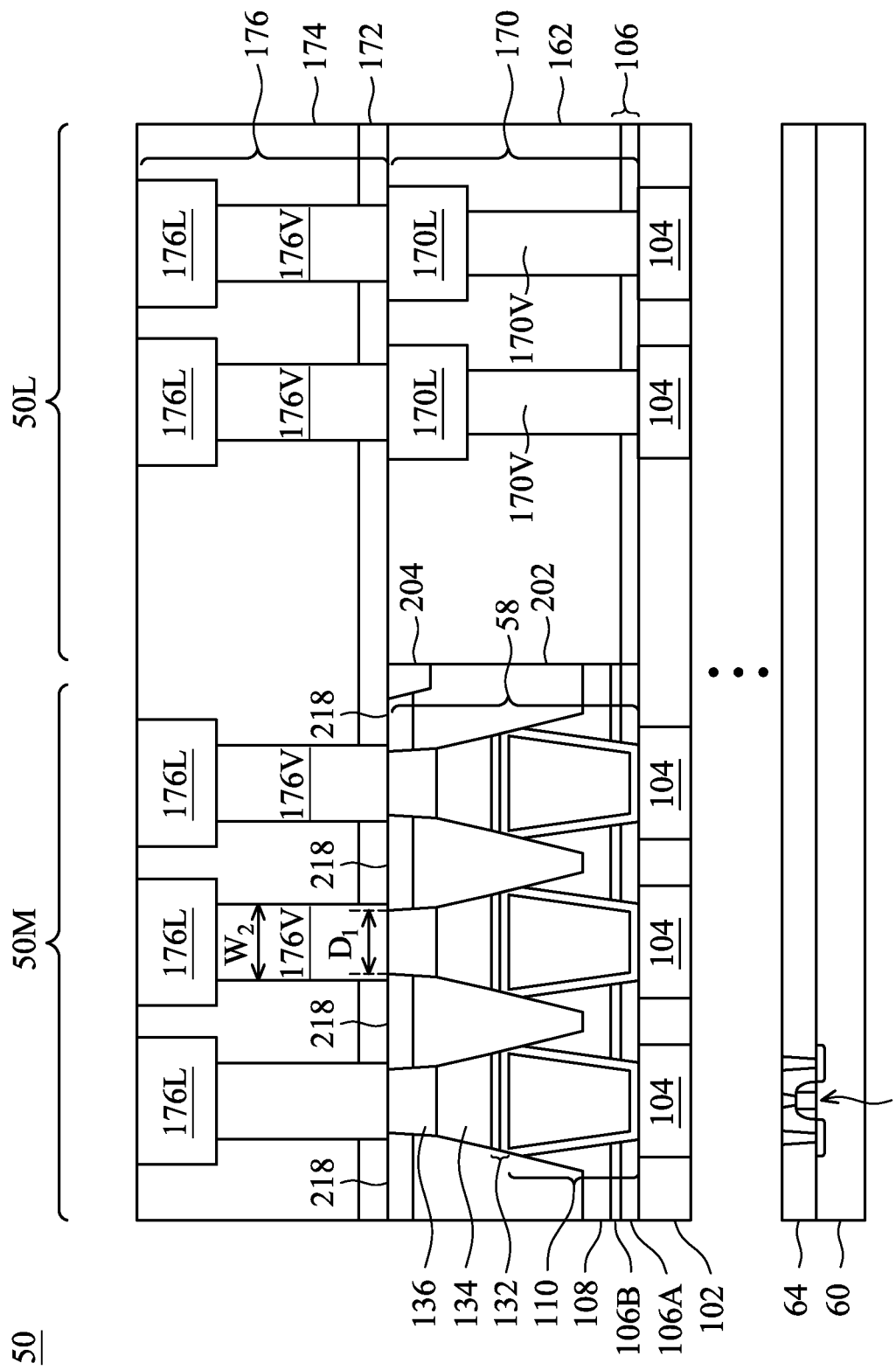

In FIG. 40, the etch stop layer(s) 172, IMD layer 174, and conductive features 176 are formed. In the illustrated embodiment, the etch stop layer(s) 172 comprise a single etch stop layer 172, such as a layer of silicon nitride. The conductive vias 176V in the memory region 50M are physically and electrically connected to the top electrodes 136. The MRAM cells 58 can be small, particularly when high-density memories are desired. For example, the diameters $D_1$ of the top electrodes 136 can be smaller than the width $W_2$ of the overlying conductive vias 176V, particularly when the MRAM cells 58 are formed in a higher level (e.g., M5 in FIG. 2) of an interconnect structure. As such, the conductive vias 176V can contact the top electrodes 136 and portions of the protective structures 218.

In some embodiments, the conductive features 176 are formed using similar materials and methods as the conductive features 170. For example, openings are formed exposing the conductive features 170 and top electrodes 136. The openings are filled with a conductive material, and a planarization process is then performed to form the conductive features 176, which comprise remaining portions of the conductive material in the openings. When forming the openings for the conductive features 176, the IMD layer 174 is patterned with a first etching process, and the etch stop layer 172 is used to stop the first etching process. The first etching process can comprise suitable photolithography and etching steps. The etch stop layer 172 is then opened with a second etching process to expose the conductive features 170 and top electrodes 136. The second etching process can comprise suitable photolithography and etching steps. The protective structures 218 surround and protect the MRAM cells 58 during the second etching process. Protection may be accomplished in several manners. The protective structures 218 prevent the second etching process from etching the MTJ stacks 134 of the MRAM cells 58. Damage to the MRAM cells 58 may thus be avoided.

In some embodiments, the protective structures 218 are formed of a similar etch stop material as the etch stop layer 172. The amount of etch stop material protecting the MRAM cells 58 is thus increased, enlarging the processing window for the second etching process. The likelihood of etching the MTJ stacks 134 is thus decreased.

In some embodiments, the protective structures 218 are formed of a different etch stop material than the etch stop layer 172. Specifically, the second etching process can be selective to the material of the etch stop layer 172. For example, in some embodiments, the protective structures 218 are silicon carbide and/or aluminum oxide, and the etch stop layer 172 is silicon nitride. In such embodiments, the second etching process can etch the material of the etch stop layer 172 (e.g., silicon nitride) at a higher rate than the material of the protective structures 218 (e.g., silicon carbide and/or aluminum oxide). For example, the ratio of the etch rate of the etch stop layer 172 to the etch rate of the protective structures 218, relative to the second etching process, can be in the range of about 1 to about 5. As an example of the second etching process, an isotropic wet clean process that is selective to the material of the etch stop layer 172 can be performed. The etching can be performed with a solution that includes water, such as deionized water, carbonated deionized water, or the like. The etching can be performed for a duration in the range of about 5 seconds and about 600 seconds. Performing the second etching process with such parameters allows for a high etch selectivity between the material of the etch stop layer 172 (e.g., silicon nitride) and the material of the protective structures 218 (e.g., silicon carbide and/or aluminum oxide). The likelihood of etching the MTJ stacks 134 is thus further decreased.

Figure 41:
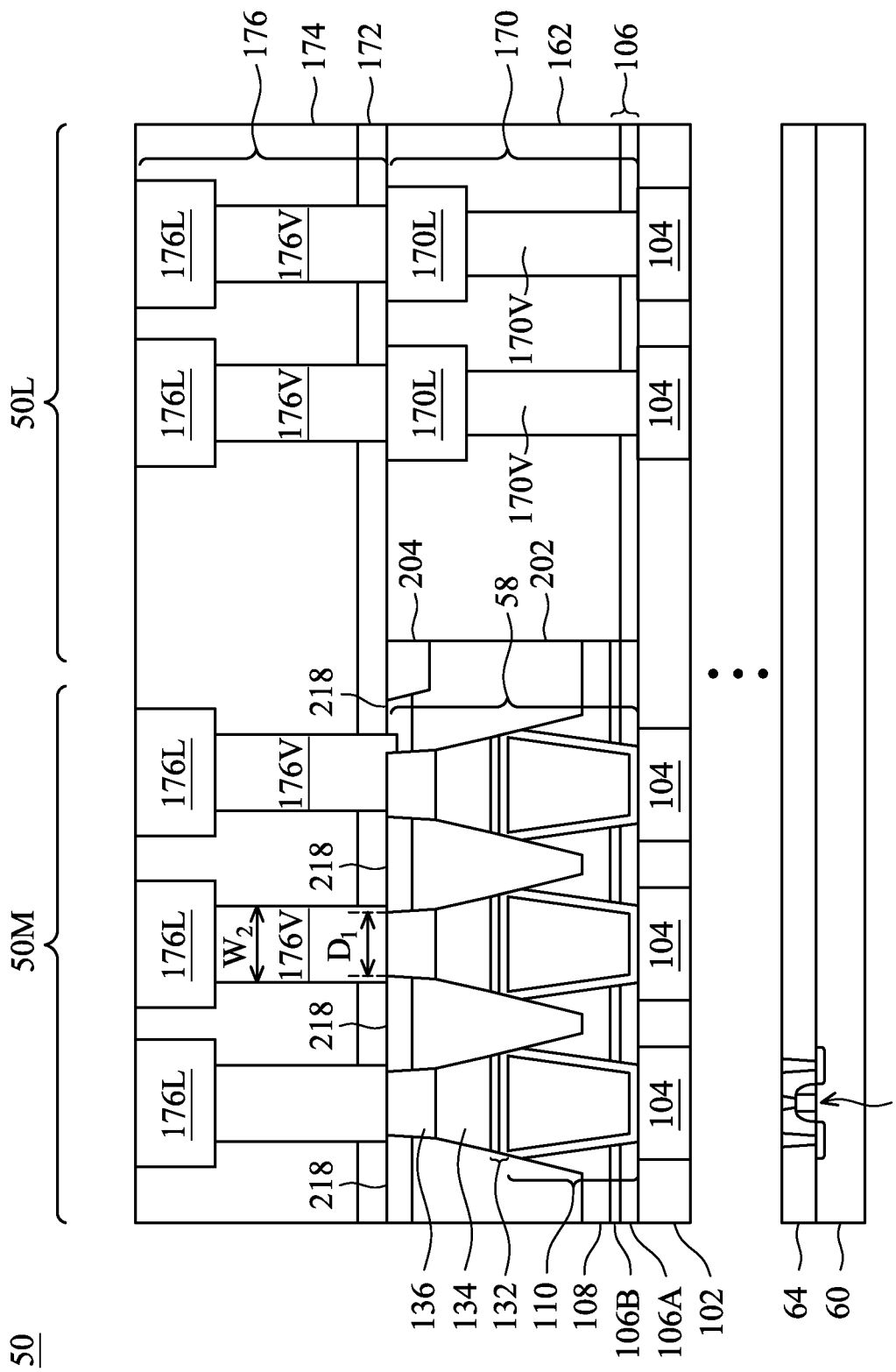
FIG. 41 is a cross-sectional view of a MRAM device, in accordance with some other embodiments.

FIG. 41 is a cross-sectional view of the MRAM device 50, in accordance with some other embodiments. FIG. 41 shows an embodiment where some etching of the protective structures 218 occurs during formation of a conductive feature 176. As shown, the protective structures 218 help protect the MTJ stacks 134 even when partial punch-through of the protective structures 218 occurs.

Figure 42:
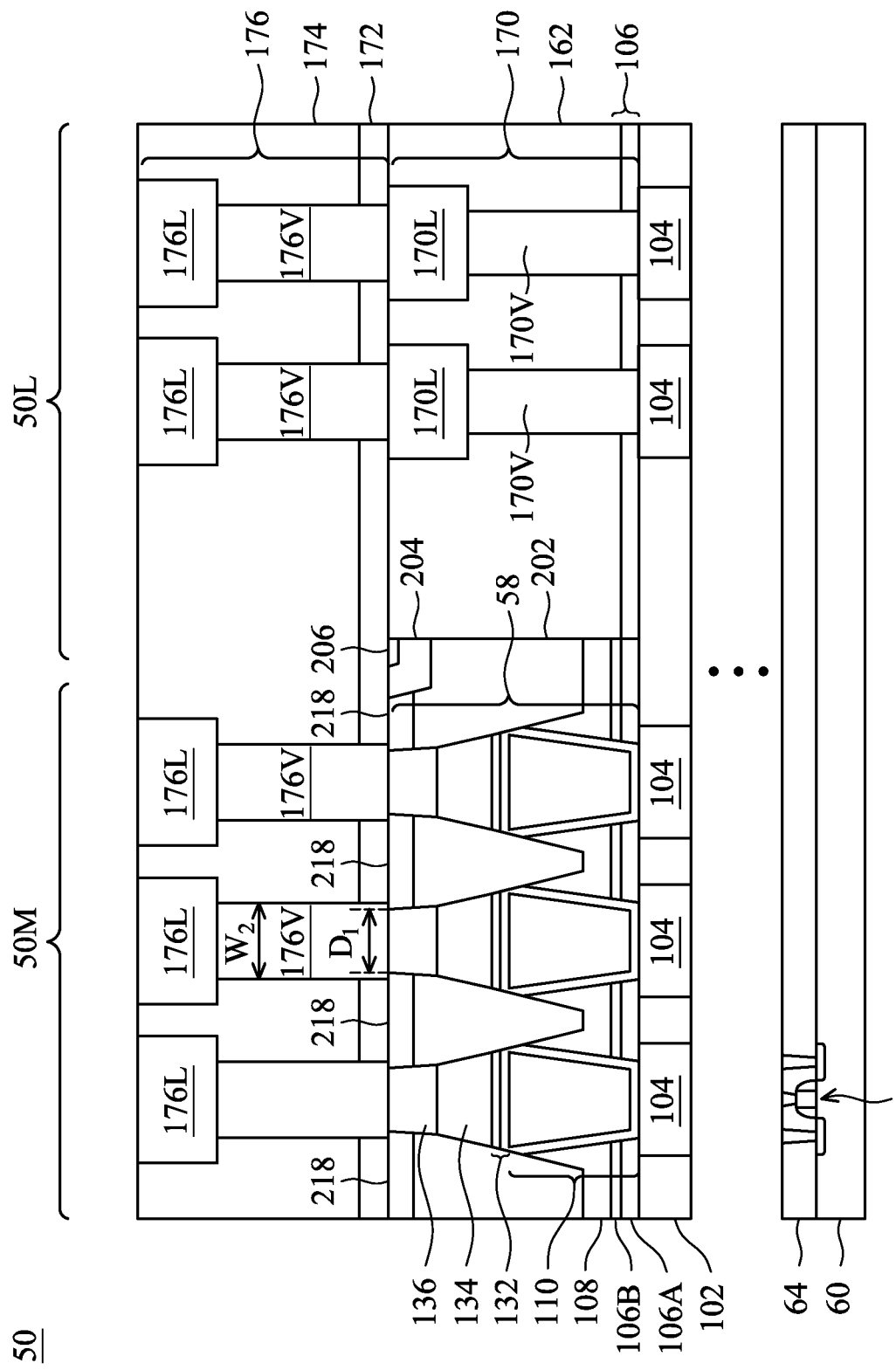
FIG. 42 is a cross-sectional view of a MRAM device, in accordance with some other embodiments.

FIG. 42 is a cross-sectional view of the MRAM device 50, in accordance with some other embodiments. In this embodiment, portions of the planarization stop layer 206 remain after the etching process(es) of FIG. 33. Such remaining portions of the planarization stop layer 206 are disposed between the etch stop layer 172 and the remaining portions of the dielectric layer 204.

Embodiments may achieve advantages. Forming the protective structures 218 around the top electrodes 136 helps protect the MRAM cells 58 when forming the overlying metallization layer. Specifically, etching of the MTJ stacks 134 can be avoided during formation of the conductive features 176. The protective structures 218 can protect the top electrodes 136 by either enlarging the processing window for forming the conductive features 176, or acting as an etch stop layer to prevent etching of the MTJ stacks 134. Damage to the MRAM cells 58 may thus be avoided, increasing manufacturing yield of the resulting devices.

Although embodiments have been described in the context of MRAM cells, it should be appreciated that similar techniques may be used in forming other types of memory cells with programmable resistance elements. For example, similar techniques may be used in forming phase-change memory (PCRAM) cells, resistive random-access memory (RRAM) cells, and the like.

In an embodiment, a device includes: a magnetoresistive random access memory (MRAM) array including MRAM cells arranged in rows and columns, where a first column of the columns includes: first bottom electrodes arranged along the first column; first magnetic tunnel junction (MTJ) stacks over the first bottom electrodes; a first shared electrode over each of the first MTJ stacks; second bottom electrodes arranged along the first column; second MTJ stacks over the second bottom electrodes; a second shared electrode over each of the second MTJ stacks; and a bit line electrically connected to the first shared electrode and the second shared electrode. In some embodiments of the device, the first bottom electrodes, the second bottom electrodes, the first shared electrode, and the second shared electrode each include titanium nitride, and the bit line includes copper. In some embodiments of the device, the first column further includes: first top electrodes disposed between the first MTJ stacks and the first shared electrode; second top electrodes disposed between the second MTJ stacks and the second shared electrode; a first conductive via physically and electrically connecting the bit line to the first shared electrode; and a second conductive via physically and electrically connecting the bit line to the second shared electrode, widths of the first conductive via and the second conductive via being greater than widths of each of the first top electrodes and each of the second top electrodes. In some embodiments of the device, widths of the first shared electrode and the second shared electrode are greater than the widths of the first top electrodes, the second top electrodes, the first conductive via, and the second conductive via. In some embodiments of the device, the first shared electrode fully overlaps with each of the first top electrodes. In some embodiments of the device, the first shared electrode fully overlaps with a first subset of the first top electrodes, and partially overlaps with a second subset of the first top electrodes. In some embodiments of the device, the first shared electrode and the second shared electrode have the same length along the first column. In some embodiments of the device, each row of the rows includes a word line electrically connected to one of the first bottom electrodes or the second bottom electrodes, and further including: a row decoder electrically connected to the word line of each of the rows; and a column decoder electrically connected to the bit line. In some embodiments of the device, the first column further includes: a first spacer laterally surrounding the first bottom electrodes and the first MTJ stacks; an etch stop layer extending along top surfaces and sidewalls of the first spacer; and a first inter-metal dielectric (IMD) layer on the etch stop layer, where the first shared electrode extends through the first IMD layer and the etch stop layer. In some embodiments of the device, the etch stop layer includes aluminum nitride.

In an embodiment, a method includes: forming a first inter-metal dielectric (IMD) layer over a substrate; forming a bottom electrode layer over the first IMD layer; forming a magnetic tunnel junction (MTJ) film stack over the bottom electrode layer; forming a top electrode layer over the MTJ film stack; patterning the top electrode layer, the MTJ film stack, and the bottom electrode layer to form a first magnetoresistive random access memory (MRAM) cell and a second MRAM cell; forming a spacer around sidewalls of the first MRAM cell and the second MRAM cell; depositing an etch stop layer over the spacer and exposed portions of the first IMD layer; depositing a second IMD layer over the etch stop layer; exposing portions of the first MRAM cell and the second MRAM cell; and forming a shared electrode on the exposed portions of the first MRAM cell and the second MRAM cell.

In some embodiments of the method, exposing the portions of the first MRAM cell and the second MRAM cell includes etching an opening in the second IMD layer, and forming the shared electrode includes: depositing a conductive material in the opening; and planarizing the conductive material to remove portions of the conductive material outside of the opening, the shared electrode including remaining portions of the conductive material after the planarizing. In some embodiments, the method further includes: depositing a third IMD layer over the shared electrode and the second IMD layer; planarizing the third IMD layer such that surfaces of the third IMD layer, the second IMD layer, and the shared electrode are planar; and forming conductive features in the third IMD layer. In some embodiments, the method further includes: depositing a fourth IMD layer over the third IMD layer, the second IMD layer, and the shared electrode; forming a conductive via in the fourth IMD layer; and forming a bit line in the fourth IMD layer, the conductive via electrically and physically connecting the bit line to the shared electrode. In some embodiments of the method, exposing the portions of the first MRAM cell and the second MRAM cell includes etching an opening in the second IMD layer and the etch stop layer, the opening fully exposing a first top surface of the first MRAM cell and partially exposing a second top surface of the second MRAM cell. In some embodiments of the method, exposing the portions of the first MRAM cell and the second MRAM cell includes etching an opening in the second IMD layer and the etch stop layer, the opening fully exposing a first top surface of the first MRAM cell and a second top surface of the second MRAM cell.

In an embodiment, a method includes: forming a magnetoresistive random access memory (MRAM) cell over a substrate, the MRAM cell including: a first bottom electrode over the substrate; a first magnetic tunnel junction (MTJ) stack over the first bottom electrode; a first top electrode over the first MTJ stack; forming a first dielectric layer laterally surrounding the first bottom electrode, the first MTJ stack, and the first top electrode; recessing the first dielectric layer to expose portions of sidewalls of the first top electrode; forming a protective structure contacting the exposed portions of the sidewalls of the first top electrode; depositing a first inter-metal dielectric (IMD) layer over the MRAM cell; and forming a conductive feature extending through the first IMD layer, the conductive feature contacting the first top electrode and the protective structure.

In some embodiments of the method, recessing the first dielectric layer forms a recess, and forming the protective structure includes: depositing a second dielectric layer in the recess; and planarizing the second dielectric layer to form the protective structure, surfaces of the protective structure and the first top electrode being planar. In some embodiments, the method further includes: forming an etch stop layer over the protective structure, the first IMD layer being deposited over the etch stop layer, the etch stop layer and the protective structure including different dielectric materials. In some embodiments, the method further includes: forming an etch stop layer over the protective structure, the first IMD layer being deposited over the etch stop layer, the etch stop layer and the protective structure including the same dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first inter-metal dielectric (IMD) layer over a substrate;
   forming a bottom electrode layer over the first IMD layer;
   forming a magnetic tunnel junction (MTJ) film stack over the bottom electrode layer;
   forming a top electrode layer over the MTJ film stack;
   patterning the top electrode layer, the MTJ film stack, and the bottom electrode layer to form a first magnetoresistive random access memory (MRAM) cell and a second MRAM cell;
   forming a spacer around sidewalls of the first MRAM cell and the second MRAM cell;
   depositing an etch stop layer over the spacer and exposed portions of the first IMD layer;
   depositing a second IMD layer over the etch stop layer;
   exposing portions of the first MRAM cell and the second MRAM cell;
   forming a shared electrode on the exposed portions of the first MRAM cell and the second MRAM cell; and
   depositing a third IMD layer over the shared electrode and the second IMD layer, wherein the shared electrode is connected to the first MRAM cell and the second MRAM cell after depositing the third IMD layer.

2. The method of claim 1, wherein exposing the portions of the first MRAM cell and the second MRAM cell comprises etching an opening in the second IMD layer, and wherein forming the shared electrode comprises:
depositing a conductive material in the opening; and
planarizing the conductive material to remove portions of the conductive material outside of the opening, the shared electrode comprising remaining portions of the conductive material after the planarizing.

3. The method of claim 2, wherein the opening exposes the sidewalls of the first MRAM cell and the second MRAM cell.

4. The method of claim 1, further comprising, before depositing the third IMD layer:
depositing a fourth IMD layer over the shared electrode and the second IMD layer;
planarizing the fourth IMD layer such that surfaces of the fourth IMD layer, the second IMD layer, and the shared electrode are planar; and
forming conductive features in the fourth IMD layer, wherein the third IMD layer is deposited over the fourth IMD layer.

5. The method of claim 1, further comprising:
forming a conductive via in the third IMD layer; and
forming a bit line in the third IMD layer, the conductive via electrically and physically connecting the bit line to the shared electrode.

6. The method of claim 1, wherein exposing the portions of the first MRAM cell and the second MRAM cell comprises etching an opening in the second IMD layer and the etch stop layer, the opening fully exposing a first top surface of the first MRAM cell and partially exposing a second top surface of the second MRAM cell.

7. The method of claim 1, wherein exposing the portions of the first MRAM cell and the second MRAM cell comprises etching an opening in the second IMD layer and the etch stop layer, the opening fully exposing a first top surface of the first MRAM cell and a second top surface of the second MRAM cell.

8. A method, comprising:
forming a first top electrode and a second top electrode on, respectively, a first magnetic tunnel junction stack and a second magnetic tunnel junction stack;
depositing a first dielectric layer on the first top electrode and the second top electrode;
forming a shared electrode in the first dielectric layer, the shared electrode connected to the first top electrode and the second top electrode, the shared electrode contacting sidewalls of the first top electrode and the second top electrode;
depositing a second dielectric layer on the shared electrode; and
forming a bit line interconnect in the second dielectric layer, the bit line interconnect connected to the shared electrode.

9. The method of claim 8, wherein forming the shared electrode comprises:
patterning an electrode opening in the first dielectric layer, the electrode opening exposing the first top electrode and the second top electrode;
forming a conductive material in the electrode opening; and
removing an excess portion of the conductive material outside of the electrode opening, the shared electrode comprising a remaining portion of the conductive material in the electrode opening.

10. The method of claim 9, wherein the conductive material is titanium nitride.

11. The method of claim 9, wherein the electrode opening fully exposes the first top electrode and partially exposes the second top electrode.

12. The method of claim 9, wherein the electrode opening fully exposes the first top electrode and fully exposes the second top electrode.

13. The method of claim 9, further comprising:
forming a spacer on sidewalls of the first magnetic tunnel junction stack and the second magnetic tunnel junction stack, the electrode opening having a first depth above the first top electrode and the second top electrode, the electrode opening having a second depth above the spacer, the second depth greater than the first depth.

14. The method of claim 8, wherein forming the bit line interconnect comprises:
patterning an interconnect opening in the second dielectric layer, the interconnect opening exposing the shared electrode;
forming a conductive material in the interconnect opening; and
removing an excess portion of the conductive material outside of the interconnect opening, the bit line interconnect comprising a remaining portion of the conductive material in the interconnect opening.

15. The method of claim 14, wherein the conductive material is copper.

16. The method of claim 8, wherein the bit line interconnect comprises a different conductive material than each of the first top electrode, the second top electrode, and the shared electrode.

17. A method, comprising:
depositing a first dielectric layer on top electrodes of magnetoresistive random access memory cells;
forming a first shared electrode and a second shared electrode in the first dielectric layer, the first shared electrode connected to a first subset of the top electrodes, the second shared electrode connected to a second subset of the top electrodes, the first subset of the top electrodes and the second subset of the top electrodes arranged along the same column of the magnetoresistive random access memory cells;
depositing a second dielectric layer on the first shared electrode and the second shared electrode; and
forming a bit line interconnect in the second dielectric layer, the bit line interconnect connected to the first shared electrode and the second shared electrode.

18. The method of claim 17, wherein the top electrodes, the first shared electrode, and the second shared electrode each comprise titanium nitride, and the bit line interconnect comprises copper.

19. The method of claim 17, wherein forming the first shared electrode and the second shared electrode comprises:
patterning a first electrode opening and a second electrode opening in the first dielectric layer, the first electrode opening exposing the first subset of the top electrodes, the second electrode opening exposing the second subset of the top electrodes, the first electrode opening and the second electrode opening have the same length; and
forming a conductive material for the first shared electrode and the second shared electrode in the first electrode opening and in the second electrode opening.

20. The method of claim 19, wherein widths of the first electrode opening and the second electrode opening are greater than widths of the top electrodes.

* * * * *